(12) United States Patent
Ishii et al.

(10) Patent No.: US 9,413,373 B1
(45) Date of Patent: Aug. 9, 2016

(54) AMPLIFIER CIRCUIT AND PIPELINE TYPE ANALOG-DIGITAL CONVERTER

(71) Applicant: Kabushiki Kaisha Toshiba, Minato-ku, Tokyo (JP)

(72) Inventors: Hirotomo Ishii, Kamakura Kanagawa (JP); Daisuke Kurose, Yokohama Kanagawa (JP); Tomohiko Sugimoto, Yokohama Kanagawa (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/969,410

(22) Filed: Dec. 15, 2015

(30) Foreign Application Priority Data

Mar. 16, 2015 (JP) ................. 2015-051632

(51) Int. Cl.
  *H03M 1/34* (2006.01)
  *H03M 1/06* (2006.01)
  *H03M 1/14* (2006.01)
  *H03F 3/04* (2006.01)
  *H03F 1/32* (2006.01)

(52) U.S. Cl.
  CPC .............. *H03M 1/0604* (2013.01); *H03F 1/32* (2013.01); *H03F 3/04* (2013.01); *H03M 1/144* (2013.01); *H03F 2200/129* (2013.01); *H03F 2201/3215* (2013.01)

(58) Field of Classification Search
  CPC ....... H03M 1/0604; H03M 1/144; H03F 3/04; H03F 1/32; H03F 2201/3215; H03F 2200/129

USPC ................................................. 341/161–163
See application file for complete search history.

(56) References Cited

U.S. PATENT DOCUMENTS

| 7,522,085 | B1 * | 4/2009 | Srinvasa | H03M 1/0624 341/161 |
| 8,531,323 | B2 * | 9/2013 | Li | H03M 1/0695 341/118 |
| 2002/0163458 | A1 | 11/2002 | Jin | |
| 2009/0027121 | A1 | 1/2009 | Kawai et al. | |
| 2009/0066377 | A1 | 3/2009 | Nakanishi et al. | |
| 2013/0201047 | A1 | 8/2013 | Tsai et al. | |

FOREIGN PATENT DOCUMENTS

| JP | 2003-017953 A | 1/2003 |
| JP | 2009-021903 A | 1/2009 |
| JP | 2009-065613 A | 3/2009 |
| JP | 2015-220538 A | 12/2015 |

OTHER PUBLICATIONS

J. Shen et al., "Current-Charge-Pump Residue Amplification for Ultra-Low Power Pipelined ADCs", IEEE Transactions on Circuits and Systems—II: Express Briefs, vol. 58, No. 7, (Jul. 2011).

* cited by examiner

*Primary Examiner* — Khai M Nguyen
(74) *Attorney, Agent, or Firm* — White & Case LLP

(57) ABSTRACT

According to one embodiment, an amplifier circuit includes a first converter generating a time signal by voltage-time converting an input signal; a second converter generating an output signal by time-voltage converting the time signal; and a correction circuit outputting a control signal by comparing the time signal and a reference signal. The first converter generates the time signal, based on the control signal.

19 Claims, 24 Drawing Sheets

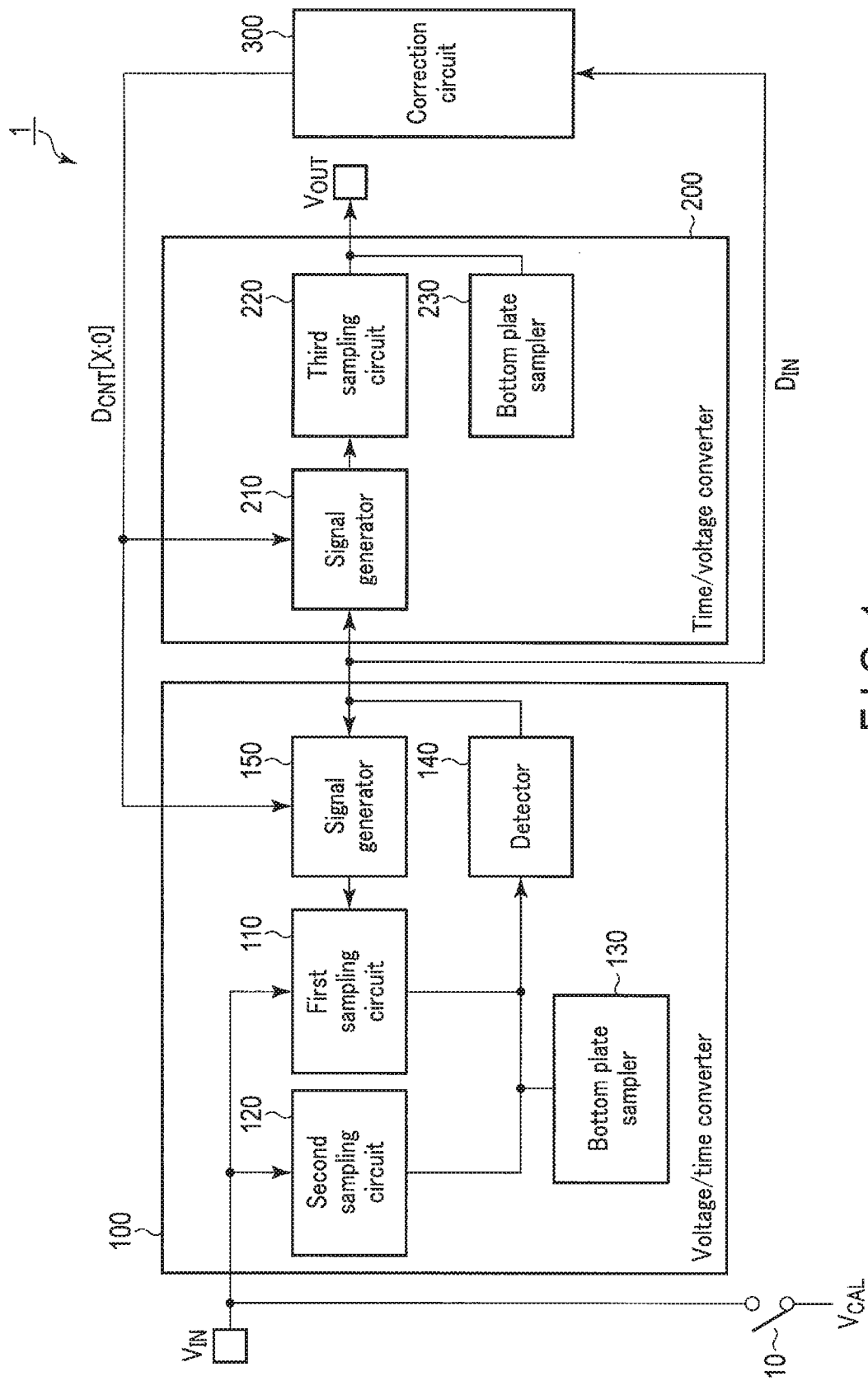
F I G. 1

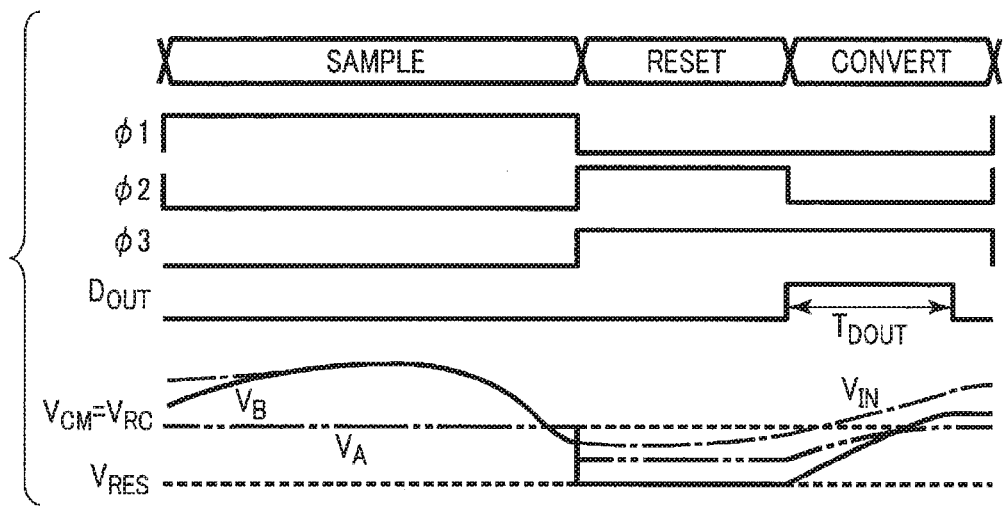
F I G. 4
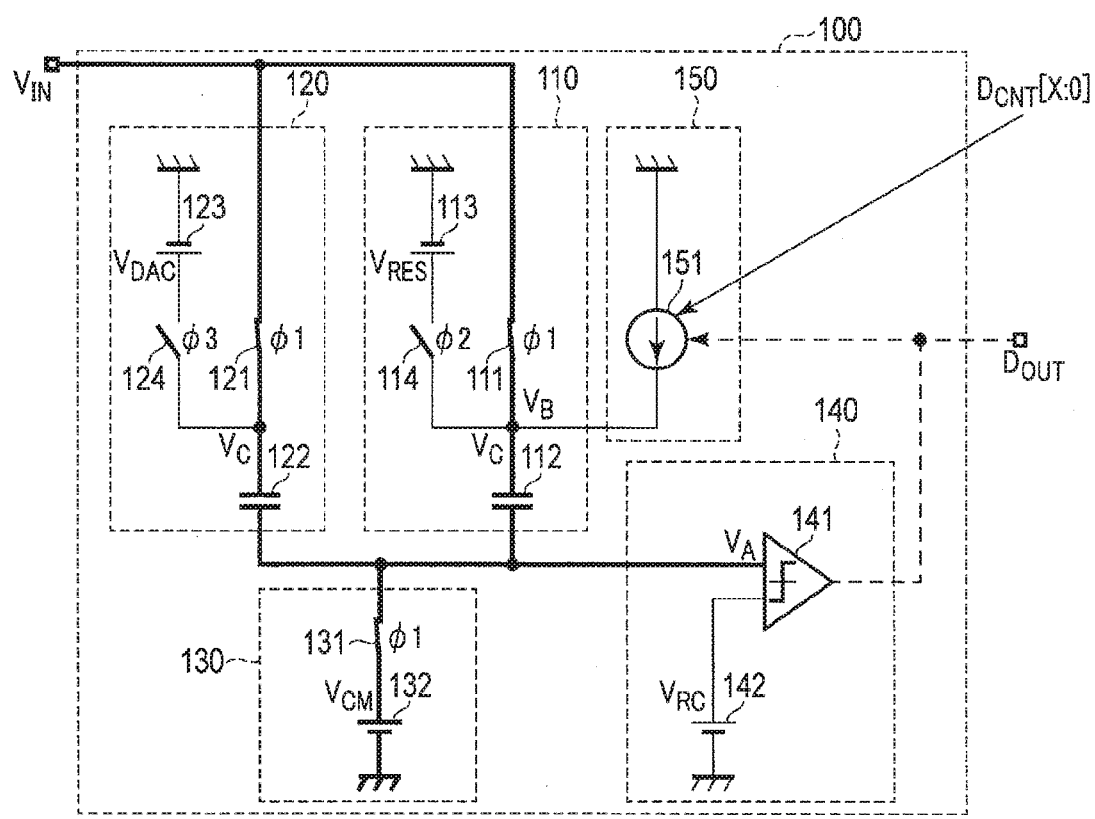
F I G. 5

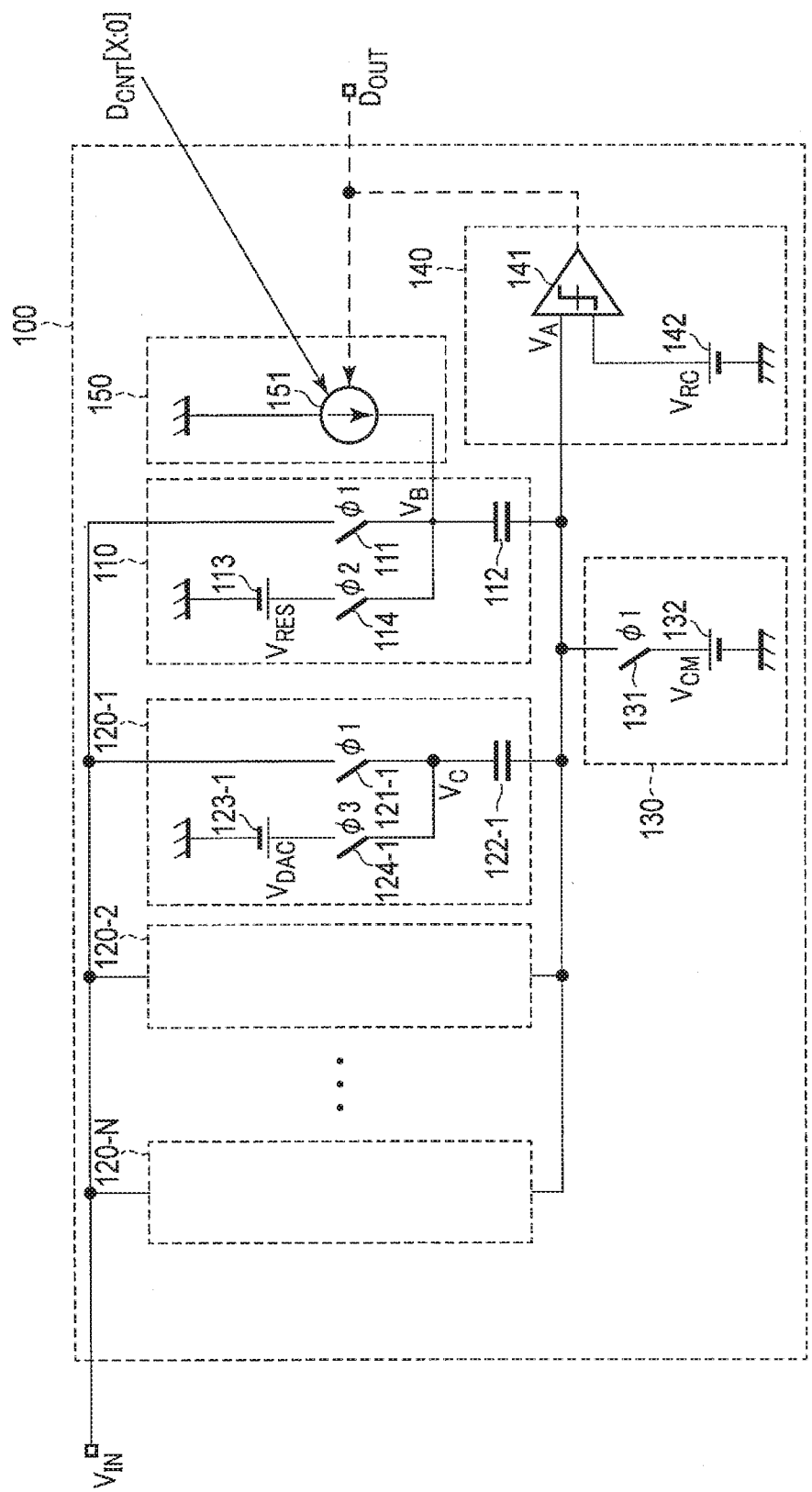
F I G. 8

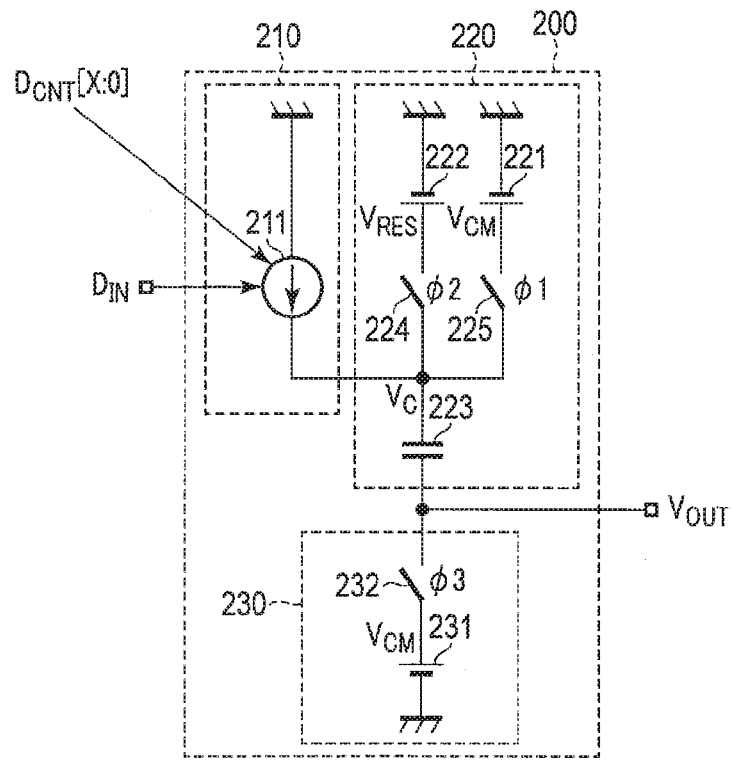
F I G. 9
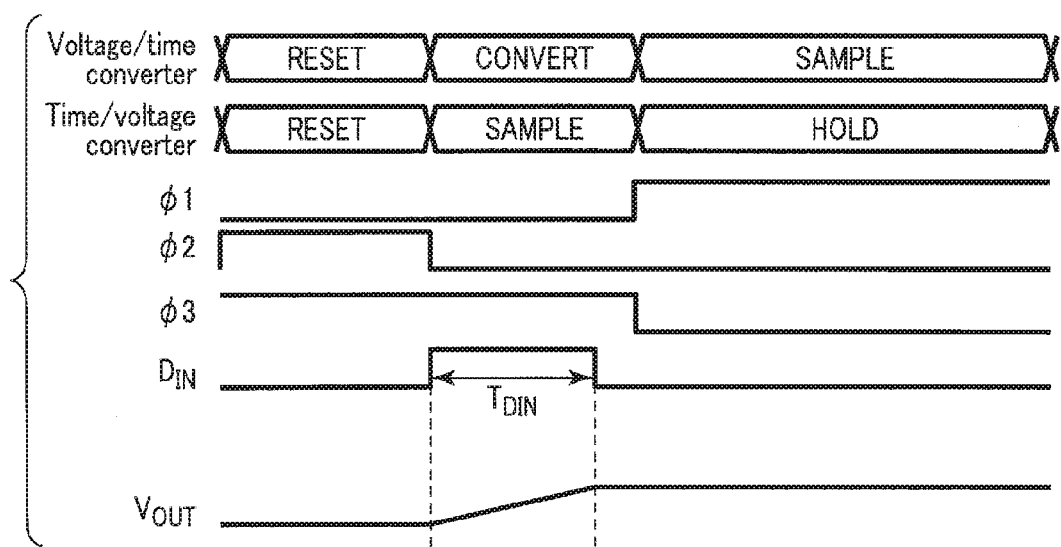
F I G. 10

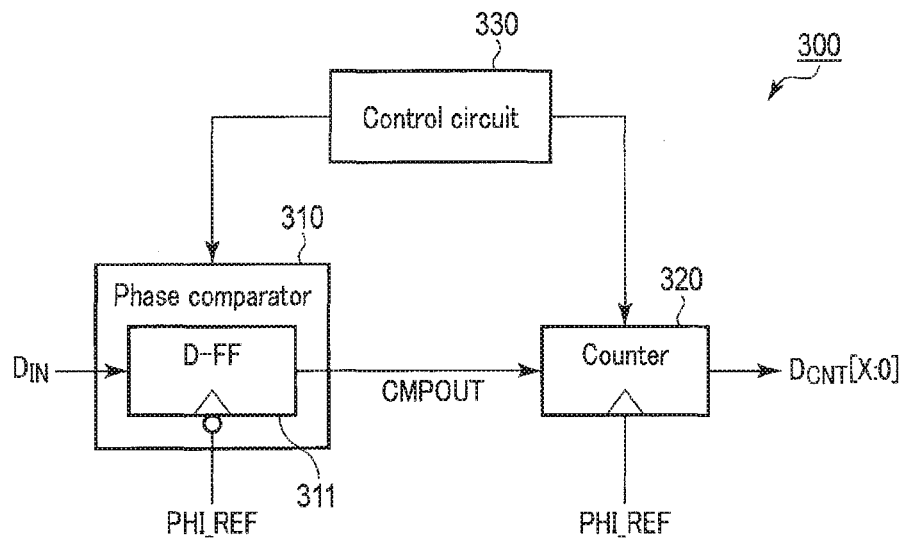
F I G. 11
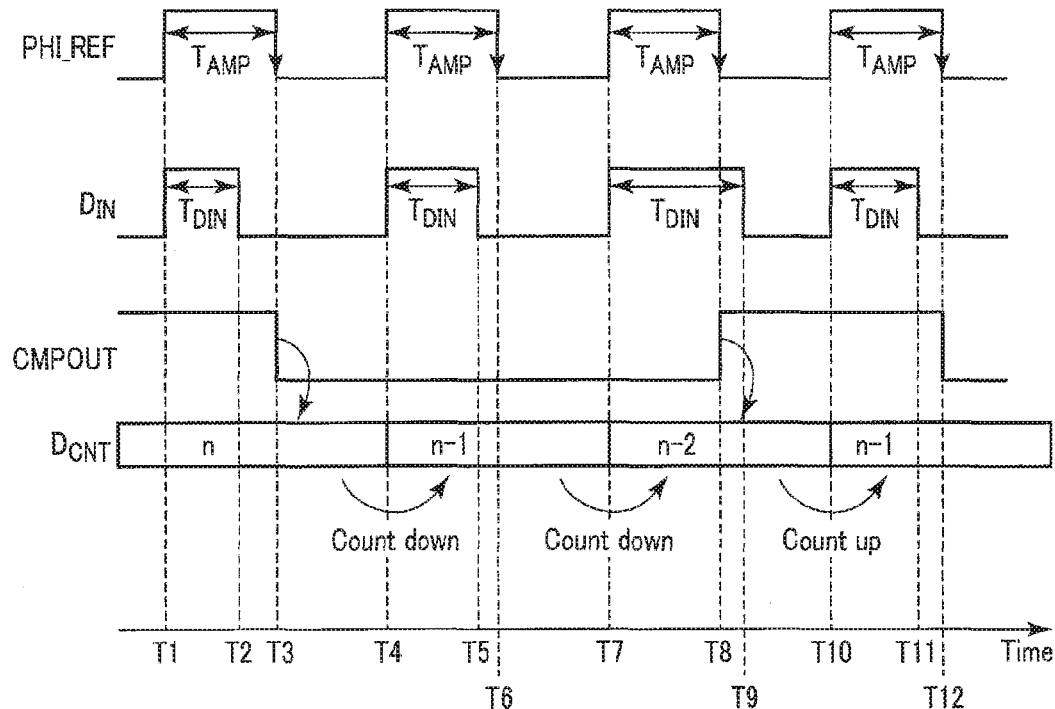
F I G. 12

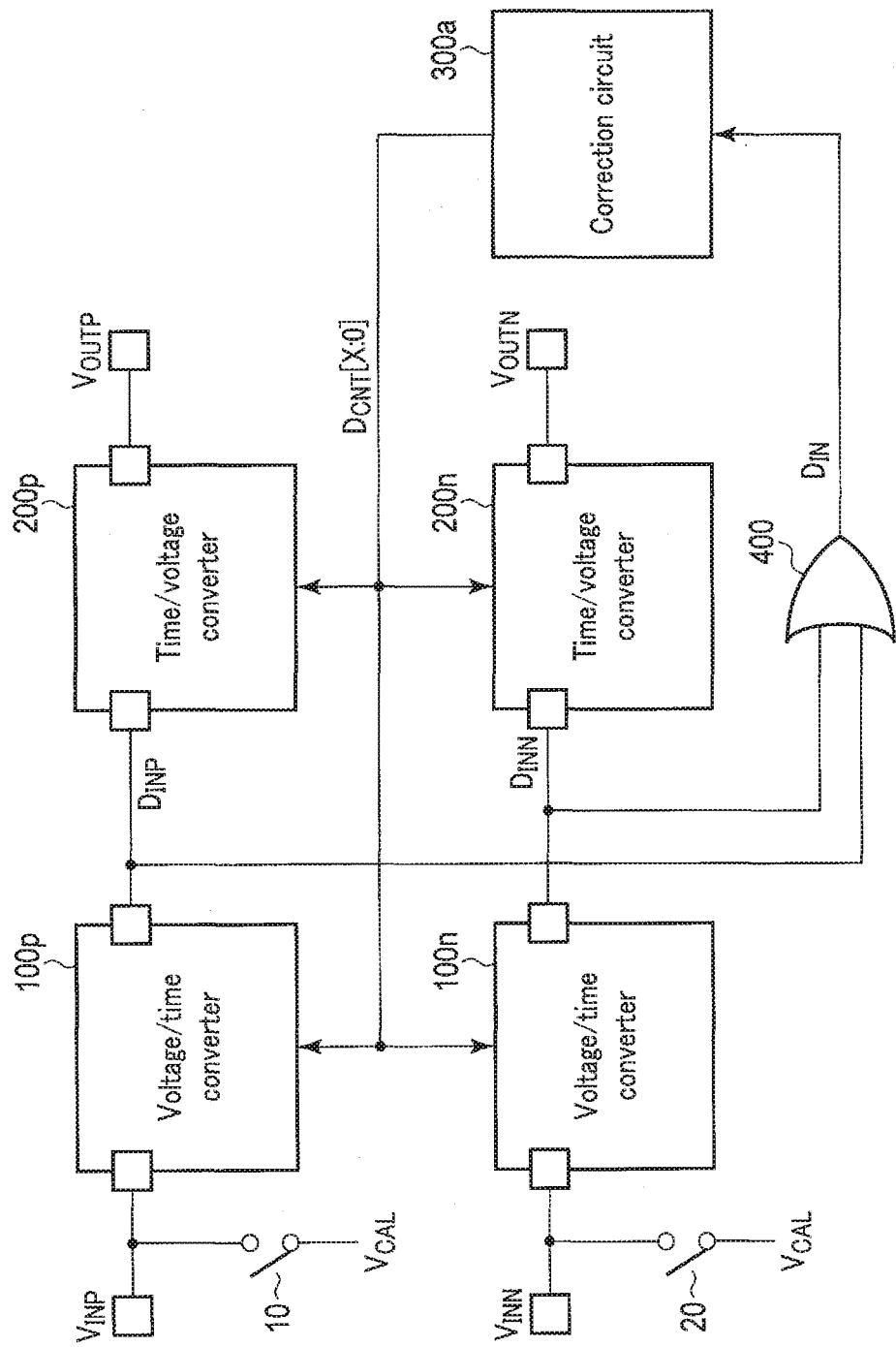
F I G. 13

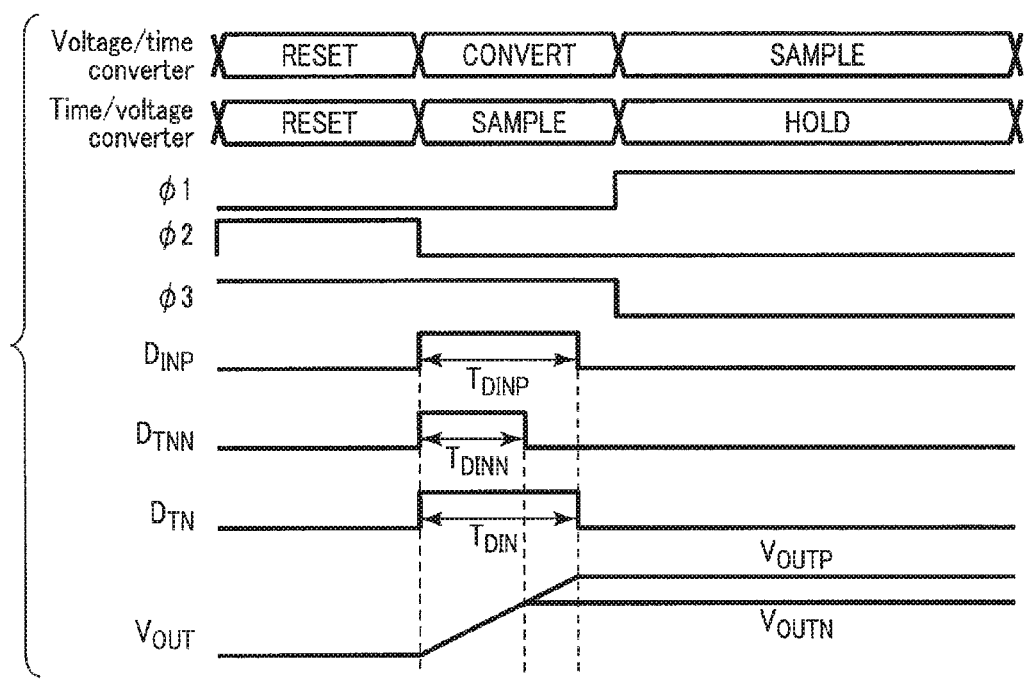
F I G. 14

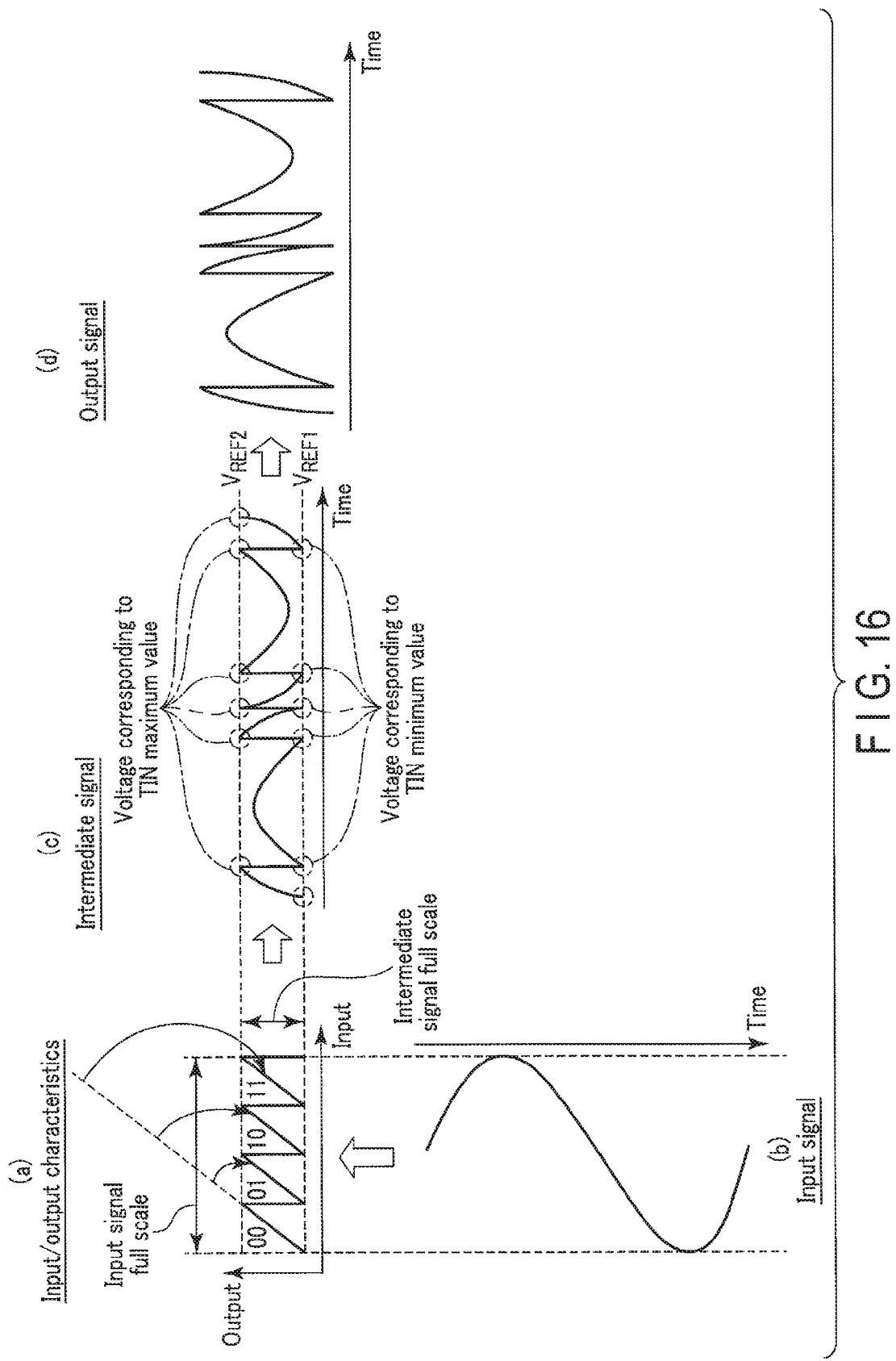
F I G. 16

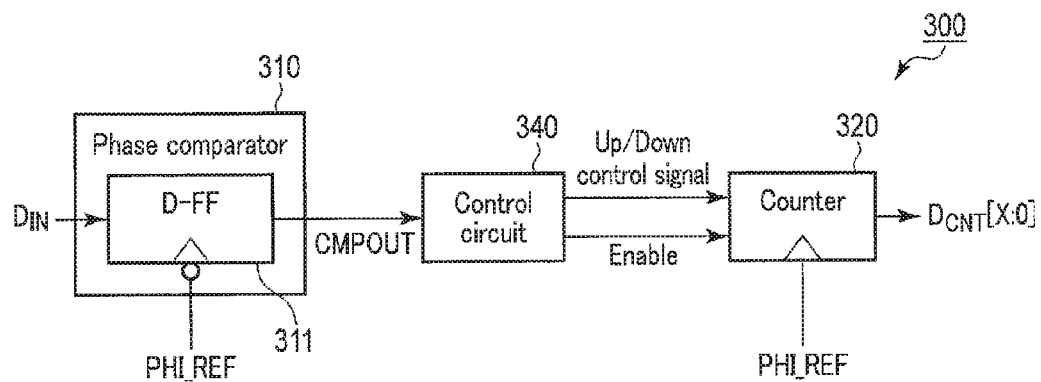
F I G. 17
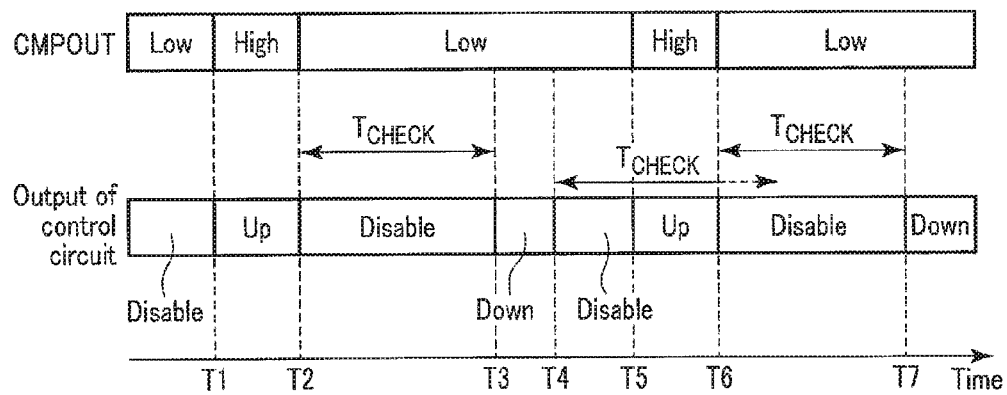
F I G. 18

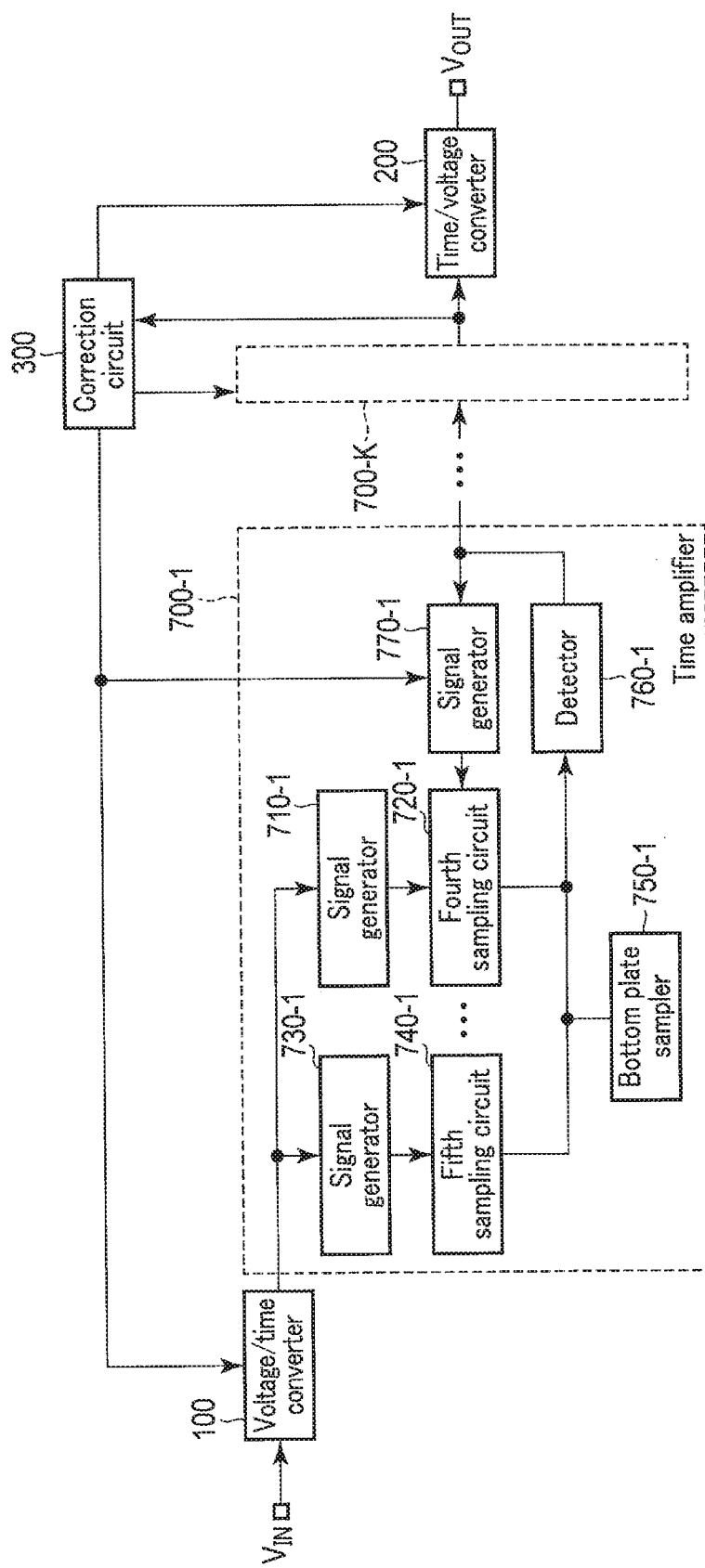
F I G. 19

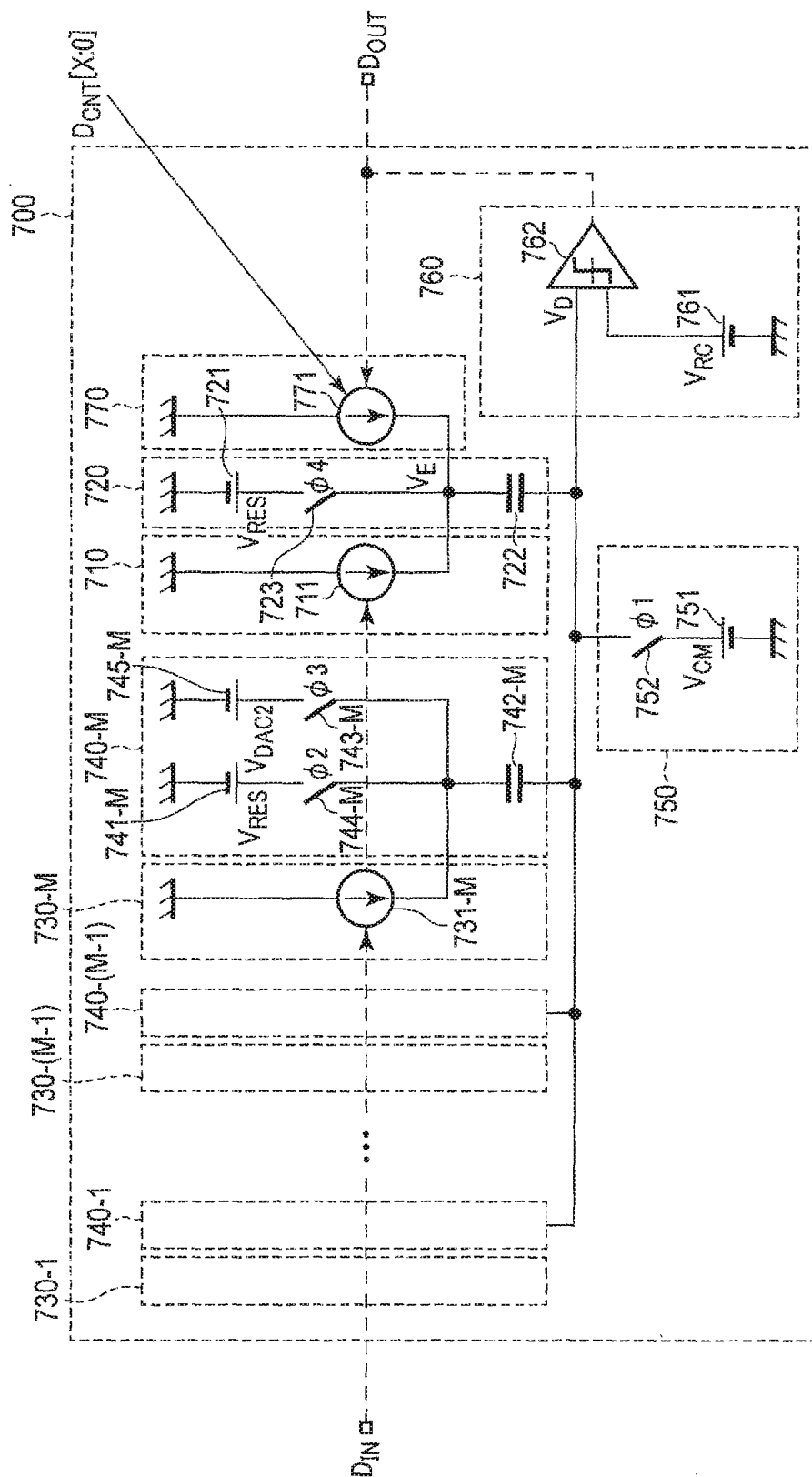
F I G. 22

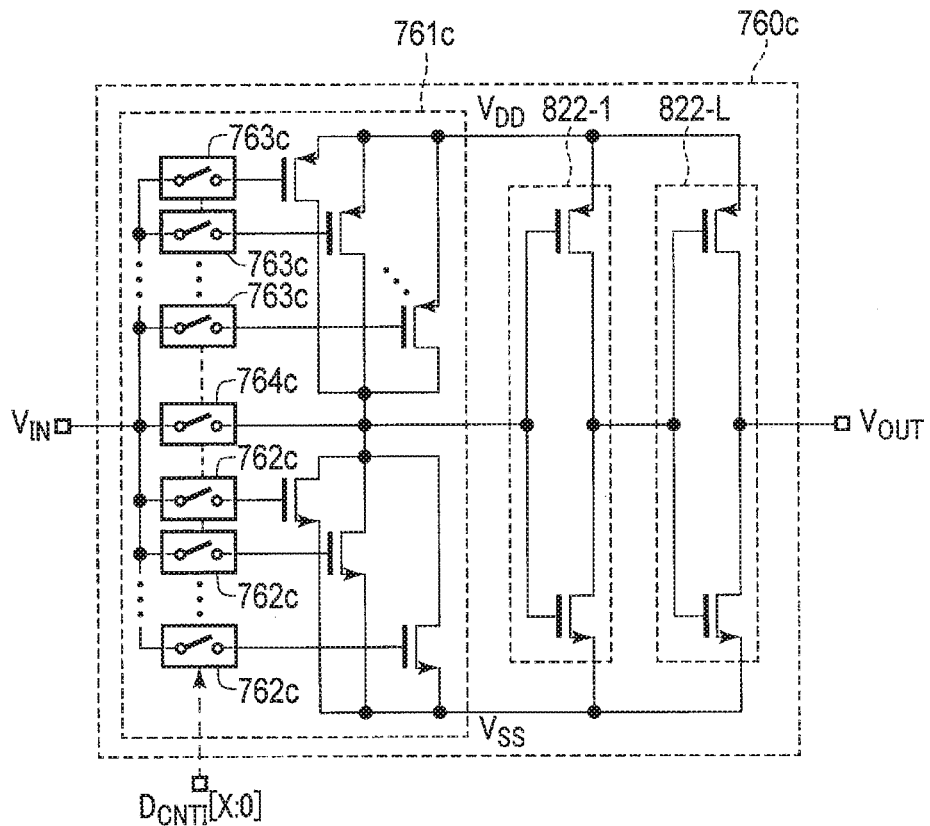
F I G. 29
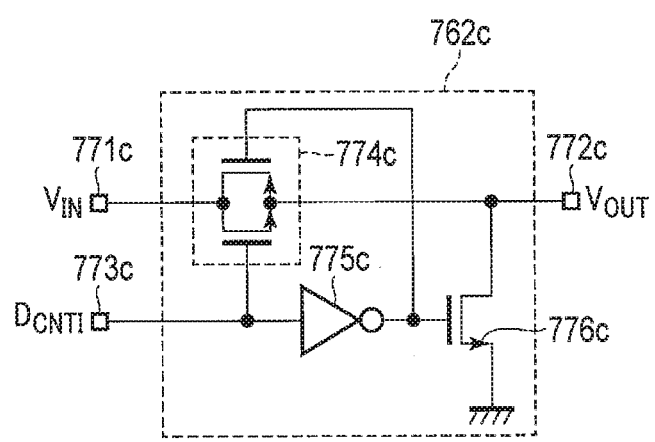
F I G. 30

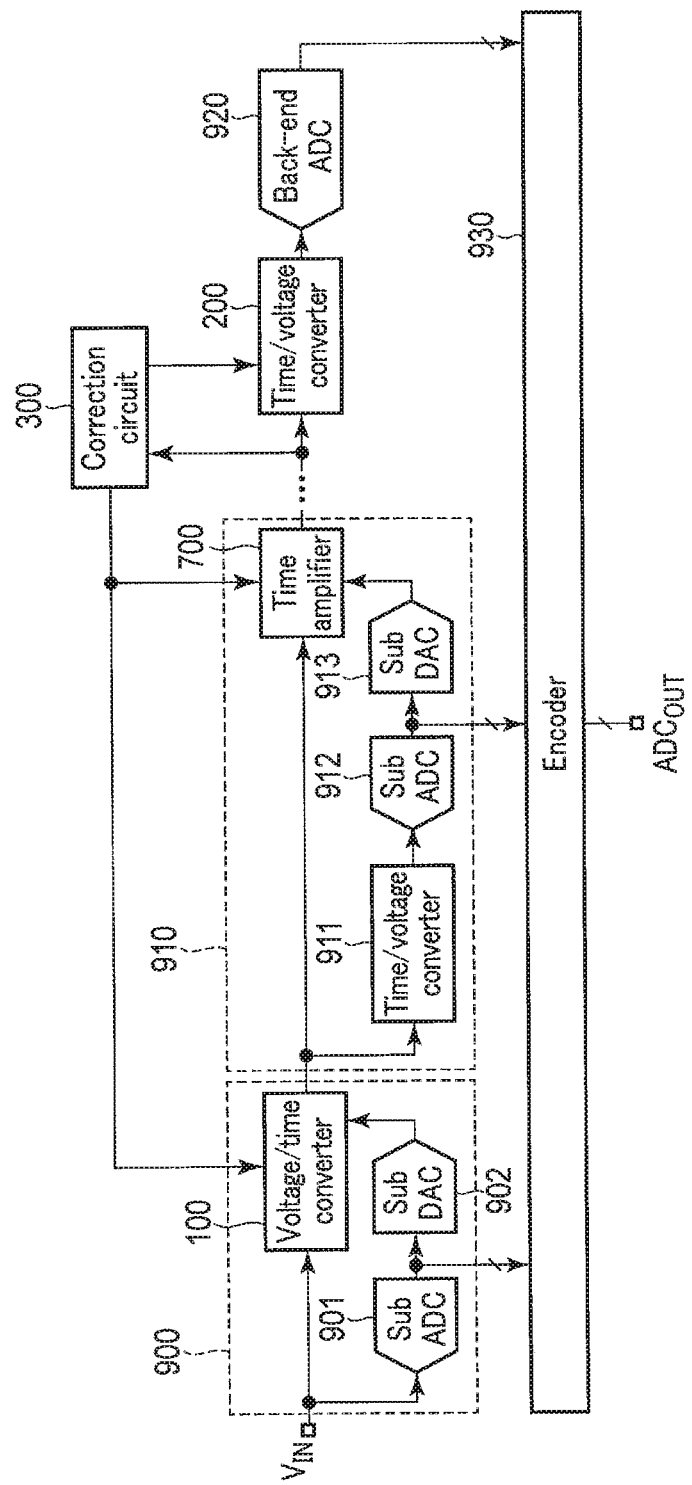
F I G. 31

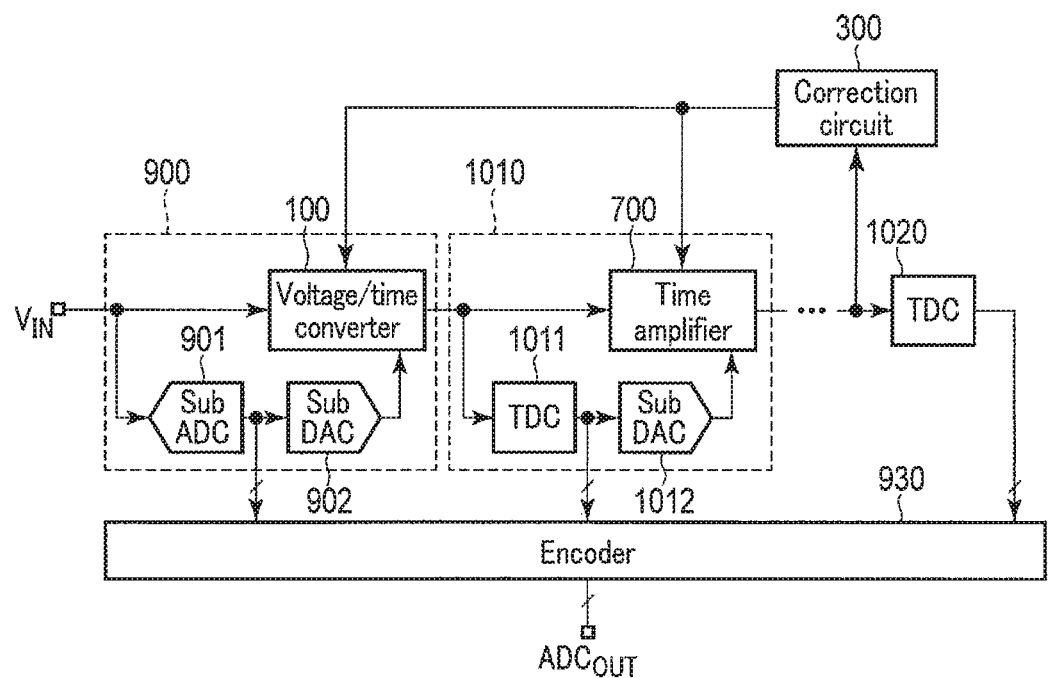
F I G. 32

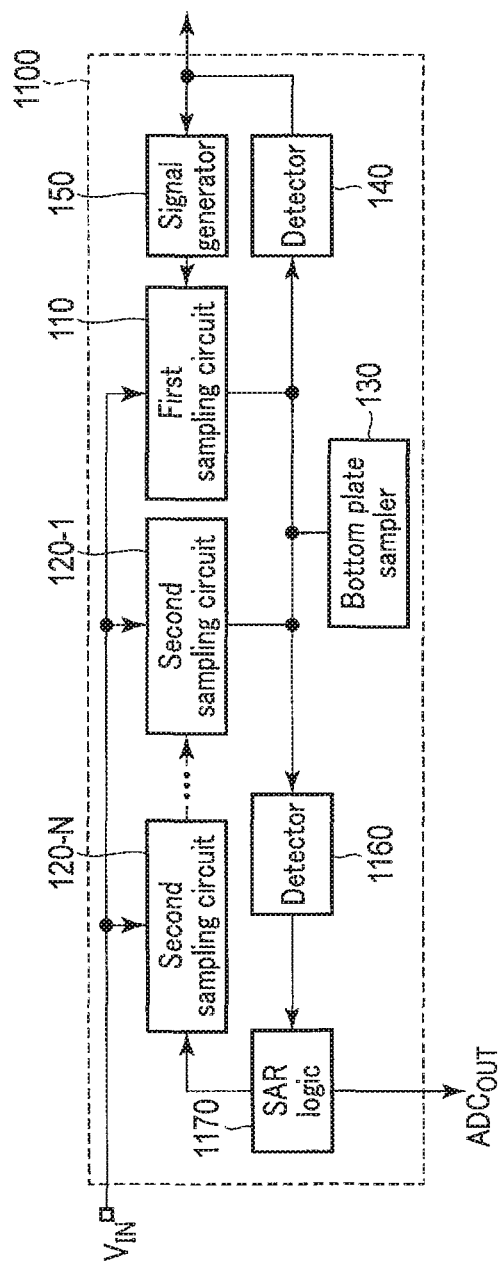
F I G. 33

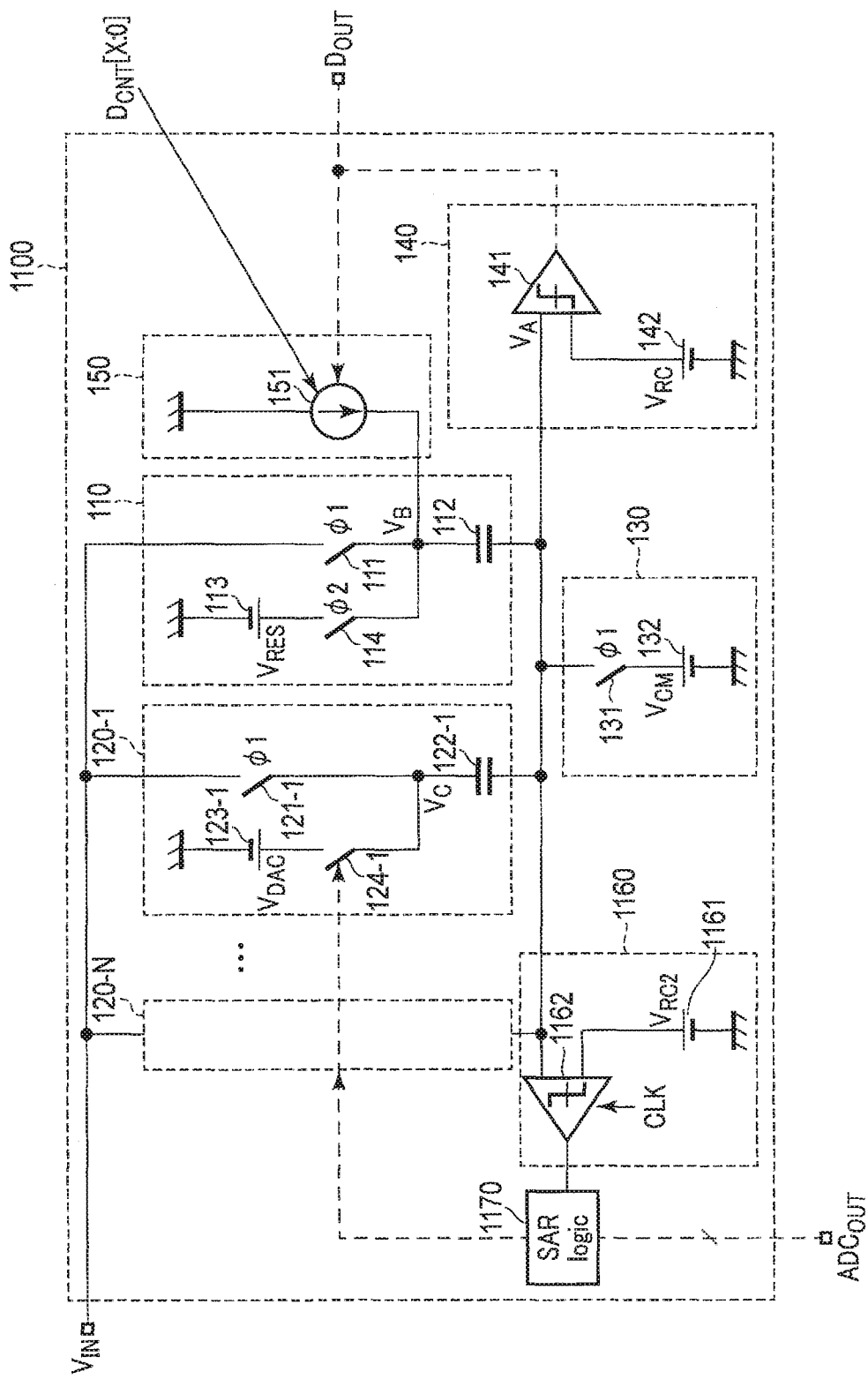
F I G. 34

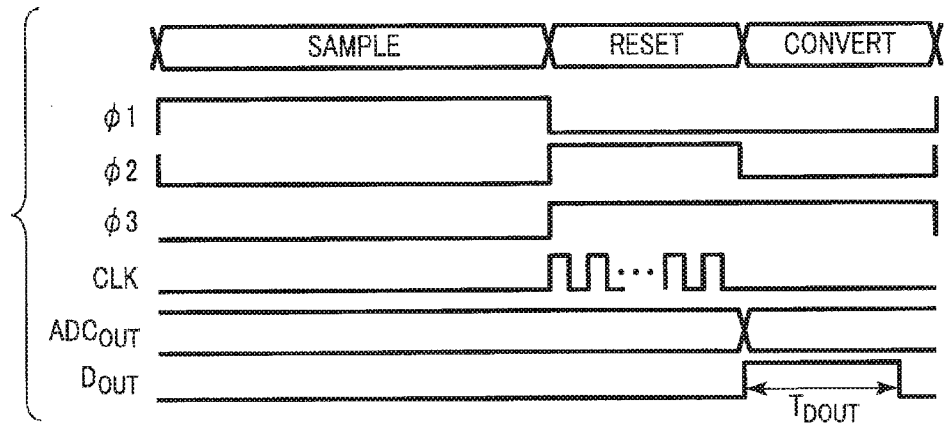
F I G. 35
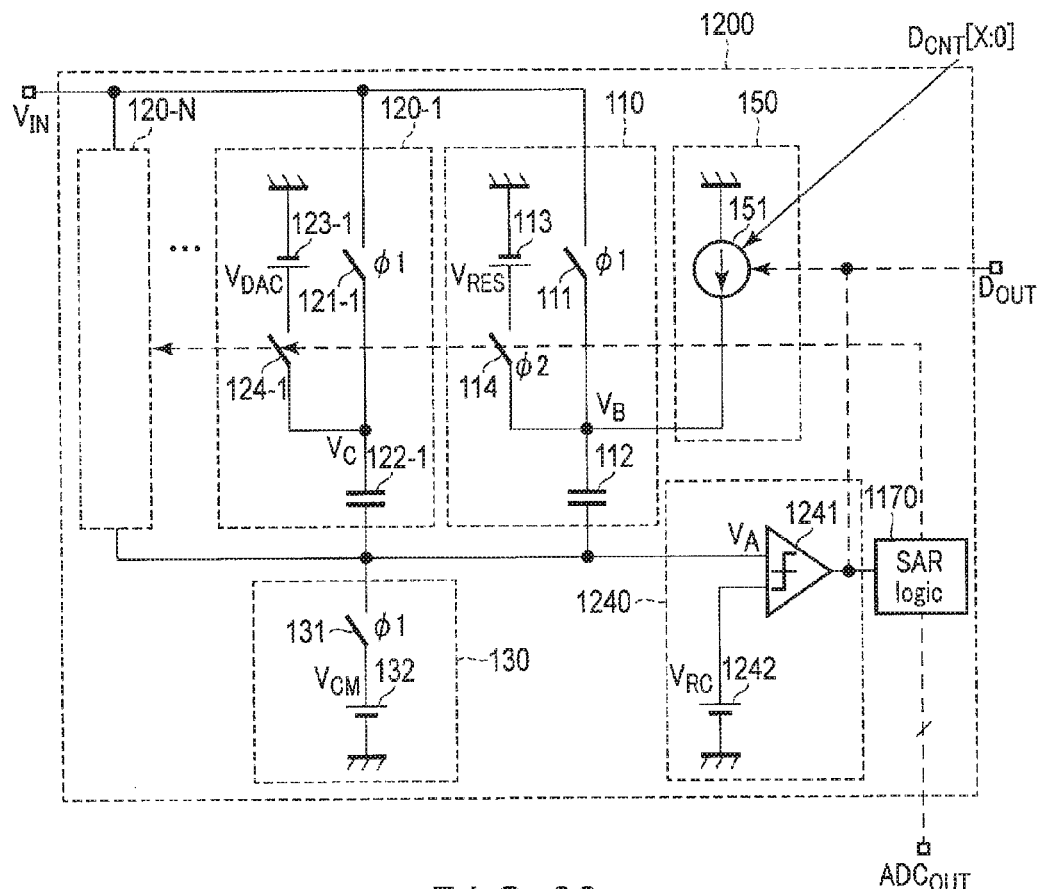
F I G. 36

AMPLIFIER CIRCUIT AND PIPELINE TYPE ANALOG-DIGITAL CONVERTER

CROSS REFERENCE TO RELATED APPLICATIONS

This application is based upon and claims the benefit of priority from prior Japanese Patent Application No. 2015-051632, filed Mar. 16, 2015; the entire contents of which are incorporated herein by reference.

FIELD

Embodiments described herein relate generally to an amplifier circuit and pipeline type analog-digital converter.

BACKGROUND

Conventionally, amplifier circuits have typically been realized by using operational amplifiers. In recent years, a discrete-time type amplifier circuit has been proposed, which adopts a charge pump circuit and a comparator in place of the operational amplifier. The power consumption of the discrete-time type amplifier circuit is lower than the power consumption of the amplifier circuit using the operational amplifier.

However, in a certain conventional discrete-time type amplifier circuit, a time difference (also called "mismatch") occurs, in some cases, between a voltage of an input and a voltage of an output at a time of the start of an amplification operation. It is thus difficult to improve the precision (resolution) of this amplifier circuit. On the other hand, in another conventional discrete-time type amplifier circuit, a switch is inserted between the input and output, and therefore the mismatch may possibly be improved. However, conversely, degradation in isolation occurs between the input and output, and also nonlinear distortion of this switch occurs. Thus, it is also difficult to improve the precision of this amplifier circuit.

BRIEF DESCRIPTION OF THE DRAWINGS

FIG. 1 is a block diagram illustrating an amplifier circuit according to a first embodiment.

FIG. 4 is a timing chart illustrating variations of various signals in respective phases into which the operation of the voltage-time converter of FIG. 2 is divided.

FIG. 5 is a circuit diagram for describing the operation of the voltage-time converter of FIG. 2 in a sample phase.

FIG. 8 is a circuit diagram illustrating a modification of the voltage-time converter of FIG. 2.

FIG. 9 is a circuit diagram illustrating a time-voltage converter of FIG. 1.

FIG. 10 is a timing chart illustrating variations of various signals in respective phases into which the operation of the time-voltage converter of FIG. 9 is divided.

FIG. 11 is a block diagram illustrating a correction circuit of the amplifier circuit according to the first embodiment.

FIG. 12 is a timing chart illustrating a correction amount adjustment operation of the correction circuit of FIG. 11.

FIG. 13 is a block diagram illustrating an amplifier circuit according to a modification of the first embodiment.

FIG. 14 is a timing chart illustrating variations of various signals in respective phases into which the operation of the voltage-time converter of FIG. 13 is divided.

FIG. 16 is a view illustrating waveforms of operation of the pipeline type analog-digital converter.

FIG. 17 is a block diagram illustrating a correction circuit of an amplifier circuit according to the second embodiment.

FIG. 18 is a view illustrating a correction amount adjustment operation of the correction circuit of FIG. 17.

FIG. 19 is a block diagram illustrating an amplifier circuit according to a third embodiment.

FIG. 22 is a circuit diagram illustrating a modification of the time amplifier of FIG. 20.

FIG. 29 is a circuit diagram illustrating a detector of FIG. 28.

FIG. 30 is a circuit diagram illustrating a switch of FIG. 29.

FIG. 31 is a block diagram illustrating an analog-digital converter according to a ninth embodiment.

FIG. 32 is a block diagram illustrating a modification of the analog-digital converter of FIG. 31.

FIG. 33 is a block diagram illustrating a voltage-time converter according to a tenth embodiment.

FIG. 34 is a circuit diagram illustrating the voltage-time converter according to the tenth embodiment.

FIG. 35 is a timing chart illustrating variations of various signals in respective phases into which the operation of the voltage-time converter of FIG. 34 is divided.

FIG. 36 is a circuit diagram illustrating a voltage-time converter according to an eleventh embodiment.

DETAILED DESCRIPTION

Figure 2:
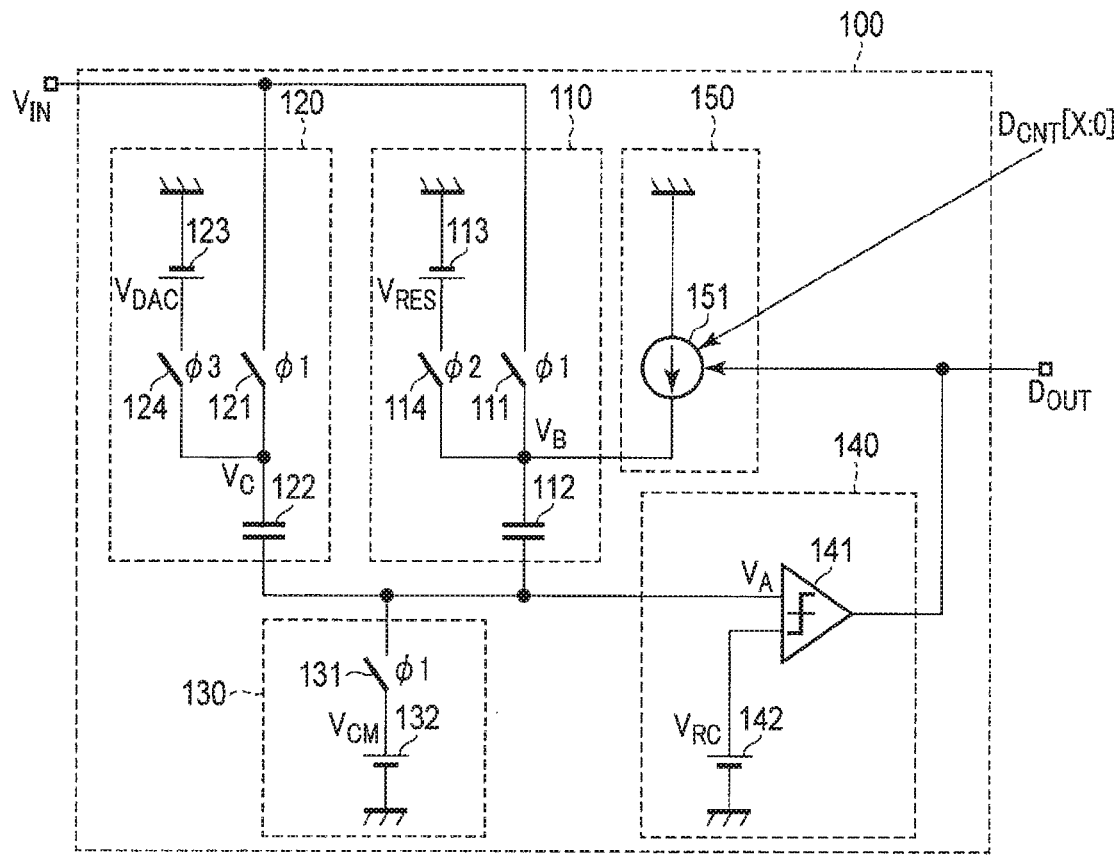
FIG. 2 is a circuit diagram illustrating a voltage-time converter of FIG. 1.

In general, according to one embodiment, an amplifier circuit includes a first converter generating a time signal by voltage-time converting an input signal; a second converter generating an output signal by time-voltage converting the time signal; and a correction circuit outputting a control signal by comparing the time signal and a reference signal. The first converter generates the time signal, based on the control signal.

Hereinafter, the details of embodiments will be described with reference to the accompanying drawings. In the description, common parts are denoted by like reference numerals throughout the drawings.

Although various current sources will be illustrated below for the purpose of concrete descriptions, the directions of electric currents, which constant-current signals generated by these current sources have, may be changed when necessary. Specifically, each current source may generate a constant-current signal for discharging, and not for charging, a sampling capacitor. In addition, various circuits, which will be illustrated in the description below, may be altered to differential configurations. When the circuits are altered to differential configurations, each current source is replaced with a current source pair. Further, the directions of currents, which constant-current signals generated by each current source pair have, may be identical or opposite to each other.

In each of the embodiments below, a description is given of an amplifier circuit which converts an input voltage to a time signal, and converts the time signal to a voltage signal, thereby amplifying the input voltage.

First Embodiment

In a first embodiment, a description is given of an amplifier circuit wherein the current value of a current source is corrected in advance during a calibration period prior to execution of a normal amplification operation.

<1> Configuration

<1-1> Outline of Amplifier Circuit

As illustrated in FIG. 1, an amplifier circuit 1 according to the first embodiment includes a switch 10, a voltage-time converter 100, a time-voltage converter 200, and a correction circuit 300. The amplifier circuit 1 obtains an output voltage ($V_{OUT}$) by amplifying an input voltage ($V_{IN}$).

<1-2> Outline of Voltage-Time Converter

To begin with, the outline of the voltage-time converter 100 is described. The voltage-time converter 100 generates a time signal by voltage-time converting an input signal. The time signal indicates a time length (time information) which depends on the voltage ($V_{IN}$) of the input signal. The time signal is, for example, a rectangular-wave signal with a pulse width varying in proportion to the input voltage ($V_{IN}$). The voltage-time converter 100 outputs the time signal to the time-voltage converter 200.

The voltage-time converter 100 of FIG. 1 includes a first sampling circuit 110, a second sampling circuit 120, a bottom plate sampler 130, a detector 140, and a signal generator 150.

The first sampling circuit 110 includes a first terminal, a second terminal and a third terminal, and includes a sampling capacitor which is not shown in FIG. 1. The first terminal of the first sampling circuit 110 is commonly connected to one end of the switch 10, an input terminal of the voltage-time converter 100, and a first terminal of the second sampling circuit 120. An input voltage ($V_{IN}$) is applied to the first terminal. The second terminal of the first sampling circuit 110 is commonly connected to a second terminal of the second sampling circuit 120, a first terminal of the bottom plate sampler 130 and an input terminal of the detector 140. The third terminal of the first sampling circuit 110 is connected to an output terminal of the signal generator 150.

In a sample phase (SAMPLE) to be described later, the first sampling circuit 110 samples the input voltage ($V_{IN}$) by applying the input voltage ($V_{IN}$) to a first terminal of the sampling capacitor. On the other hand, the voltage of a second terminal of the sampling capacitor is fixed by the bottom plate sampler 130.

In a reset phase (RESET) following the sample phase, the first sampling circuit 110 resets the voltage of the first terminal of the sampling capacitor by using a reset voltage (to be described later). Meanwhile, as will be described later, the bottom plate sampler 130 does not provide a current path. As a result, the voltage of the second terminal of the first sampling circuit 110 is determined by the input voltage ($V_{IN}$) that was sampled in the sample phase.

In at least a part of a convert phase (CONVERT) following the reset phase, an electric signal (e.g. a variable current signal) is supplied from the signal generator 150 to the first terminal of the sampling capacitor. As will be described later, the signal generator 150 continues to generate the electric signal over a first period in which the voltage of the input terminal of the detector 140 satisfies a first condition. Then, the sampling capacitor continues to be charged or discharged over the first period. As a result, the voltage of the input terminal of the detector 140 continues to rise or fall, and, at last, satisfies the first condition. In the meantime, in a calibration period (to be described later), an input voltage ($V_{CAL}$) is input to the first sampling circuit 110 via the switch 10.

The second sampling circuit 120 includes the first terminal and second terminal, and includes a sampling capacitor which is not shown in FIG. 1. The first terminal of the second sampling circuit 120 is commonly connected to the input terminal of the voltage-time converter 100 and the first terminal of the first sampling circuit 110. The input voltage ($V_{IN}$) is applied to the first terminal. The second terminal of the second sampling circuit 120 is commonly connected to the second terminal of the first sampling circuit 110, the first terminal of the bottom plate sampler 130 and the input terminal of the detector 140.

In the sample phase, the second sampling circuit 120 samples the input voltage ($V_{IN}$) by applying the input voltage ($V_{IN}$) to a first terminal of the sampling capacitor. On the other hand, the voltage of a second terminal of the sampling capacitor is fixed by the bottom plate sampler 130.

In the reset phase, the second sampling circuit 120 fixes the voltage of the first terminal of the sampling capacitor by using an adjustment voltage (to be described later). Meanwhile, the bottom plate sampler 130 does not provide a current path. As a result, the voltage of the second terminal of the second sampling circuit 120 is determined by the input voltage ($V_{IN}$) that was sampled in the sample phase.

Also in the convert phase following the reset phase, the second sampling circuit 120 continues to fix the voltage of the first terminal of the sampling capacitor. As a result, the second sampling circuit 120 provides a current path for the electric signal that was generated by the signal generator 150. By this electric signal flowing through the current path, the sampling capacitor is charged or discharged. Hence, the voltage of the second terminal of the sampling capacitor continues to rise or fall, and as a result the voltage of the input terminal of the detector 140 satisfies the above-described first condition. In the meantime, in the calibration period (to be described later), the input voltage ($V_{CAL}$) is input to the second sampling circuit 120 via the switch 10.

The bottom plate sampler 130 includes the first terminal. The first terminal of the bottom plate sampler 130 is commonly connected to the second terminal of the first sampling circuit 110, the second terminal of the second sampling circuit 120 and the input terminal of the detector 140.

In the sample phase, the bottom plate sampler 130 connects a voltage source (not shown in FIG. 1), which generates a predetermined intermediate voltage, to the first terminal. This voltage source fixes the voltage of the second terminal of the sampling capacitor included in the first sampling circuit 110 and the voltage of the second terminal of the sampling capacitor included in the second sampling circuit 120.

The bottom plate sampler 130 does not connect the above-described voltage source to the first terminal in the reset phase and the convert phase. Further, ideally, the bottom plate sampler 130 does not provide a current path in the reset phase and convert phase.

The detector 140 includes the input terminal and an output terminal. The input terminal of the detector 140 is commonly connected to the second terminal of the first sampling circuit 110, the second terminal of the second sampling circuit 120 and the first terminal of the bottom plate sampler 130. The output terminal of the detector 140 is connected to a control terminal of the signal generator 150 and an input terminal of the time-voltage converter 200.

In the convert phase, the detector 140 detects whether the voltage of its input terminal satisfies the first condition. Then, the detector 140 generates a time signal indicative of a time length of a first period in which the voltage of its input terminal satisfies the first condition. For example, the time signal may be a digital signal which is at "H (high)" level over the first period, and is at "L (low)" level over the other period. The detector 140 outputs the time signal to the signal generator 150 and the time-voltage converter 200. The detector 140 stops the operation in the sample phase and reset phase.

The signal generator 150 is a variable current source, and includes the control terminal and output terminal. The control terminal of the signal generator 150 is connected to the output terminal of the detector 140. The output terminal of the signal generator 150 is connected to the third terminal of the first sampling circuit 110.

A time signal ($D_{OUT}$) is input from the detector 140 to the signal generator 150, and a digital control signal ($D_{CNT}$[X:0]) is input from the correction circuit 300 to the signal generator 150 (X is an integer of 0 or more). The signal generator 150 generates an electric signal, based on the time signal ($D_{OUT}$) and control signal ($D_{CNT}$[X:0]), and supplies this electric signal to the first sampling circuit 110. As the electric signal generated by the signal generator 150 becomes greater, a time length ($T_{DOUT}$) in the time signal ($D_{OUT}$) becomes shorter.

<1-3> Outline of Time-Voltage Converter

Next, the outline of the time-voltage converter 200 is described. A time signal ($D_{IN}$) is input to the time-voltage converter 200 from the voltage-time converter 100. The time-voltage converter 200 generates an output signal by time-voltage converting the time signal ($D_{IN}$). The voltage ($V_{OUT}$) of the output signal depends on the time length indicated by the time signal. Incidentally, the time signal ($D_{IN}$) and time signal ($D_{OUT}$) are the same signal. The time signal ($D_{OUT}$) is an expression of the time signal as viewed from the voltage-time converter 100, and the time signal ($D_{IN}$) is an expression of the time signal as viewed from the time-voltage converter 200. In addition, the time length ($T_{DOUT}$) is an expression of the time length as viewed from the voltage-time converter 100, and the time length ($T_{DIN}$) is an expression of the time length as viewed from the time-voltage converter 200.

Besides, the time-voltage converter 200 of FIG. 1 may be replaced with some other publicly known time-voltage converter.

The time-voltage converter 200 of FIG. 1 includes a signal generator 210, a third sampling circuit 220 and a bottom plate sampler 230.

The signal generator 210 is a variable current source, and includes a control terminal and an output terminal. The control terminal of the signal generator 210 is connected to the output terminal of the voltage-time converter 100. The output terminal of the signal generator 210 is connected to a first terminal of the third sampling circuit 220.

The time signal ($D_{IN}$) is input from the voltage-time converter 100 to the signal generator 210, and the digital control signal ($D_{CNT}$[X:0]) is input from the correction circuit 300 to the signal generator 210. The signal generator 210 generates an electric signal, based on the time signal ($D_{IN}$) and control signal ($D_{CNT}$[X:0]), and supplies this electric signal to the third sampling circuit 220. The signal generator 210 may be identical or similar to the signal generator 150.

The third sampling circuit 220 includes the first terminal and a second terminal, and includes a sampling capacitor which is not shown in FIG. 1. The first terminal of the third sampling circuit 220 is connected to the output terminal of the signal generator 210. The second terminal of the third sampling circuit 220 is connected to a first terminal of the bottom plate sampler 230 and an output terminal of the time-voltage converter 200.

In a reset phase (RESET) which will be described later, the third sampling circuit 220 resets a first terminal of the sampling capacitor by using, for example, the above-described reset voltage. On the other hand, the voltage of a second terminal of the sampling capacitor is fixed by the bottom plate sampler 230. Specifically, the third sampling circuit 220 resets the voltage of the first terminal of the sampling capacitor in such a manner that this voltage becomes substantially equal to the voltage of the first terminal of the sampling capacitor in the first sampling circuit 110 in the reset phase of the voltage-time converter 100. Further, the third sampling circuit 220 fixes the voltage of the second terminal of the sampling capacitor such that this voltage becomes substantially equal to the voltage of the second terminal of the sampling capacitor in the first sampling circuit 110 in the sample phase of the voltage-time converter 100.

In at least a part of a sample phase following the reset phase, an electric signal (e.g. a variable current signal) is supplied from the signal generator 210 to the first terminal of the sampling capacitor. On the other hand, in the sample phase, the voltage of the second terminal of the sampling capacitor is continuously fixed by the bottom plate sampler 230. The sample phase of the time-voltage converter 200 is made to temporally coincide with the convert phase of the voltage-time converter 100. Specifically, like the signal generator 150, the signal generator 210 continues to generate the electric signal over the above-described first period. Then, the sampling capacitor continues to be charged or discharged over the first period. Therefore, the voltage of the first terminal of the sampling capacitor continues to rise or fall.

In a hold phase (HOLD) following the sample phase, the voltage of the first terminal of the sampling capacitor is fixed by, for example, the above-described voltage source (not shown in FIG. 1) which generates the intermediate voltage. On the other hand, as will be described later, the bottom plate sampler 230 does not provide a current path. As a result, the voltage of the second terminal of the third sampling circuit 220 (i.e. the output voltage (Vow) of the time-voltage converter 200) is held at a value which depends on the voltage of the first terminal of the sampling capacitor at the time of the end of the sample phase.

The bottom plate sampler 230 includes the first terminal. The first terminal of the bottom plate sampler 230 is connected to the second terminal of the third sampling circuit 220 and the output terminal of the time-voltage converter 200. The bottom plate sampler 230 may be identical or similar to the bottom plate sampler 130.

In the reset phase and sample phase, the bottom plate sampler 230 connects the above-described voltage source (not shown in FIG. 1), which generates the intermediate voltage, to the first terminal. This voltage source fixes the voltage of the second terminal of the sampling capacitor which is included in the third sampling circuit 220.

The bottom plate sampler 230 does not connect the above-described voltage source to the first terminal in the hold phase. Further, ideally, the bottom plate sampler 230 does not provide a current path in the hold phase.

<1-4> Outline of Correction Circuit

The amplifier circuit 1 executes an amplification operation, for example, based on a clock signal. Hence, the amplifier circuit 1 needs to complete the amplification operation of the input signal within a time (time length ($T_{AMP}$)) which is allowed for amplification. Thus, the correction circuit 300 compares the time length ($T_{DIN}$) corresponding to the maximum value of the input signal (the time information depending on the amplitude of the input signal) and the time length ($T_{AMP}$) which is allowed for amplification, and supplies the digital control signal ($D_{CNT}[X:0]$) to the signal generators 150 and 210 so that the time length ($T_{DIN}$) corresponding to the maximum value of the input signal may become substantially identical to the time length ($T_{AMP}$) which is allowed for amplification. The signal generator 150 generates the time signal ($D_{IN}$) in accordance with the digital control signal ($D_{CNT}[X:0]$).

The time signal ($D_{IN}$) is input to the correction circuit 300 from the voltage-time converter 100. The correction circuit 300 generates the digital control signal ($D_{CNT}[X:0]$), based on the time signal (Dr) and a reference signal (e.g. clock signal) PHI_REF which is delivered from the outside of the amplifier circuit 1.

Incidentally, a detailed description of the operation of the above-described correction circuit 300 will be given later.

<1-5> Concrete Configuration of Voltage-Time Converter

Referring to FIG. 2, a concrete configuration of the voltage-time converter is described. In the present embodiment, for example, a voltage-time converter 100 illustrated in FIG. 2 may be adopted. The voltage-time converter 100 of FIG. 2 includes a first sampling circuit 110, a second sampling circuit 120, a bottom plate sampler 130, a detector 140, and a signal generator 150.

The first sampling circuit 110 includes a switch 111, a sampling capacitor 112, a voltage source 113, and a switch 114.

The switch 111 is inserted between a first terminal of the first sampling circuit 110 and a first terminal of the sampling capacitor 112. In accordance with a first switch control signal ($\phi 1$), the switch 111 establishes a short-circuit or an open-circuit between the first terminal of the first sampling circuit 110 and the first terminal of the sampling capacitor 112. Specifically, in the sample phase of the voltage-time converter 100, the switch 111 establishes a short-circuit between the first terminal of the first sampling circuit 110 and the first terminal of the sampling capacitor 112. On the other hand, in the reset phase and convert phase of the voltage-time converter 100, the switch 111 establishes an open-circuit between the first terminal of the first sampling circuit 110 and the first terminal of the sampling capacitor 112.

The sampling capacitor 112 includes the first terminal and a second terminal. The first terminal of the sampling capacitor 112 is commonly connected to a third terminal of the first sampling circuit 110, the switch 111 and the switch 114. The second terminal of the sampling capacitor 112 is connected to a second terminal of the first sampling circuit 110. The capacitance of the sampling capacitor 112 is set to be capacitance=$C_1$.

The voltage source 113 includes a positive terminal and a negative terminal. The positive terminal of the voltage source 113 is connected to the switch 114. The negative terminal of the voltage source 113 is grounded. The voltage source 113 generates a reset voltage ($V_{RES}$).

The switch 114 is inserted between the first terminal of the sampling capacitor 112 and the positive terminal of the voltage source 113. In accordance with a second switch control signal ($\phi 2$), the switch 114 establishes a short-circuit or an open-circuit between the first terminal of the sampling capacitor 112 and the positive terminal of the voltage source 113. Specifically, in the reset phase of the voltage-time converter 100, the switch 114 establishes a short-circuit between the first terminal of the sampling capacitor 112 and the positive terminal of the voltage source 113. On the other hand, in the sample phase and convert phase of the voltage-time converter 100, the switch 114 establishes an open-circuit between the first terminal of the sampling capacitor 112 and the positive terminal of the voltage source 113.

The second sampling circuit 120 includes a switch 121, a sampling capacitor 122, a voltage source 123, and a switch 124.

The switch 121 is inserted between a first terminal of the second sampling circuit 120 and a first terminal of the sampling capacitor 122. In accordance with the first switch control signal ($\phi 1$), the switch 121 establishes a short-circuit or an open-circuit between the first terminal of the second sampling circuit 120 and the first terminal of the sampling capacitor 122. Specifically, in the sample phase of the voltage-time converter 100, the switch 121 establishes a short-circuit between the first terminal of the second sampling circuit 120 and the first terminal of the sampling capacitor 122. On the other hand, in the reset phase and convert phase of the voltage-time converter 100, the switch 121 establishes an open-circuit between the first terminal of the second sampling circuit 120 and the first terminal of the sampling capacitor 122.

The sampling capacitor 122 includes the first terminal and a second terminal. The first terminal of the sampling capacitor 122 is commonly connected to the switch 121 and the switch 124. The second terminal of the sampling capacitor 122 is connected to a second terminal of the second sampling circuit 120. The capacitance of the sampling capacitor 122 is set to be capacitance=$C_1$.

The voltage source 123 includes a positive terminal and a negative terminal. The positive terminal of the voltage source 123 is connected to the switch 124. The negative terminal of the voltage source 123 is grounded.

The voltage source 123 generates an adjustment voltage ($V_{DAC}$). This voltage ($V_{DAC}$) may be controlled by a control signal not shown in FIG. 1.

The switch 124 is inserted between the first terminal of the sampling capacitor 122 and the positive terminal of the voltage source 123. In accordance with a third switch control signal (φ3), the switch 124 establishes a short-circuit or an open-circuit between the first terminal of the sampling capacitor 122 and the positive terminal of the voltage source 123. Specifically, in the reset phase and convert phase of the voltage-time converter 100, the switch 124 establishes a short-circuit between the first terminal of the sampling capacitor 122 and the positive terminal of the voltage source 123. On the other hand, in the sample phase of the voltage-time converter 100, the switch 124 establishes an open-circuit between the first terminal of the sampling capacitor 122 and the positive terminal of the voltage source 123.

The bottom plate sampler 130 includes a switch 131 and a voltage source 132.

The switch 131 is inserted between a first terminal of the bottom plate sampler 130 and a positive terminal of the voltage source 132. In accordance with the first switch control signal (φ1), the switch 131 establishes a short-circuit or an open-circuit between the first terminal of the bottom plate sampler 130 and the positive terminal of the voltage source 132. Specifically, in the sample phase of the voltage-time converter 100, the switch 131 establishes a short-circuit between the first terminal of the bottom plate sampler 130 and the positive terminal of the voltage source 132. On the other hand, in the reset phase and convert phase of the voltage-time converter 100, the switch 131 establishes an open-circuit between the first terminal of the bottom plate sampler 130 and the positive terminal of the voltage source 132.

The voltage source 132 includes the positive terminal and a negative terminal. The positive terminal of the voltage source 132 is connected to the switch 131. The negative terminal of the voltage source 132 is grounded. The voltage source 132 generates an intermediate voltage ($V_{CM}$). For example, when the voltage-time converter 100 has a differential configuration, the intermediate voltage ($V_{CM}$) may be so designed as to coincide with a common mode voltage.

The detector 140 includes a comparator 141 and a voltage source 142.

The comparator 141 includes a first input terminal, a second input terminal and an output terminal. The input terminal of the comparator 141 is connected to an input terminal of the detector 140. The second input terminal of the comparator 141 is connected to a positive terminal of the voltage source 142. The output terminal of the comparator 141 is connected to an output terminal of the detector 140.

In the convert phase of the voltage-time converter 100, the comparator 141 compares a voltage of the first input terminal with a voltage of the second input terminal. The comparator 141 stops the operation in the sample phase and reset phase of the voltage-time converter 100.

Specifically, in the convert phase of the voltage-time converter 100, if the voltage of the first input terminal is lower than the voltage of the second input terminal, the comparator 141 outputs a time signal ($D_{OUT}$) of "H" level (power supply voltage). On the other hand, if the voltage of the first input terminal is equal to or higher than the voltage of the second input terminal, the comparator 141 outputs a time signal ($D_{OUT}$) of "L" level (ground voltage). Therefore, according to the example of FIG. 2, the above-described first condition corresponds to that the voltage of the input terminal of the detector 140 is lower than a comparative reference voltage ($V_{RC}$) which will be described later.

The voltage source 142 includes the positive terminal and a negative terminal. The positive terminal of the voltage source 142 is connected to the second input terminal of the comparator 141. The negative terminal of the voltage source 142 is grounded. The voltage source 142 generates the comparative reference voltage ($V_{RC}$).

The signal generator 150 includes a variable current source 151. The variable current source 151 includes a first terminal, a second terminal, a first control terminal, and a second control terminal. The first terminal of the variable current source 151 is grounded. The second terminal of the variable current source 151 is connected to an output terminal of the signal generator 150. The first control terminal and second control terminal of the variable current source 151 are connected to a control terminal of the signal generator 150.

A time signal ($D_{OUT}$) from the detector 140 is input to the variable current source 151 via the first control terminal. A digital control signal ($D_{CNT}[X:0]$) from the correction circuit 300 is input to the variable current source 151 via the second control terminal. If the time signal ($D_{OUT}$) is at "H" level, the variable current source 151 generates a variable current signal, based on the digital control signal ($D_{CNT}[X:0]$), and supplies this variable current signal to the first sampling circuit 110 via the second terminal. On the other hand, if the time signal ($D_{OUT}$) is at "L" level, the variable current source 151 stops the operation. A current amount ($I_{151}$), which is output by the variable current source 151, is controlled by the digital control signal ($D_{CNT}[X:0]$) of (X+1) bits.

<1-6> Concrete Configuration of Variable Current Source

Figure 3:
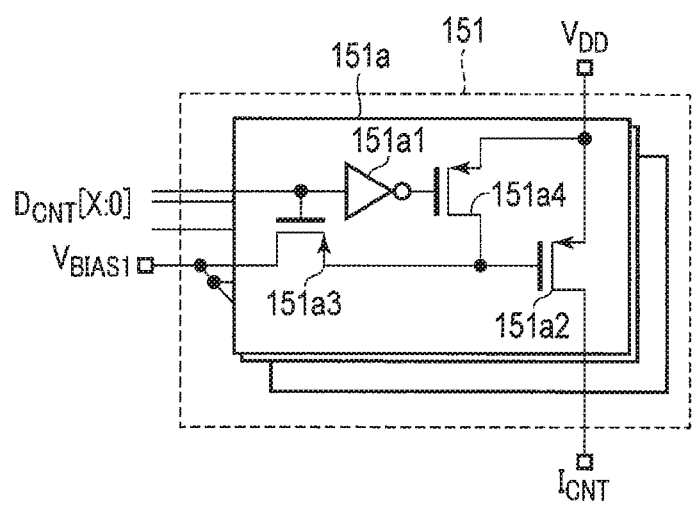
FIG. 3 is a circuit diagram illustrating a variable current source of FIG. 2.

Next, referring to FIG. 3, a configuration example of the variable current source 151 is described. In the present embodiment, a variable current source 151 illustrated in FIG. 3 may be adopted. The variable current source of FIG. 3 includes an (X+1) number of sub-current sources 151a. Each sub-current source 151a includes an inverter 151a1, a transistor 151a2, a transistor 151a3, and a transistor 151a4. Incidentally, in FIG. 3, although the transistors 151a2 to 151a4 are depicted as MOS transistors, these may be replaced with other kinds of transistors.

A predetermined 1-bit digital signal, among (X+1) bit digital control signals ($D_{CNT}[X:0]$), is input to the inverter 151a1. The inverter 151a1 logically inverts the input 1-bit digital signal, and outputs the inverted 1-bit digital signal to a gate terminal of the transistor 151a4.

The transistor 151a2 includes a source terminal which is connected to a power supply, a gate terminal which is connected to a source terminal of the transistor 151a3 and a drain terminal of the transistor 151a4, and a drain terminal which is connected to a current output terminal. Each sub-current source 151a outputs a constant-current signal via the current output terminal during a period in which the transistor 151a2 is in the ON state. This constant-current signal is determined by a device size of the transistor 151a2 and a voltage ($V_{BIAS1}$) of a bias terminal.

The transistor 151a3 includes a drain terminal which is connected to the bias terminal, a gate terminal which is connected to the input terminal of the inverter 151a1, and a source terminal which is connected to the gate terminal of the transistor 151a2. The transistor 151a3 functions as a switch. Specifically, during a period in which the 1-bit digital signal, which is input to the inverter 151a1, is at "L" level, the transistor 151a3 establishes a short-circuit between the bias terminal and the gate terminal of the transistor 151a2. As a result, the transistor 151a2 enters the ON state. On the other hand, during a period in which the 1-bit digital signal, which is input to the inverter 151a1, is at "H" level, the transistor 151a3 establishes an open-circuit between the bias terminal and the gate terminal of the transistor 151a2. As a result, the transistor 151a2 enters the OFF state.

The transistor 151a4 includes a source terminal which is connected to the power supply, the gate terminal which is connected to an output terminal of the inverter 151a1, and the drain terminal which is connected to the gate terminal of the transistor 151a2. The transistor 151a4 functions as a switch. Specifically, during a period in which the 1-bit digital signal, which is output from the inverter 151a1, is at "L" level, the transistor 151a4 establishes a short-circuit between the power supply and the gate terminal of the transistor 151a2. As a result, the transistor 151a2 enters the OFF state. On the other hand, during a period in which the 1-bit digital signal, which is output from the inverter 151a1, is at "H" level, the transistor 151a4 establishes an open-circuit between the power supply and the gate terminal of the transistor 151a2. As a result, the transistor 151a2 enters the ON state.

<1-7> Operation of Voltage-Time Converter

Next, referring to FIG. 4, the operation of the voltage-time converter 100 is described. As described above, the basic operation of the voltage-time converter 100 is divided into the sample phase, reset phase and convert phase. Various switch control signals, time signal, and voltages at various nodes vary as illustrated in FIG. 4.

<1-7-1> Operation (Sample Phase) of Voltage-Time Converter

In the sample phase, the first switch control control signal ($\phi$1) is at "H" level, the second switch control signal ($\phi$2) is at "L" level, and the third switch control signal ($\phi$3) is at "L" level. In addition, in the sample phase, the detector 140 does not operate. Accordingly, in the sample phase, the voltage-time converter 100 of FIG. 2 operates as illustrated in FIG. 5.

Specifically, in the sample phase, the voltage-time converter 100 of FIG. 2 charges the sampling capacitor 112 and sampling capacitor 122 with a differential voltage between the input voltage ($V_{IN}$) and intermediate voltage ($V_{CM}$) of the voltage-time converter 100.

<1-7-2> Operation (Reset Phase) of Voltage-Time Converter

Figure 6:
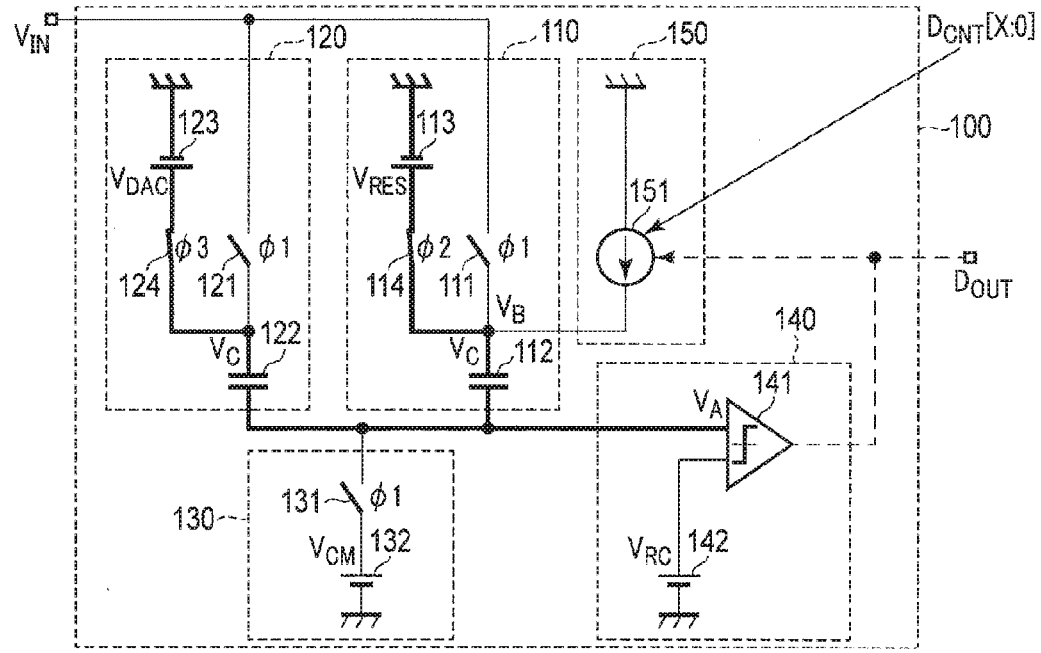
FIG. 6 is a circuit diagram for describing the operation of the voltage-time converter of FIG. 2 in a reset phase.

In the reset phase, the first switch control control signal ($\phi$1) is at "L" level, the second switch control signal ($\phi$2) is at "H" level, and the third switch control signal ($\phi$3) is at "H" level. In addition, in the reset phase, the detector 140 does not operate. Accordingly, in the reset phase, the voltage-time converter 100 of FIG. 2 operates as illustrated in FIG. 6.

Specifically, in the reset phase, the voltage-time converter 100 of FIG. 2 resets the voltage of the first terminal of the sampling capacitor 112 by using the reset voltage ($V_{RES}$), and fixes the voltage of the first terminal of the sampling capacitor 122 by using the adjustment voltage ($V_{DAC}$).

Here, a voltage ($V_{A\_RES}$) in the reset phase at a node (hereinafter referred to as "node A"), which is equal in potential to the input terminal of the detector 140, can be derived as below.

At the time of the end of the sample phase, each of the sampling capacitor 112 and sampling capacitor 122 stores a charge of $C_1 \cdot (V_{IN} - V_{CM})$. According to the law of charge conservation, the total charge ($2C_1 \cdot (V_{IN} - V_{CM})$), which was stored in the sampling capacitor 112 and sampling capacitor 122 in the sample phase, does not change in the reset phase. Therefore, the following equation (1) is established.

$$V_{A\_RES} = -V_{IN} + V_{CM} + \frac{V_{RES} + V_{DAC}}{2} \quad \text{(equation(1))}$$

Here, if the input voltage ($V_{IN}$) is composed of a DC component and an AC component, the AC component is $V_{INAC}$, and the intermediate voltage ($V_{CM}$) is designed to coincide with the DC component, the following equation (2) is established.

$$V_{A\_RES} = -V_{INAC} + \frac{V_{RES} + V_{DAC}}{2} \quad \text{(equation (2))}$$

<1-7-3> Operation (Convert Phase) of Voltage-Time Converter

Figure 7:
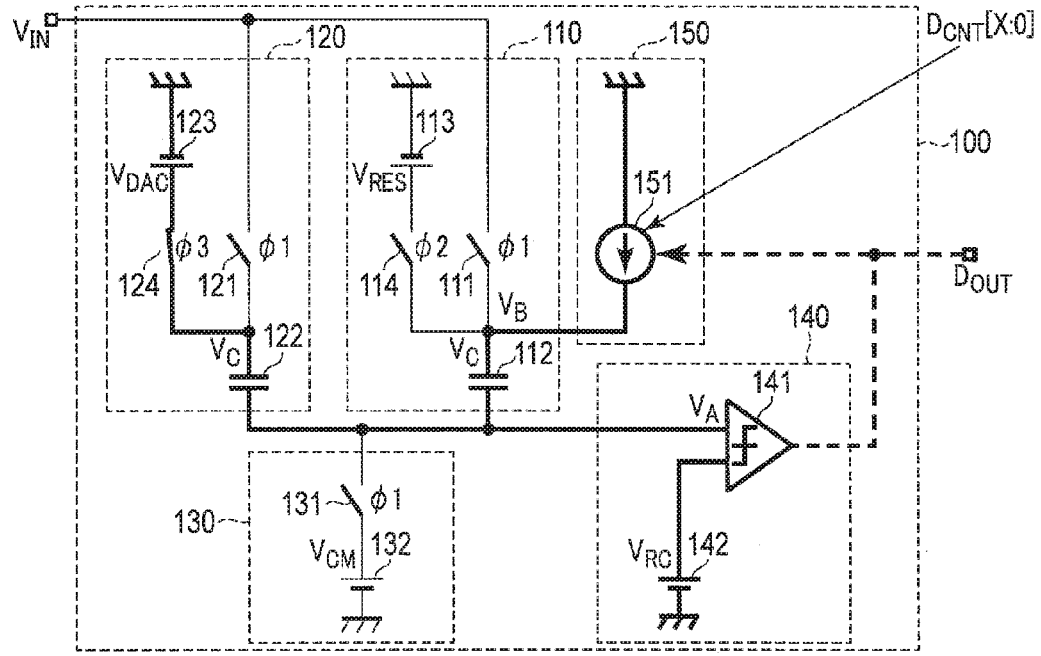
FIG. 7 is a circuit diagram for describing the operation of the voltage-time converter of FIG. 2 in a convert phase.

In the convert phase, the first switch control control signal ($\phi$1) is at "L" level, the second switch control signal ($\phi$2) is at "L" level, and the third switch control signal ($\phi$3) is at "H" level. In addition, in the convert phase, the detector 140 operates. Accordingly, in the convert phase, the voltage-time converter 100 of FIG. 2 operates as illustrated in FIG. 7.

Specifically, in the convert phase, the voltage-time converter 100 of FIG. 2 disconnects the first terminal of the sampling capacitor 112 from the voltage source 113. The comparator 141 detects whether the voltage ($V_A$) of the node A is less than the comparative reference voltage ($V_{RC}$), and outputs a time signal ($D_{OUT}$) of "H" level over the first period in which $V_A < V_{RC}$ is established. Incidentally, it is assumed that the above-described reset voltage ($V_{RES}$), voltage ($V_{DAC}$) and comparative reference voltage ($V_{RC}$) are set such that $V_A < V_{RC}$ is established at the time of the beginning of the convert phase. The variable current source 151 supplies a variable current signal to the first terminal of the sampling capacitor 112 over the first period. This variable current signal flows through a current path which is formed by the sampling capacitor 112, sampling capacitor 122, switch 124 and voltage source 123. Since this variable current signal charges the sampling capacitor 112 and sampling capacitor 122, the voltage ($V_A$) of the node A rises with time, and agrees with the comparative reference voltage ($V_{RC}$) at last (at the end of the first period).

As viewed from the variable current source 151, the sampling capacitor 112 and sampling capacitor 122 are connected in series, and a voltage ($V_B$) of a node (hereinafter referred to as "node B"), which is equal in potential to the first terminal of the sampling capacitor 112, is equal to $V_{RAS}$ at the time of the beginning of the convert phase. Accordingly, a voltage ($V_{B\_CNV}$) of the node B at the end of the first period can be calculated by using the following equation (3).

$$V_{B\_CNV} = \frac{1}{C_1/2} \int_0^{T_{DOUT}} I_{151} \, dt + V_{RES} \quad \text{(equation (3))}$$
$$= 2 \cdot \frac{I_{151} \cdot T_{DOUT}}{C_1} + V_{RES}$$

In equation (3), $T_{DOUT}$ indicates a time length of the first period, and $I_{151}$ indicates a current amount which the variable current signal supplied by the variable current source 151 has. As described above, $I_{51}$ is controlled by the digital control signal ($D_{CNT}[X:0]$).

Then, if consideration is given to the voltage division by the sampling capacitor 112 and sampling capacitor 122, an increase amount of the voltage ($V_A$) of the node A in the first period agrees with half the increase amount of the voltage of the node B in the first period. In addition, the voltage ($V_A$) of the node A at the time of the beginning of the convert phase is equal to $V_{A\_RES}$. Accordingly, the voltage ($V_{A\_CNV}$) of the node A at the end of the first period can be calculated by using the following equation (4).

$$V_{A\_CNV} = \frac{I_{151} \cdot T_{DOUT}}{C_1} + V_{A\_RES} \quad \text{(equation (4))}$$

As described above, at the end of the first period, the voltage ($V_A$) of the node A agrees with the comparative reference voltage ($V_{RC}$). Therefore, the time length ($T_{DOUT}$) of the first period can be derived by using the following equation (5) and equation (6).

$$V_{A\_CNV} = V_{RC} \quad \text{(equation (5))}$$

$$\frac{I_{151} \cdot T_{DOUT}}{C_1} + V_{A\_RES} = V_{RC}$$

$$T_{DOUT} = \frac{C_1}{I_{151}} \left( V_{INAC} + V_{RC} - \frac{R_{RES} + V_{DAC}}{2} \right) \quad \text{(equation (6))}$$

As is understood from equation (6), the time length ($T_{DOUT}$) of the first period is proportional to the sum of an AC component ($V_{INAC}$) and a DC component of the input voltage ($V_{IN}$). Specifically, time signal ($D_{OUT}$) is indicative of the time length ($T_{DOUT}$) which depends on the input voltage ($V_{IN}$).

The factor of proportionality can be set at a desired value by properly designing $I_{151}$ and $C_1$. The DC component can be set at a desired value by properly designing $V_{RC}$, $V_{RES}$ and $V_{DAC}$.

<1-8> Other Configuration Example of Voltage-Time Converter

In addition, as illustrated in FIG. 8, an N-number (N is an arbitrary integer of 2 or more) of second sampling circuits 120-1, ..., 120-N, which are identical or similar to the second sampling circuit 120 of FIG. 2, may be provided. Thereby, the factor of proportionality and the DC component can be set more finely. Incidentally, adjustment voltages ($V_{DAC}$), which are generated by voltage sources included in the respective second sampling circuits 120-1, ..., 120-N, may be different.

<1-9> Concrete Configuration of Time-Voltage Converter

Referring to FIG. 9, a concrete configuration of the time-voltage converter is described. In the present embodiment, for example, a time-voltage converter 200 illustrated in FIG. 9 may be adopted. The time-voltage converter 200 of FIG. 9 includes a signal generator 210, a third sampling circuit 220, and a bottom plate sampler 230.

The signal generator 210 includes a variable current source 211.

The variable current source 211 includes a first terminal, a second terminal, a first control terminal, and a second control terminal. The first terminal of the variable current source 211 is grounded. The second terminal of the variable current source 211 is connected to an output terminal of the signal generator 210. The first control terminal and second control terminal of the variable current source 211 are connected to a control terminal of the signal generator 210.

A time signal ($D_{IN}$) from the voltage-time converter 100 is input to the variable current source 211 via the first control terminal. A digital control signal ($D_{CNT}$[X:0]) from the correction circuit 300 is input to the variable current source 211 via the second control terminal. If the time signal ($D_{IN}$) is at "H" level, the variable current source 211 generates a variable current signal, based on the digital control signal ($D_{CNT}$[X:0]), and supplies this variable current signal to the third sampling circuit 220 via the second terminal. On the other hand, if the time signal ($D_{IN}$) is at "L" level, the variable current source 211 stops the operation.

The third sampling circuit 220 includes a voltage source 221, a voltage source 222, a sampling capacitor 223, a switch 224, and a switch 225.

The voltage source 221 includes a positive terminal and a negative terminal. The positive terminal of the voltage source 221 is connected to the switch 225. The negative terminal of the voltage source 221 is grounded. The voltage source 221 generates an intermediate voltage ($V_{CM}$).

The voltage source 222 includes a positive terminal and a negative terminal. The positive terminal of the voltage source 222 is connected to the switch 224. The negative terminal of the voltage source 222 is grounded. The voltage source 222 generates a reset voltage ($V_{RES}$).

The sampling capacitor 223 includes a first terminal and a second terminal. The first terminal of the sampling capacitor 223 is commonly connected to the first terminal of the third sampling circuit 220, the switch 224 and the switch 225. The second terminal of the sampling capacitor 223 is connected to a second terminal of the third sampling circuit 220. The capacitance of the sampling capacitor 223 is set to be capacitance=$C_2$. Typically, $C_2$ is designed to agree with a constant multiple of $C_1$. This constant may be, for instance, an inverse number of the gain (amplification factor) of the amplifier circuit of FIG. 1. For example, if the gain is doubled, $C_2$ may be set to be, approximately, $C_2 = C_1 / 2$.

The switch 224 is inserted between the first terminal of the sampling capacitor 223 and the positive terminal of the voltage source 222. In accordance with the second switch control signal ($\phi 2$), the switch 224 establishes a short-circuit or an open-circuit between the first terminal of the sampling capacitor 223 and the positive terminal of the voltage source 222. Specifically, in the reset phase of the time-voltage converter 200, the switch 224 establishes a short-circuit between the first terminal of the sampling capacitor 223 and the positive terminal of the voltage source 222. On the other hand, in the sample phase and hold phase of the time-voltage converter 200, the switch 224 establishes an open-circuit between the first terminal of the sampling capacitor 223 and the positive terminal of the voltage source 222.

The switch 225 is inserted between the first terminal of the sampling capacitor 223 and the positive terminal of the voltage source 221. In accordance with the first switch control signal ($\phi 1$), the switch 225 establishes a short-circuit or an open-circuit between the first terminal of the sampling capacitor 223 and the positive terminal of the voltage source 221. Specifically, in the hold phase of the time-voltage converter 200, the switch 225 establishes a short-circuit between the first terminal of the sampling capacitor 223 and the positive terminal of the voltage source 221. On the other hand, in the reset phase and sample phase of the time-voltage converter 200, the switch 225 establishes an open-circuit between the first terminal of the sampling capacitor 223 and the positive terminal of the voltage source 221.

The bottom plate sampler 230 includes a voltage source 231 and a switch 232.

The voltage source 231 includes a positive terminal and a negative terminal. The positive terminal of the voltage source 231 is connected to the switch 232. The negative terminal of the voltage source 231 is grounded. The voltage source 231 generates an intermediate voltage ($V_{CM}$).

The switch 232 is inserted between a first terminal of the bottom plate sampler 230 and the positive terminal of the voltage source 231. In accordance with the third switch control signal (φ3), the switch 232 establishes a short-circuit or an open-circuit between the first terminal of the bottom plate sampler 230 and the positive terminal of the voltage source 231. Specifically, in the reset phase and sample phase of the time-voltage converter 200, the switch 232 establishes a short-circuit between the first terminal of the bottom plate sampler 230 and the positive terminal of the voltage source 231. On the other hand, in the hold phase of the time-voltage converter 200, the switch 232 establishes an open-circuit between the first terminal of the bottom plate sampler 230 and the positive terminal of the voltage source 231.

<1-10> Operation of Time-Voltage Converter

Next, referring to FIG. 10, the operation of the time-voltage converter 200 is described. As described above, the basic operation of the time-voltage converter 200 is divided into the reset phase, sample phase, and hold phase. Various switch control signals and time signal vary as illustrated in FIG. 10.

<1-10-1> Operation (Reset Phase) of Time-Voltage Converter

In the reset phase, the first switch control control signal (φ1) is at "L" level, the second switch control signal (φ2) is at "H" level, and the third switch control signal (φ3) is at "H" level. The reset phase of the time-voltage converter 200 is made to temporally coincide with the reset phase of the voltage-time converter 100.

Specifically, in the reset phase, the time-voltage converter 200 of FIG. 9 resets the voltage of the first terminal of the sampling capacitor 223 by using the reset voltage ($V_{RES}$), and fixes the voltage of the second terminal of the sampling capacitor 223 by using the intermediate voltage ($V_{CM}$).

<1-10-2> Operation (Sample Phase) of Time-Voltage Converter

In the sample phase, the first switch control control signal (φ1) is at "L" level, the second switch control signal (φ2) is at "L" level, and the third switch control signal (φ3) is at "H" level. The sample phase of the time-voltage converter 200 is made to temporally coincide with the convert phase of the voltage-time converter 100.

Specifically, in the sample phase, the time-voltage converter 200 of FIG. 9 disconnects the first terminal of the sampling capacitor 223 from the voltage source 222. Since the time signal ($D_{IN}$) of "H" level is input to the variable current source 211 over the above-described first period, the variable current source 211 supplies a variable current signal to the third sampling capacitor 220 over the first period. This variable current signal flows through a current path which is formed by the sampling capacitor 223, switch 232 and voltage source 231. Since this variable current signal charges the sampling capacitor 223, the voltage of the first terminal of the sampling capacitor 223 rises with time.

A voltage ($V_C$) of a node (hereinafter referred to as "node C"), which is equal in potential to the first terminal of the sampling capacitor 223, is equal to $V_{RES}$ at the time of the beginning of the sample phase. Accordingly, a voltage ($V_{C\_SMP}$) of the node C at the end of the first period can be calculated by using the following equation (7).

$$V_{C\_SMP} = \frac{1}{C_2} \int_0^{T_{DIN}} I_{211} \, dt + V_{RES} \qquad \text{(equation (7))}$$
$$= \frac{I_{211} T_{DIN}}{C_2} + V_{RES}$$

In equation (7), $T_{DIN}$ indicates a time length of the first period, and $I_{211}$ indicates a current amount which the variable current signal supplied by the variable current source 211 has. $I_{211}$ is controlled by the digital control signal ($D_{CNT}[X:0]$).

<1-10-3> Operation (Hold Phase) of Time-Voltage Converter

In the hold phase, the first switch control control signal (φ1) is at "H" level, the second switch control signal (φ2) is at "L" level, and the third switch control signal (φ3) is at "L" level. The hold phase of the time-voltage converter 200 is made to temporally coincide with the sample phase of the voltage-time converter 100.

In the hold phase, the time-voltage converter 200 of FIG. 9 fixes the voltage of the first terminal of the sampling capacitor 223 by using the intermediate voltage ($V_{CM}$), and disconnects the second terminal of the sampling capacitor 223 from the voltage source 231.

At the time of the end of the sample phase, the sampling capacitor 223 stores a charge of $C_2 \cdot (V_{C\_SMP} - V_{CM})$.

According to the law of charge conservation, the total charge, which was stored in the sampling capacitor 223 in the sample phase, does not change in the hold phase. Therefore, as regards the output voltage ($V_{OUT}$) of the time-voltage converter 200, the following equation (8) is established.

$$V_{OUT} = \frac{I_{211} T_{DIN}}{C_2} - V_{RES} + 2V_{CM} \qquad \text{(equation (8))}$$

Assuming that $T_{DIN}$ in equation (8) agrees with $T_{DOUT}$ in equation (6), equation (8) can be rewritten to the following equation (9).

$$V_{OUT} = \qquad \text{(equation (9))}$$
$$\frac{I_{211}}{C_2} \cdot \frac{C_1}{I_{151}} \left( V_{INAC} + V_{RC} - \frac{V_{RES} + V_{DAC}}{2} \right) - V_{RES} + 2V_{CM}$$

In addition, assuming that $C_2 = C_1/2$, and that $I_{211} = I_{151}$, equation (9) can be rewritten to the following equation (10).

$$V_{OUT} = -2V_{INAC} - 2V_{RC} + V_{DAC} + 2V_{CM} \qquad \text{(equation (10))}$$

Furthermore, assuming that $V_{CM} = V_{RC}$, equation (10) can be rewritten to the following equation (11).

$$V_{OUT} = -2V_{INAC} + V_{DAC} \qquad \text{(equation (11))}$$

As is understood from equation (11), the output voltage ($V_{OUT}$) is equal to a voltage which is obtained by multiplying the AC component ($V_{INAC}$) of the input voltage ($V_{IN}$) by −2, and adding the adjustment voltage ($V_{DAC}$) to the resultant.

Further, if it is assumed that $V_{DAC}$ is equal to the DC component of the input voltage ($V_{IN}$), the AC component ($V_{INAC}$) can be amplified with multiplication by −2, with the DC component of the input voltage ($V_{IN}$) being fixed, according to the above-described numerical value examples.

<1-11> Concrete Configuration of Correction Circuit

Referring to FIG. 11, the correction circuit of the amplifier circuit according to the embodiment is described. In the present embodiment, a correction circuit 300 illustrated in FIG. 11, for instance, may be adopted. The correction circuit 300 of FIG. 11 includes a phase comparator 310, a counter 320, and a control circuit 330.

The phase comparator 310 includes, for example, a flip-flop (D-FF) 311. A time signal ($D_{IN}$) is input to a first input terminal of the flip-flop (D-FF) 311, and a reference signal (PHI_REF) is inverted and input to a second input terminal of the flip-flop (D-FF) 311. Then, the phase comparator 310 outputs a signal (CMPOUT) as a comparison result between the time signal ($D_{IN}$) and reference signal (PHI_REF). Specifically, if the time signal ($D_{IN}$) is at "L" level at a time point when the reference signal (PHI_REF) has fallen, the phase comparator 310 outputs a signal (CMPOUT) of "L" level. If the time signal ($D_{IN}$) is at "H" level at a time point when the reference signal (PHI_REF) has fallen, the phase comparator 310 outputs a signal (CMPOUT) of "H" level.

The counter 320 is an up/down counter which counts up or counts down a digital control signal ($D_{CNT}$[X:0]) during an enable period. The signal (CMPOUT) is input to a first input terminal of the counter 320, and the reference signal (PHI_REF) is input to a second input terminal of the counter 320. The counter 320 operates, for example, in accordance with a timing of the reference signal (PHI_REF). Based on the signal (CMPOUT), the counter 320 executes count-up or count-down for an initial value n (natural number), and outputs a digital control signal ($D_{CNT}$[X:0]) of (X+1) bits.

The control circuit 330 controls the operation of the correction circuit 300. For example, based on an external input signal, the control circuit 330 controls the operations of the phase comparator 310 and counter 320.

Incidentally, in the example illustrated in FIG. 11, although the correction circuit 300 includes the control circuit 330, the correction circuit 300 is not necessarily limited to this example. The correction circuit 300 may be controlled by, for example, a control circuit on the outside of the amplifier circuit 1.

In addition, although the phase comparator 310 includes, for example, the flip-flop (D-FF) 311, the phase comparator 310 is not necessarily limited to this example. The phase comparator 310 may have any configuration if the phase comparator 310 can compare the time signal ($D_{IN}$) and reference signal (PHI_REF).

Besides, although the counter 320 operates, for example, in accordance with the timing of the reference signal (PHI_REF), and executes count-up or count-down in synchronism with the rising of the reference signal (PHI_REF), the counter 320 may operate in accordance with the timing of some other signal, and the count-up or count-down operation may be synchronized with the rising edge or the falling edge of this signal.

<1-11> Correction Amount Adjustment Operation of Correction Circuit

Next, a description is given of a correction amount adjustment operation of the correction circuit of the amplifier circuit according to the present embodiment. The correction circuit 300 executes a correction amount adjustment operation during a period of calibration which is executed prior to a normal operation. The correction amount adjustment operation is an operation for executing such adjustment that the current amounts in the signal generators 150 and 210 may become proper amounts. The calibration is executed, for example, by a controller (not shown). The calibration is an operation which is executed prior to the above-described normal operation. The timing of execution of the calibration is arbitrarily changeable, and the calibration may be executed immediately after an apparatus including the amplifier circuit 1 is powered on, or may be executed at regular time intervals.

Referring to FIG. 12, a description is given of a concrete example of the correction amount adjustment operation of the correction circuit 300 during the calibration period.

[Time Instant T1]

When a controller (not shown) executes calibration, the controller turns on the switch 10 of the amplifier circuit 1, and supplies a voltage ($V_{CAL}$), instead of voltage ($V_{IN}$), to the voltage-time converter 100. Thereby, a time signal ($D_{IN}$) based on the voltage ($V_{CAL}$) is generated in the voltage-time converter 100. For example, the voltage ($V_{CAL}$) is a voltage corresponding to a maximum voltage among voltages which are assumed to be input to the amplifier circuit 1. When the controller (not shown) executes the calibration, the controller sets the correction circuit 300 in the operative state via the control circuit 330.

At time instant T1, the time signal (Dn) that is input to the phase comparator 310, and the reference signal (PHI_REF) rise from "L (Low)" level to "H (High)" level. The counter 320 supplies a digital control signal ($D_{CNT}$[X:0]) of an initial value "n" to at least the signal generator 150. Thereby, the voltage-time converter 100 generates a time signal ($D_{IN}$), based on the digital control signal ($D_{CNT}$[X:0]) of the initial value "n".

[Time Instant T2]

At time instant T2 after the passing of a time length ($T_{DIN}$) from time instant T1, the time signal ($D_{IN}$) falls to "L" level from "H" level. This time length ($T_{DIN}$) is a length which depends on the digital control signal ($D_{CNT}$[X:0])="n".

[Time instant T3]

At time instant T3 after the passing of a time length ($T_{AMP}$) ($T_{AMP}$>$T_{DIN}$) from time instant T1, the reference signal (PHI_REF) falls to "L" level from "H" level.

The phase comparator 310 determines whether the time signal ($D_{IN}$) is at "H" level or "L" level at a time point when the reference signal (PHI_REF) fell to "L" level from "H" level. If the phase comparator 310 determines that the time signal ($D_{IN}$) is at "L" level at a time point when the reference signal (PHI_REF) fell to "L" level from "H" level, the phase comparator outputs a signal (CMPOUT) of "L" level.

[Time instant T4]

At time instant T4, the time signal (Dm) and reference signal (PHI_REF) rise from "L" level to "H" level.

If the reference signal (PHI_REF) rises from "L" level to "H" level, the counter 320 executes count-up or count-down, based on the signal (CMPOUT). In this example, the signal (CMPOUT) is at "L" level at a time point when the reference signal (PHI_REF) rises from "L" level to "H" level. Thus, the counter 320 counts down the digital control signal ($D_{CNT}$[X:0]) from initial value "n" to "n−1". The counter 320 supplies the digital control signal ($D_{CNT}$[X:0]) of "n−1" to at least the signal generator 150. Thereby, the voltage-time converter 100 generates a time signal (DIN), based on the digital control signal ($D_{CNT}$[X:0]) of "n−1".

[Time instant T5]

At time instant T5 after the passing of a time length ($T_{DIN}$) from time instant T4, the time signal ($D_{IN}$) falls to "L" level from "H" level. This time length ($T_{DIN}$) is a length which depends on the digital signal ($D_{CNT}$[X:0])="n−1"

[Time instant T6]

At time instant T6 after the passing of a time length ($T_{AMP}$) ($T_{AMP}$>$T_{DIN}$) from time instant T4, the reference signal (PHI_REF) falls to "L" level from "H" level.

The phase comparator 310 determines that the time signal ($D_{IN}$) is at "L" level at a time point when the reference signal (PHI_REF) fell to "L" level from "H" level. Thus, the phase comparator 310 outputs a signal (CMPOUT) of "L" level.

[Time instant T7]

At time instant T7, the time signal (DM) and reference signal (PHI_REF) rise from "L" level to "H" level.

In this example, the signal (CMPOUT) is at "L" level at a time point when the reference signal (PHI_REF) rises from "L" level to "H" level. Thus, the counter 320 counts down the digital control signal ($D_{CNT}$[X:0]) from "n−1" to "n−2". The counter 320 supplies the digital control signal ($D_{CNT}$[X:0]) of "n−2" to at least the signal generator 150.

Thereby, the voltage-time converter 100 generates a time signal ($D_{IN}$), based on the digital control signal ($D_{CNT}$[X:0]) of "n−2".

[Time instant T8]

At time instant T8 after the passing of a time length ($T_{AMP}$) ($T_{AMP}$<$T_{DIN}$) from time instant T7, the reference signal (PHI_REF) falls to "L" level from "H" level.

If the phase comparator 310 determines that the time signal ($D_{IN}$) is at "H" level at a time point when the reference signal (PHI_REF) fell to "L" level from "H" level, the phase comparator 310 outputs a signal (CMPOUT) of "H" level.

[Time instant T9]

At time instant T9 after the passing of a time length ($T_{DIN}$) from time instant T7, the time signal ($D_{IN}$) falls to "L (Low)" level from "H" level. This time length ($T_{DIN}$) is a length which depends on the digital signal ($D_{CNT}$[X:0])="n−2".

[Time instant T10]

At time instant T10, the time signal ($D_{IN}$) and reference signal (PHI_REF) rise from "L" level to "H" level.

In this example, the signal (CMPOUT) is at "H" level at a time point when the reference signal (PHI_REF) rises from "L" level to "H" level. Thus, the counter 320 counts up the digital control signal ($D_{CNT}$[X:0]) from "n−2" to "n−1". The counter 320 supplies the digital control signal ($D_{CNT}$[X:0]) of "n−1" to at least the signal generator 150. Thereby, the voltage-time converter 100 generates a time signal ($D_{IN}$), based on the digital control signal ($D_{CNT}$[X:0]) of "n−1".

[Time instant T11]

At time instant T11 after the passing of a time length ($T_{DIN}$) from time instant T10, the time signal ($D_{IN}$) falls to "L" level from "H" level.

[Time instant T12]

At time instant T12 after the passing of a time length ($T_{AMP}$) ($T_{AMP}$>$T_{DIN}$) from time instant T10, the reference signal (PHI_REF) falls to "L" level from "H" level.

Since the phase comparator 310 determines that the time signal ($D_{IN}$) is at "L" level at a time point when the reference signal (PHI_REF) fell to "L" level from "H" level, the phase comparator 310 outputs a signal (CMPOUT) of "L" level.

The correction circuit 300 repeats the above-described operation until the control circuit 330 completes the operations of the phase comparator 310 and counter 320.

In this manner, the comparison between the time length length ($T_{DIN}$) and time length ($T_{AMP}$) is repeated, and thereby the digital control signal ($D_{CNT}$[X:0]) is gradually brought to a desirable digital control signal ($D_{CNT}$[X:0]).

For example, if a time period, within which the digital control signal ($D_{CNT}$[X:0]) is assumed to be brought to a desirable digital control signal ($D_{CNT}$[X:0]), has passed, the control circuit 330 completes the operation of deriving the digital control signal ($D_{CNT}$[X:0]) by the correction circuit 300. Thus, the correction amount adjustment operation of the correction circuit 300 is completed. Then, using the derived digital control signal ($D_{CNT}$[X:0]), the amplifier circuit 1 executes the above-described normal operation.

<1-13> Advantageous Effects

As has been described above, the amplifier circuit according to the first embodiment resets the input-side sampling capacitor and output-side sampling capacitor at the same time by using the same reset voltage, and then amplifies the input voltage. Therefore, according to this amplifier circuit, the mismatch in voltage between the input and output at the time of the start of the amplification operation can be reduced. In addition, this amplifier circuit does not include the switch which establishes a short-circuit between the input and output. Hence, there occurs neither degradation in isolation between the input and output, nor nonlinear distortion of the switch. Therefore, according to this amplifier circuit, the power consumption can be reduced, and the precision can be enhanced.

In the amplifier circuit 1 according to this embodiment, it is desirable that the amplification operation be completed within the time (e.g. clock) which is allowed for the amplification operation. Thus, in the amplifier circuit 1 of this embodiment, the voltage ($V_{CAL}$), which is assumed to be the maximum voltage that is input to the amplifier circuit 1, is converted to the time signal, and the signal generator 150 and signal generator 210 are controlled such that this time signal falls within the time that is allowed for the amplification operation. In the meantime, $I_{151}$ varies in accordance with the digital control signal ($D_{CNT}$[X:0]). As a result, the time length ($T_{DIN}$) varies in accordance with the digital control signal ($D_{CNT}$[X:0]). For example, if the digital control signal ($D_{CNT}$[X:0]) increases, $I_{151}$ increases and the time length ($T_{DIN}$) decreases. In addition, for example, if the digital control signal ($D_{CNT}$[X:0]) decreases, $I_{151}$ decreases and the time length ($T_{DIN}$) increases.

For example, if the time length ($T_{DIN}$) is less than the time length ($T_{AMP}$), this means that the input signal is sufficiently amplified by the amplifier circuit 1. However, in such a case, it is possible that $I_{151}$ is unnecessarily large, and power is consumed more than necessary. In this case, the counter 320 decreases the digital control signal ($D_{CNT}$[X:0]).

In addition, for example, if the time length ($T_{DIN}$) is greater than the time length ($T_{AMP}$), this means that the amplifier circuit 1 fails to sufficiently amplify the input signal. In such a case, it is necessary to increase $I_{151}$. In this case, the counter 320 increases the digital control signal ($D_{CNT}$[X:0]).

In this manner, the comparison between the time signal ($D_{IN}$) and time length ($T_{AMP}$) is repeated, and thereby the digital control signal ($D_{CNT}$[X:0]) is gradually brought to a desirable digital control signal ($D_{CNT}$[X:0]).

Thereby, the amplifier circuit 1 executes the normal operation by using the desirable digital control signal ($D_{CNT}$[X:0]) that was derived. It thus becomes possible to suppress unnecessary power consumption, while ensuring the amplification capability of the amplifier circuit 1.

Incidentally, it should suffice if the derived digital control signal ($D_{CNT}$[X:0]) is input to at least the signal generator 150. However, when it is desirable that the amplification factor of the signal generator 150 be equal to the amplification factor of the signal generator 210, the derived digital control signal ($D_{CNT}$[X:0]) may be input to both the signal generator 150 and the signal generator 210. In addition, any method may be adopted as the method in which the control circuit 330 determines the timing for terminating the operation of deriving the digital control signal ($D_{CNT}$[X:0]) by the correction circuit 300.

Furthermore, according to the above-described embodiment, the voltage-time converter 100 generates such a time signal ($D_{IN}$) that the time length ($T_{DIN}$) becomes small if the digital control signal ($D_{CNT}$[X:0]) becomes large, and generates such a time signal ($D_{IN}$) that the time length ($T_{DIN}$) becomes large if the digital control signal ($D_{CNT}$[X:0]) becomes small. However, the voltage-time converter 100 is not limited to this configuration. For example, the voltage-time converter 100 may generate such a time signal ($D_{IN}$) that the time length ($T_{DIN}$) becomes large if the digital control signal ($D_{CNT}$[X:0]) becomes large, and may generate such a time signal (DE) that the time length ($T_{DIN}$) becomes small if the digital control signal ($D_{CNT}$[X:0]) becomes small. In the case where in which the voltage-time converter 100 executes such an operation, the counter 320 executes an operation reverse to the above-described operation. This also applies to other embodiments, etc., which will be described below.

<1-14> Modification

<1-14-1> Configuration Example of Modification

As described above, the amplifier circuit 1 can be altered to a differential configuration. When the amplifier circuit 1 is altered to a differential configuration, the amplifier circuit 1 has a configuration as illustrated in FIG. 13. As illustrated in FIG. 13, an amplifier circuit 1 of a differential configuration according to a modification of the first embodiment includes a switch 10, a switch 20, a voltage-time converter 100p, a voltage-time converter 100n, a time-voltage converter 200p, a time-voltage converter 200n, a correction circuit 300a, and an OR circuit 400. The amplifier circuit 1 obtains an output voltage ($V_{OUTP}$) by amplifying an input voltage ($V_{INP}$). In addition, the amplifier circuit 1 obtains an output voltage ($V_{OUTN}$) by amplifying an input voltage ($V_{INN}$). The OR circuit 400 outputs a signal of "H" level when at least either a time signal ($D_{INP}$) of the voltage-time converter 100p or a time signal ($D_{INN}$) of the voltage-time converter 100n is at "H" level.

<1-14-2> Operation Example of Modification

Next, referring to FIG. 14, a brief description is given of an operation example of the amplifier circuit 1 of the differential configuration according to the modification of the first embodiment. In the case of the amplifier circuit 1 of the differential configuration, the correction circuit 300a operates such that the greater of a time length ($T_{DINP}$) indicated by the time signal ($D_{INP}$) and a time length ($T_{DINN}$) indicated by the time signal ($D_{INN}$) (the greater time length is referred to as "$T_{DIN}$") may fall within the time length ($T_{AMP}$). Thereby, the same advantageous effects as in the first embodiment can be obtained with the amplifier circuit 1 of the differential configuration according to the modification of the first embodiment.

Second Embodiment

In a second embodiment, a description is given of an amplifier circuit which executes, during the normal amplification operation, a correction amount adjustment operation on the background. Incidentally, the basic structure and basic operation of the amplifier circuit according to the second embodiment are the same as those of the amplifier circuit of the above-described first embodiment. Thus, a description is omitted of matters already described in the first embodiment and matters which can easily be guessed from the first embodiment.

<2> Configuration

Figure 15:
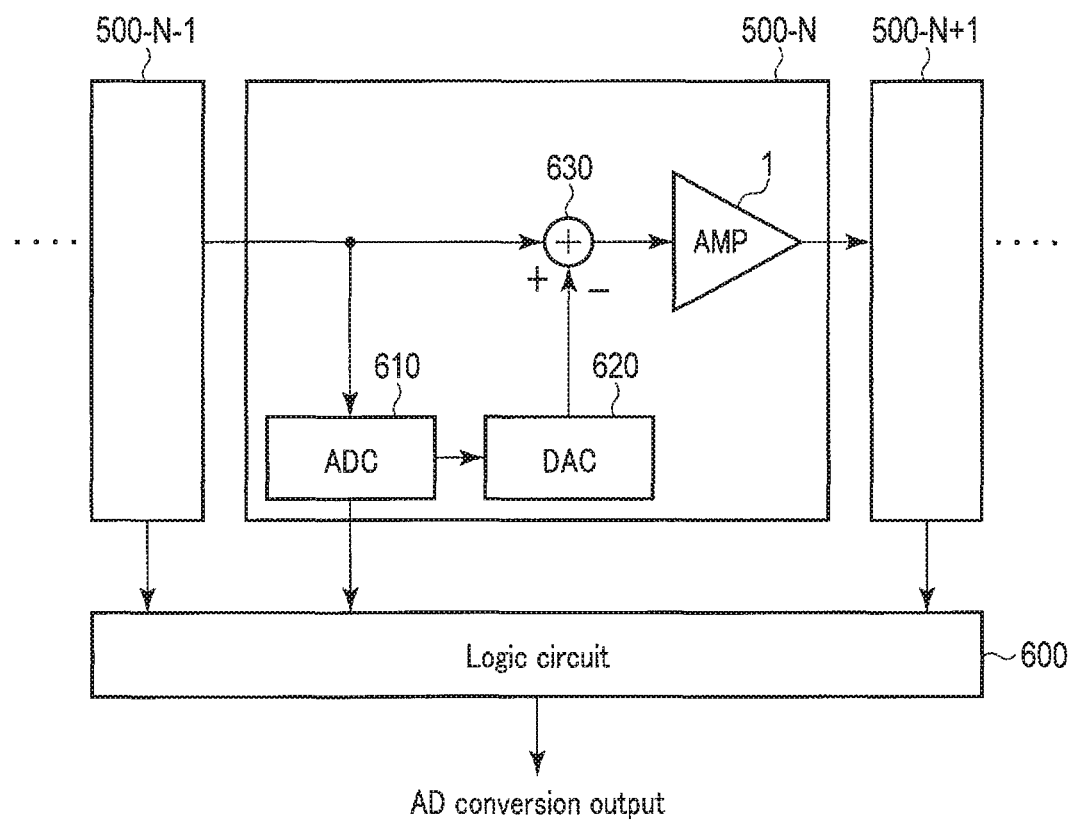
FIG. 15 is a block diagram illustrating a pipeline type analog-digital converter according to a second embodiment.

The amplifier circuit, which corrects the current value of the current source during the normal amplification operation, is applicable to a pipeline type analog-digital converter as illustrated in FIG. 15. The pipeline type analog-digital converter executes AD conversion in a plurality of pipeline stages in a divisional manner, and successively executes AD conversion in units of predetermined bits in each stage from a most significant bit (MSB) to a least significant bit (LSB).

<2-1> Outline of Pipeline Type Analog-Digital Converter

As illustrated in FIG. 15, the pipeline type analog-digital converter according to the second embodiment includes a plurality of pipeline stages 500, and a logic circuit 600. Each pipeline stage 500 executes, for example, AD conversion of two bits (four values) on the input signal. FIG. 15 illustrates, for the purpose of simplicity, three pipeline stages 500-N−1 to 500-N+1 (N: natural number). However, the number of pipeline stages 500 may be four or more, or may be two. The logic circuit 600 generates an AD conversion output, based on AD conversion outputs of the respective pipeline stages 500.

As illustrated in FIG. 15, the pipeline stage 500 includes an analog-digital converter (ADC) 610, a digital-analog converter (DAC) 620, a subtracter 630, and an amplifier circuit 1. The analog-digital converter 610 A/D converts the input signal, and outputs the converted signal to the logic circuit 600 and digital-analog converter 620. The digital-analog converter 620 D/A converts the digital signal which was received from the analog-digital converter 610. The subtracter 630 subtracts the D/A converted value from the input signal. The amplifier circuit 1 amplifies the signal subtracted by the subtracter 630. Incidentally, when the analog-digital converter 610 executes conversion of 1 bit, the amplifier circuit 1 amplifies the intermediate signal to double the magnitude thereof. In addition, when the analog-digital converter 610 executes conversion of 2 bits, the amplifier circuit 1 amplifies the intermediate signal to four times the magnitude thereof.

The analog input signal is A/D converted by the pipeline stage 500 that is the first stage, and the MSB is determined. The determined MSB is once restored to an analog signal by the D/A converter, and the difference from the analog input signal is calculated by the subtracter 630. An analog signal obtained here becomes a quantization error which occurred in the A/D conversion of the MSB. This quantization error is A/D converted once again by the next pipeline stage. Subsequently, the same operation is repeated in succession until the last pipeline stage, and all bits up to the LSB are determined. In the pipeline type analog-digital converter, a new analog signal is sampled in every clock, regardless of the number of clocks for conversion, and a digital conversion value is output.

Although not illustrated in FIG. 15, the pipeline type analog-digital converter may include a sample-and-hold circuit. An analog input signal ($V_{in}$), which was sampled & held by the sample-and-hold circuit (not shown), is input to the analog-digital converter 610 and subtracter 630. The output of the amplifier circuit 1 is input to the subsequent pipeline stage 500.

In general, the digital-analog 620, subtracter 630 and amplifier circuit 1 are integrally formed as an amplifying digital-analog converter, and has a sample-and-hold function of holding an amplified residual signal, and this amplifying digital-analog converter functions as a sample-and-hold circuit for the next pipeline stage.

<2-2> Operation of Pipeline Type Analog-Digital Converter

For example, it is assumed that the number of bits of the A/D conversion in the pipeline stage 500 is two bits (four values). The analog-digital converter 610 divides the voltage range of the analog input signal into four sub-ranges (see part (a) of FIG. 16). By the analog-digital converter 610 including three comparators, it is determined which of the sub-ranges the analog input signal (see part (b) of FIG. 16) belongs to. The digital-analog converter 620 generates a voltage indicative of the sub-range, and the subtracter 630 subtracts this voltage from the analog input signal, and generates an intermediate signal (see part (c) of FIG. 16). Thereby, the intermediate signal falls in a range between a voltage ($V_{REF1}$) and a voltage ($V_{REF2}$) ($V_{REF1}$<$V_{REF2}$). Then, the amplifier circuit 1 amplifies the intermediate signal to four times the magnitude thereof (see part (d) of FIG. 16). Thereby, the range of the output voltage of the amplifier circuit 1 becomes equal to the range of the input voltage. The amplifier circuit 1 generates the output signal, while adjusting the amplification capability, based on the intermediate signal.

In the meantime, if the voltage ($V_{REF1}$) is input, the voltage-time converter 100 generates such a time signal ($D_{IN}$) that the time length ($T_{DIN}$) becomes minimum. Thus, voltage ($V_{REF1}$) becomes such a voltage that the time length ($T_{DIN}$) becomes minimum. In addition, if the voltage ($V_{REF2}$) is input, the voltage-time converter 100 generates such a time signal ($D_{IN}$) that the time length ($T_{DIN}$) becomes maximum. Thus, voltage ($V_{REF2}$) becomes such a voltage that the time length ($T_{DIN}$) becomes maximum.

Additionally, in the present embodiment, although the number of bits of A/D conversion in the pipeline stage 500 is set at 2 bits (four values), the number of bits is not limited to this example. Furthermore, such a configuration may be adopted that A/D conversion is executed with different bit numbers between the respective pipeline stages 500. Besides, the number of pipeline stages 500 may be variously changeable.

<2-3> Configuration of Correction Circuit

Next, referring to FIG. 17, a description is given of a correction circuit 300 of the amplifier circuit 1 according to the second embodiment. In the present embodiment, for example, a correction circuit 300 illustrated in FIG. 17 may be adopted. The correction circuit 300 of FIG. 17 includes a phase comparator 310, a counter 320, and a control circuit 340.

The control circuit 340 controls the operation of the correction circuit 300. For example, based on a signal (CMPOUT) which is output from the phase comparator 310, the control circuit 340 controls the operation of the counter 320.

<2-4> Operation of Correction Circuit

Next, a description is given of an adjustment operation of the correction circuit of the amplifier circuit according to the present embodiment. In the amplifier circuit according to the first embodiment, the adjustment operation of the digital control signal ($D_{CNT}$) was executed during the period of calibration which is executed prior to the normal operation. However, in the second embodiment, the correction circuit 300 executes the adjustment operation during the normal operation period. The normal operation period is a period in which the pipeline analog-digital converter A/D converts the analog signal.

When the amplitude of the input signal has a certain degree of magnitude, a maximum voltage ($V_{REF2}$) of a full scale of the intermediate signal is output. By monitoring the intermediate signal for a predetermined period ($T_{CHECK}$), the control circuit 340 extracts the maximum voltage ($V_{REF2}$) of the intermediate signal. For example, if the intermediate signal becomes the maximum voltage ($V_{R2}$) shown in part (c) of FIG. 16, the voltage-time converter 100 outputs a time signal ($D_{IN}$) including the maximum time length ($T_{DIN}$). Then, the phase comparator 310 compares the time length ($T_{DIN}$) included in the time signal ($D_{IN}$) and the time length ($T_{AMP}$) included in the reference signal (PHI_REF) (as regards the operation in the phase comparator 310, refer to the description that was given with reference to FIG. 12). If the time length ($T_{DIN}$) is at "H" level at a time point when the reference signal (PHI_REF) has fallen, the phase comparator 310 sets a signal (CMPOUT) at "H" level. If the time length ($T_{DIN}$) is at "L" level at a time point when the reference signal (PHI_REF) has fallen, the phase comparator 310 sets the signal (CMPOUT) at "L" level.

The control circuit 340 starts a monitoring operation, when the signal (CMPOUT) of the phase comparator 310 is at "H" level, or when the control circuit 340 outputs a down signal. Upon starting the monitoring operation, the control circuit 340 disables the count operation of the counter 320 until a monitoring period ($T_{CHECK}$) ends, and monitors the output of the phase comparator 310. Then, if the signal (CMPOUT) does not change to "H" level during the monitoring period ($T_{CHECK}$), the control circuit 340 outputs, after the passing of the monitoring period ($T_{CHECK}$), a down signal for causing the counter 320 to execute count-down, and an enable signal which enables the counter 320 to operate.

Referring to FIG. 18, a description is given of an example of the correction amount adjustment operation of the correction circuit of the amplifier circuit according to the present embodiment.

[Time instant T1]

If the control circuit 340 determines that the signal (CMPOUT) has changed to "H" level, the control circuit 340 sends an enable signal and an up signal to the counter 320. The counter 320 is configured to operate if the counter 320 has received the enable signal.

[Time instant T2]

Upon receiving the enable signal and up signal, the counter 320 counts up the digital control signal ($D_{CNT}$). At the same time, the control circuit 340 starts the monitoring operation. The control circuit 340 determines whether the signal (CMPOUT) rises to "H" or not, during the monitoring period. In addition, even if the signal (CMPOUT) fell to "L" level during the monitoring period, the control circuit 340 does not cause the counter 320 to execute count-down.

[Time instant T3]

If the monitoring period ($T_{CHECK}$) has passed, the control signal 340 can send an enable signal and a down signal to the counter 320.

At a time instant T3 after the passing of the monitoring period ($T_{CHECK}$) from time instant T2, if the signal (CMPOUT) is at "L" level, the control circuit 340 sends an enable signal and a down signal to the counter 320.

[Time instant T4]

Upon receiving the enable signal and down signal, the counter 320 counts down the digital control signal ($D_{CNT}$). At the same time, the control circuit 340 starts the monitoring operation.

[Time instant T5]

If the control circuit 340 determines that the signal (CMPOUT) has risen to "H" during the monitoring period, the control circuit 340 sends an enable signal and an up signal to the counter 320.

[Time instant T6]

Upon receiving the enable signal and up signal, the counter 320 counts up the digital control signal ($D_{CNT}$). At the same time, the control circuit 340 starts the monitoring operation.

[Time instant T7]

If the monitoring period ($T_{CHECK}$) has passed, the control signal 340 can send an enable signal and a down signal to the counter 320.

As described above, the control circuit 340 causes the counter 320 to count up or count down, where necessary.

<2-5> Advantageous Effects

According to the above-described embodiment, the correction circuit 300 executes the correction amount adjustment operation by using the maximum voltage that is obtained while the pipeline type analog-digital converter is executing the normal operation.

In conventional pipeline analog-digital converters, the power consumption of the amplifier occupies a large ratio, and there has been a demand for realization of a pipeline type analog-digital converter with low power consumption.

Thus, by using the above-described correction circuit 300 and executing the correction amount adjustment operation while the normal operation is being executed, it becomes possible to realize a pipeline type analog-digital converter with low power consumption and proper amplification characteristics.

<2-6> Modification

<2-6-1> Modification 1 of Adjustment Operation of Correction Circuit

In the meantime, when the amplifier circuit 1 has a differential configuration as in the above-described modification of the first embodiment, the voltage-time converter 100$n$, for instance, may output such a time signal ($D_{IN}$) that the time length ($T_{DIN}$) becomes maximum, based on the voltage ($V_{REF1}$). Then, as described above, the voltage-time converter 100$p$ may output such a time signal ($D_{IN}$) that the time length ($T_{DIN}$) becomes maximum, based on the voltage ($V_{REF2}$). In this manner, when the amplifier circuit 1 has the differential configuration, the correction amount adjustment operation can also be executed based on the voltage ($V_{REF1}$) and voltage ($V_{REF2}$). In this case, as described in connection with the modification of the first embodiment, the correction amount adjustment operation according to the second embodiment can be executed based on the greater time length ($T_{DIN}$) between the time signals ($D_{IN}$) which are output by the voltage-time converter 100$n$ and the voltage-time converter 100$p$.

<2-6-2> Modification 2 of Adjustment Operation of Correction Circuit

Incidentally, when the amplitude of the input signal, which is input to the pipeline stage 500, is small, the amplitude of the intermediate signal becomes deficient. Consequently, the time length ($T_{DIN}$) does not become maximum. Thus, if the amplifier circuit 1 is operated in the state in which the maximum time length ($T_{DIN}$) is not obtained, the relationship of $T_{AMP} > T_{DIN}$, (maximum value) fails to be satisfied.

It is thus thought that the A/D conversion result of the subsequent pipeline stage 500 is fed back to the control circuit 340. Since "output value of amplifier circuit 1=A/D conversion result of subsequent pipeline stage 500", the amplitude of the output value of the amplifier circuit 1 can be determined based on the amplitude of the A/D conversion result of the subsequent pipeline stage 500. When the amplitude of the A/D conversion result of the subsequent pipeline stage 500 is not sufficiently large, the control circuit 340 disables the counter 320. By disabling the counter 320, it is possible to prevent the counter 320 from counting down the value of the digital control signal ($D_{CNT}$). Thereby, a decrease in output value of the amplifier circuit 1 can be suppressed.

<2-6-3> Modification 3 of Adjustment Operation of Correction Circuit

In a case of a receiver including a pipeline type analog-digital converter, an AGC (Automatic gain control) circuit or the like, which is provided on the outside of the pipeline type analog-digital converter, executes amplitude adjustment such that the input to the pipeline type analog-digital converter becomes sufficient. Specifically, it should suffice if the current control of the amplifier circuit 1 of the pipeline type analog-digital converter is started after the completion of the control by the AGC circuit or the like.

<2-6-4> Modification 4 of Adjustment Operation of Correction Circuit

In the case where priority is placed on amplification characteristics rather than power consumption, for example, if the signal (CMPOUT) is at "H" level, the control circuit 340 may cause the counter 320 to execute count-up in any case. To be more specific, the control circuit 340 causes the counter 320 to execute count-up for information of "H" of the phase comparator 310, but does not cause the counter 320 to execute count-up for information of "L", and sets the counter 320 in the disabled state.

Only when electric current is deficient, is control executed for increasing the current. Although the value of the current does not become an optical value, an operation fault due to deficiency of current can be avoided.

Third Embodiment

<3-1> Configuration of Amplifier Circuit

In the above-described first embodiment, the time-voltage converter converts the time signal, which was generated by the voltage-time converter, to an output signal. In the third embodiment, for example, as illustrated in FIG. 19, a time amplifier, which obtains an amplified time signal by amplifying the time length indicated by the time signal, is inserted between the voltage-time converter and the time-voltage converter. Then, in the present embodiment, the time-voltage converter converts the amplified time signal to an output signal. Incidentally, by the insertion of the time amplifier, the operation timing of the time-voltage converter delays by a fixed time (e.g. half cycle), compared to the first embodiment. The above-described correction circuit 300 is also applicable to the amplifier circuit according to the present embodiment.

An amplified time signal (Do) is input to the correction circuit 300 from a time amplifier 700. The correction circuit 300 generates a digital control signal ($D_{CNT}[X:0]$), based on the amplified time signal ($D_{OUT}$) and a reference signal (PHI_REF) (e.g. clock signal) which is delivered from the outside of the amplifier circuit 1.

<3-2> Configuration of Time Amplifier

Figure 20:
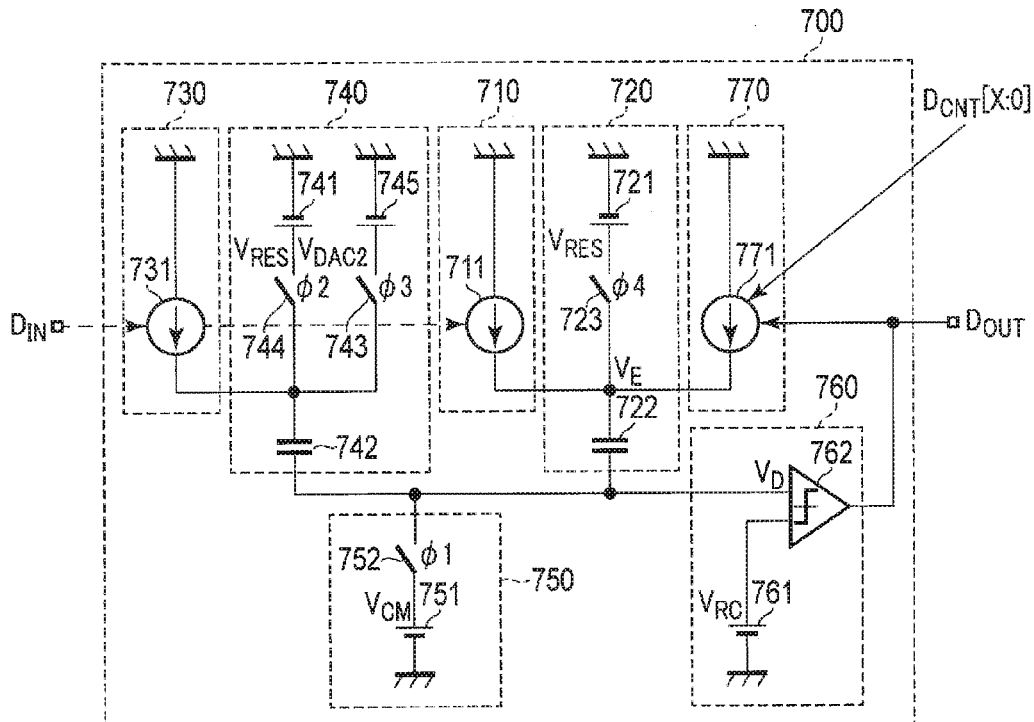
FIG. 20 is a circuit diagram illustrating a time amplifier which is included in the amplifier circuit according to the third embodiment.

In the present embodiment, for example, a time amplifier 700 illustrated in FIG. 20 may be adopted. A time signal ($D_{IN}$) is input to the time amplifier 700 from the voltage-time converter 100. In addition, the digital control signal ($D_{CNT}[X:0]$) is input to the time amplifier 700 from the correction circuit 300. The time amplifier 700 obtains an amplified time signal ($D_{CNT}$) by amplifying the time length indicated by the time signal ($D_{IN}$). For example, the time amplifier 700 obtains the amplified time signal ($D_{OUT}$) as a rectangular-wave signal, by amplifying the pulse width which the time signal ($D_{IN}$) as a rectangular-wave signal has. The time amplifier 700 outputs the amplified time signal ($D_{OUT}$) to the time-voltage converter 200.

The time amplifier 700 illustrated in FIG. 20 includes a signal generator 710, a fourth sampling circuit 720, a signal generator 730, a fifth sampling circuit 740, a bottom plate sampler 750, a detector 760, and a signal generator 770.

The signal generator 710 includes a control terminal and an output terminal. The control terminal of the signal generator 710 is commonly connected to an input terminal of the time amplifier 700 and a control terminal of the signal generator 730. The output terminal of the signal generator 710 is connected to a first terminal of the fourth sampling circuit 720.

A time signal is input to the signal generator 710 from the voltage-time converter 100. The signal generator 710 generates an electric signal, based on the time signal, and supplies the electric signal to the fourth sampling circuit 720.

Specifically, the signal generator 710 of FIG. 20 includes a current source 711.

The current source 711 includes a first terminal, a second terminal and a control terminal. The first terminal of the current source 711 is grounded. The second terminal of the current source 711 is connected to the output terminal of the signal generator 710. The control terminal of the current source 711 is connected to the control terminal of the signal generator 710.

A time signal ($D_{IN}$) from the voltage-time converter 100 is input to the current source 711 via the control terminal. If the time signal ($D_{IN}$) is at "H" level, the current source 711 generates a constant-current signal, and supplies the constant-current signal to the fourth sampling circuit 720 via the second terminal. On the other hand, if the time signal ($D_{IN}$) is at "L" level, the current source 711 stops the operation.

The fourth sampling circuit 720 includes a first terminal, a second terminal and a third terminal, and includes a sampling capacitor 722 (to be described later). The first terminal of the fourth sampling circuit 720 is connected to the output terminal of the signal generator 710, and the electric signal is input to the first terminal of the fourth sampling circuit 720 over the above-described first period. The second terminal of the fourth sampling circuit 720 is commonly connected to a second terminal of the fifth sampling circuit 740, a first terminal of the bottom plate sampler 750, and an input terminal of the detector 760. The third terminal of the fourth sampling circuit 720 is connected to an output terminal of the signal generator 770.

In a pre-sample reset phase (RESET_SMP) which is to be described later, the fourth sampling circuit 720 resets the voltage of a first terminal of the sampling capacitor 722 by using a reset voltage ($V_{RES}$). On the other hand, the voltage of a second terminal of the sampling capacitor 722 is fixed by the bottom plate sampler 750.

A sample phase (SAMPLE), which follows the pre-sample reset phase, is made to temporally coincide with the convert phase of the voltage-time converter 100. Thus, in at least a part of the sample phase, an electric signal (e.g. constant-current signal) is supplied to the first terminal of the sampling capacitor 722 from the signal generator 710. Specifically, the signal generator 710 continues to generate the electric signal over the above-described first period. Then, the sampling capacitor 722 continues to be charged or discharged over the first period. Incidentally, the voltage of the second terminal of the sampling capacitor 722 is continuously fixed by the bottom plate sampler 750. Therefore, the voltage of the first terminal of the sampling capacitor 722 continues to rise or fall.

In a pre-amplify reset phase (RESET_AMP) which follows the sample phase, the fourth sampling circuit 720 resets the voltage of the first terminal of the sampling capacitor 722 by using the reset voltage ($V_{RES}$). Meanwhile, as will be described later, the bottom plate sampler 750 does not provide a current path. As a result, the voltage of the second terminal of the fourth sampling circuit 720 is determined by the voltage of the first terminal of the sampling capacitor 722 at the time of the end of the sample phase.

In at least a part of an amplify phase (AMPLIFY) following the pre-amplify reset phase, an electric signal (e.g. a variable current signal) is supplied from the signal generator 770 to the first terminal of the sampling capacitor 722. As will be described later, the signal generator 770 continues to generate the electric signal over a second period in which the voltage of the input terminal of the detector 760 satisfies a second condition. Then, the sampling capacitor 722 continues to be charged or discharged over the second period. As a result, the voltage of the input terminal of the detector 760 continues to rise or fall, and, at last, satisfies the second condition.

Specifically, the fourth sampling circuit 720 of FIG. 20 includes a voltage source 721, the sampling capacitor 722, and a switch 723.

The voltage source 721 includes a positive terminal and a negative terminal. The positive terminal of the voltage source 721 is connected to the switch 723. The negative terminal of the voltage source 721 is grounded. The voltage source 721 generates a reset voltage ($V_{RES}$).

The sampling capacitor 722 includes the first terminal and second terminal. The first terminal of the sampling capacitor 722 is commonly connected to the first terminal and third of the fourth sampling circuit 720 and to the switch 723. The second terminal of the sampling capacitor 722 is connected to the second terminal of the fourth sampling circuit 720. The capacitance of the sampling capacitor 722 is set to be capacitance=$C_3$.

The switch 723 is inserted between the first terminal of the sampling capacitor 722 and the positive terminal of the voltage source 721. In accordance with a fourth switch control signal (94), the switch 723 establishes a short-circuit or an open-circuit between the first terminal of the sampling capacitor 722 and the positive terminal of the voltage source 721. Specifically, in the pre-sample reset phase and pre-amplify reset phase of the time amplifier 700, the switch 723 establishes a short-circuit between the first terminal of the sampling capacitor 722 and the positive terminal of the voltage source 721. On the other hand, in the sample phase and amplify phase of the time amplifier 700, the switch 723 establishes an open-circuit between the first terminal of the sampling capacitor 722 and the positive terminal of the voltage source 721.

The signal generator 730 includes a control terminal and an output terminal. The control terminal of the signal generator 730 is connected to the input terminal of the time amplifier 700. The output terminal of the signal generator 730 is connected to a first terminal of the fifth sampling circuit 740.

A time signal is input to the signal generator 730 from the voltage-time converter 100. The signal generator 730 generates an electric signal, based on the time signal, and supplies the electric signal to the fifth sampling circuit 740. The signal generator 730 may be identical or similar to the signal generator 710.

Specifically, the signal generator 730 of FIG. 20 includes a current source 731.

The current source 731 includes a first terminal, a second terminal and a control terminal. The first terminal of the current source 731 is grounded. The second terminal of the current source 731 is connected to the output terminal of the signal generator 730. The control terminal of the current source 731 is connected to the control terminal of the signal generator 730.

A time signal ($D_{IN}$) from the voltage-time converter 100 is input to the current source 731 via the control terminal. If the time signal ($D_{IN}$) is at "H" level, the current source 731 generates a constant-current signal, and supplies the constant-current signal to the fifth sampling circuit 740 via the second terminal. On the other hand, if the time signal ($D_{IN}$) is at "L" level, the current source 731 stops the operation.

The fifth sampling circuit 740 includes the first terminal and second terminal, and includes a sampling capacitor 742 (to be described later). The first terminal of the fifth sampling circuit 740 is connected to the output terminal of the signal generator 730, and the electric signal is input to the first terminal of the fifth sampling circuit 740 over the above-described first period. The second terminal of the fifth sampling circuit 740 is connected to the second terminal of the fourth sampling circuit 720, the first terminal of the bottom plate sampler 750, and the input terminal of the detector 760.

In the pre-sample reset phase, the fifth sampling circuit 740 resets the voltage of a first terminal of the sampling capacitor 742 by using a reset voltage ($V_{RES}$). On the other hand, the voltage of a second terminal of the sampling capacitor 742 is fixed by the bottom plate sampler 750.

As described above, the sample phase is made to temporally coincide with the convert phase of the voltage-time converter 100. Thus, in at least a part of the sample phase, an electric signal (e.g. constant-current signal) is supplied to the first terminal of the sampling capacitor 742 from the signal generator 730. Specifically, the signal generator 730 continues to generate the electric signal over the above-described first period. Then, the sampling capacitor 742 continues to be charged or discharged over the first period. Incidentally, in the sample phase, the voltage of the second terminal of the sampling capacitor 742 is continuously fixed by the bottom plate sampler 750. Therefore, the voltage of the first terminal of the sampling capacitor 742 continues to rise or fall.

In the pre-amplify reset phase, the fifth sampling circuit 740 resets the voltage of the first terminal of the sampling capacitor 742 by using an adjustment voltage ($V_{DAC2}$). Meanwhile, the bottom plate sampler 750 does not provide a current path. As a result, the voltage of the second terminal of the fifth sampling circuit 740 is determined by the voltage of the first terminal of the sampling capacitor 742 at the time of the end of the sample phase.

Also in the amplify phase following the pre-amplify reset phase, the fifth sampling circuit 740 continues to fix the voltage of the first terminal of the sampling capacitor 742. As a result, the fifth sampling circuit 740 provides a current path (a current path formed by the sampling capacitor 742, switch 743, switch 744 and voltage source 745) for the electric signal generated by the signal generator 770. By this electric signal flowing through this current path, the sampling capacitor 742 is charged or discharged. Therefore, the voltage of the second terminal of the sampling capacitor 742 continues to rise or fall. As a result, the voltage of the input terminal of the detector 760 satisfies the second condition.

Specifically, the fifth sampling circuit 740 of FIG. 20 includes a voltage source 741, the sampling capacitor 742, switch 743, switch 744 and voltage source 745.

The voltage source 741 includes a positive terminal and a negative terminal. The positive terminal of the voltage source 741 is connected to the switch 744. The negative terminal of the voltage source 741 is grounded. The voltage source 741 generates a reset voltage ($V_{RES}$).

The sampling capacitor 742 includes the first terminal and second terminal. The first terminal of the sampling capacitor 742 is commonly connected to the first terminal of the fifth sampling circuit 740, the switch 743 and switch 744. The second terminal of the sampling capacitor 742 is connected to the second terminal of the fifth sampling circuit 740. The capacitance of the sampling capacitor 742 is set to be capacitance=$C_3$.

The switch 743 is inserted between the first terminal of the sampling capacitor 742 and the positive terminal of the voltage source 745. In accordance with a third switch control signal ($\phi 3$), the switch 743 establishes a short-circuit or an open-circuit between the first terminal of the sampling capacitor 742 and the positive terminal of the voltage source 745. Specifically, in the pre-amplify reset phase and amplify phase of the time amplifier 700, the switch 743 establishes a short-circuit between the first terminal of the sampling capacitor 742 and the positive terminal of the voltage source 745. On the other hand, in the pre-sample reset phase and sample phase of the time amplifier 700, the switch 743 establishes an open-circuit between the first terminal of the sampling capacitor 742 and the positive terminal of the voltage source 745.

The switch 744 is inserted between the first terminal of the sampling capacitor 742 and the positive terminal of the voltage source 741. In accordance with a second switch control signal ($\phi 2$), the switch 744 establishes a short-circuit or an open-circuit between the first terminal of the sampling capacitor 742 and the positive terminal of the voltage source 741. Specifically, in the pre-amplify reset phase of the time amplifier 700, the switch 744 establishes a short-circuit between the first terminal of the sampling capacitor 742 and the positive terminal of the voltage source 741. On the other hand, in the sample phase, pre-amplify reset phase and amplify phase of the time amplifier 700, the switch 744 establishes an open-circuit between the first terminal of the sampling capacitor 742 and the positive terminal of the voltage source 741.

The voltage source 745 includes a positive terminal and a negative terminal. The positive terminal of the voltage source 745 is connected to the switch 743. The negative terminal of the voltage source 745 is grounded. The voltage source 745 generates an adjustment voltage ($V_{DAC2}$). This voltage ($V_{DAC2}$) may be controlled by a control signal not shown in FIG. 20.

The bottom plate sampler 750 includes the first terminal. The first terminal of the bottom plate sampler 750 is connected to the second terminal of the fourth sampling circuit 720 and the second terminal of the fifth sampling circuit 740.

In the pre-sample reset phase and sample phase, the bottom plate sampler 750 fixes the voltage of the second terminal of the sampling capacitor 722 and the voltage of the second terminal of the sampling capacitor 742 by using an intermediate voltage ($V_{CM}$).

In the pre-amplify reset phase and amplify phase, the bottom plate sampler 750 does not fix the voltage of the second terminal of the sampling capacitor 722 or the voltage of the second terminal of the sampling capacitor 742. Further, ideally, the bottom plate sampler 750 does not provide a current path in the pre-amplify reset phase and amplify phase.

Specifically, the bottom plate sampler 750 of FIG. 20 includes a voltage source 751 and a switch 752.

The voltage source 751 includes a positive terminal and a negative terminal. The positive terminal of the voltage source 751 is connected to the switch 752. The negative terminal of the voltage source 751 is grounded. The voltage source 751 generates an intermediate voltage ($V_{CM}$).

The switch 752 is inserted between the first terminal of the bottom plate sampler 750 and the positive terminal of the voltage source 751. In accordance with a first switch control signal ($\phi 1$), the switch 752 establishes a short-circuit or an open-circuit between the first terminal of the bottom plate sampler 750 and the positive terminal of the voltage source 751. Specifically, in the pre-sample reset phase and sample phase, the switch 752 establishes a short-circuit between the first terminal of the bottom plate sampler 750 and the positive terminal of the voltage source 751. On the other hand, in the pre-amplify reset phase and amplify phase, the switch 752 establishes an open-circuit between the first terminal of the bottom plate sampler 750 and the positive terminal of the voltage source 751.

The detector 760 includes the input terminal and an output terminal. The input terminal of the detector 760 is commonly connected to the second terminal of the fourth sampling circuit 720, the second terminal of the fifth sampling circuit 740 and the first terminal of the bottom plate sampler 750. The output terminal of the detector 760 is connected to a first control terminal of the signal generator 770 and an input terminal of the time-voltage converter 200.

In the amplify phase, the detector 760 detects whether the voltage of its input terminal satisfies the second condition. Then, the detector 760 generates an amplified time signal indicative of a length of a second period in which the voltage of its input terminal satisfies the second condition. Incidentally, the second period is longer than the first period. For example, the time signal may be a digital signal which is at "H" level over the second period, and is at "L" level over the other period. The detector 760 outputs the amplified time signal to the signal generator 770 and the time-voltage converter 200. Incidentally, the detector 760 stops the operation in the pre-sample reset phase, sample phase and pre-amplify reset phase.

Specifically, the detector 760 of FIG. 20 includes a voltage source 761 and a comparator 762.

The voltage source 761 includes a positive terminal and a negative terminal. The positive terminal of the voltage source 761 is connected to a second input terminal of the comparator 762. The negative terminal of the voltage source 761 is grounded. The voltage source 761 generates a comparative reference voltage ($V_{RC}$).

The comparator 762 includes a first input terminal, the second input terminal and an output terminal. The input terminal of the comparator 762 is connected to the input terminal of the detector 760. The second input terminal of the comparator 762 is connected to the positive terminal of the voltage source 761. The output terminal of the comparator 762 is connected to an output terminal of the detector 760.

In the amplify phase, the comparator 762 compares a voltage of the first input terminal with a voltage of the second input terminal. The comparator 762 stops the operation in the pre-sample reset phase, sample phase and reset phase.

Specifically, if the voltage of the first input terminal is lower than the voltage of the second input terminal, the comparator 762 outputs an amplified time signal ($D_{OUT}$) of "H" level (power supply voltage). On the other hand, if the voltage of the first input terminal is equal to or higher than the voltage of the second input terminal, the comparator 762 outputs an amplified time signal ($D_{OUT}$) of "L" level (ground voltage). Therefore, according to the example of FIG. 20, the above-described second condition corresponds to that the voltage of the input terminal of the detector 760 is lower than the comparative reference voltage ($V_{RC}$).

The signal generator 770 includes the first control terminal, a second control terminal, and the output terminal. The first control terminal of the signal generator 770 is connected to the output terminal of the detector 760. The second control terminal of the signal generator 770 is connected to the output terminal of the correction circuit 300. The output terminal of the signal generator 770 is connected to the third terminal of the fourth sampling circuit 720.

The time signal ($D_{OUT}$) is input to the signal generator 770 from the detector 760 via the first control terminal. The digital control signal ($D_{CNT}[X:0]$) is input to the signal generator 770 from the correction circuit 300 via the second control terminal. The signal generator 770 generates an electric signal, based on the time signal and digital control signal ($D_{CNT}[X:0]$), and supplies this electric signal to the fourth sampling circuit 720.

Specifically, the signal generator 770 of FIG. 20 includes a variable current source 771. The variable current source 771 includes a first terminal, a second terminal, a first control terminal, and a second control terminal. The first terminal of the variable current source 771 is grounded. The second terminal of the variable current source 771 is connected to an output terminal of the signal generator 770. The first control terminal of the variable current source 771 is connected to the first control terminal of the signal generator 770. The second control terminal of the variable current source 771 is connected to the second control terminal of the signal generator 770.

If the time signal ($D_{OUT}$), which the variable current source 771 receives via the first control terminal, is at "H" level, the variable current source 771 generates a variable current signal, based on the digital control signal ($D_{CNT}[X:0]$) which the variable current source 771 receives via the second control terminal. Then, the variable current source 771 supplies this variable current signal to the fourth sampling circuit 720 via the second terminal. On the other hand, if the time signal ($D_{OUT}$), which the variable current source 771 receives via the first control terminal, is at "L" level, the variable current source 771 stops the operation.

<3-3> Operation of Time Amplifier

Figure 21:
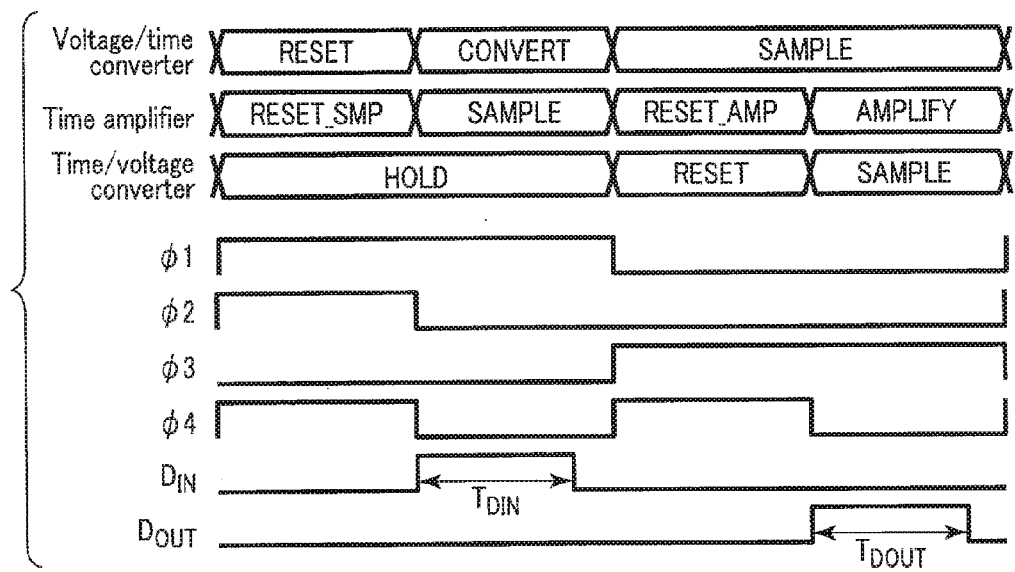
FIG. 21 is a timing chart illustrating variations of various signals in respective phases into which the operation of the time amplifier of FIG. 20 is divided.

As described above, the operation of the time amplifier 700 is divided into the pre-sample reset phase, sample phase, pre-amplify reset phase and amplify phase. Various switch control signals, time signal and amplified time signal vary as illustrated in FIG. 21.

<3-3-1> Operation (Pre-Sample Reset Phase) of Time Amplifier

In the pre-sample reset phase, the first switch control control signal (φ1) is at "H" level, the second switch control signal (φ2) is at "H" level, the third switch control signal (φ3) is at "L" level, and the fourth switch control signal (φ4) is at "H" level. The pre-sample reset phase of the time amplifier 700 is made to temporally coincide with the reset phase of the voltage-time converter 100.

Specifically, in the pre-sample reset phase, the time amplifier 700 of FIG. 20 resets the voltage of the first terminal of the sampling capacitor 722 and the voltage of the first terminal of the sampling capacitor 742 by using the reset voltage ($V_{RES}$), and fixes the voltage of the second terminal of the sampling capacitor 722 and the voltage of the second terminal of the sampling capacitor 742 by using the intermediate voltage ($V_{CM}$).

<3-3-2> Operation (Sample Phase) of Time Amplifier

In the sample phase, the first switch control control signal (φ1) is at "H" level, the second switch control signal (φ2) is at "L" level, the third switch control signal (φ3) is at "L" level, and the fourth switch control signal (φ4) is at "L" level. The sample phase of the time amplifier 700 is made to temporally coincide with the convert phase of the voltage-time converter 100.

Specifically, in the sample phase, the time amplifier 700 of FIG. 20 disconnects the first terminal of the sampling capacitor 722 from the voltage source 721, and disconnects the first terminal of the sampling capacitor 742 from the voltage source 741. Since the time signal ($D_{IN}$) of "H" level is input to each of the current source 711 and current source 731 over the above-described first period, the current source 711 and current source 731 supply constant-current signals to the fourth sampling circuit 720 and fifth sampling circuit 740 over the first period. The constant-current signal, which was generated by the current source 711, flows through a current path which is formed by the sampling capacitor 722, switch 752 and voltage source 751. The constant-current signal, which was generated by the current source 731, flows through a current path which is formed by the sampling capacitor 742, switch 752 and voltage source 751. Since these constant-current signals charge the sampling capacitor 722 and sampling capacitor 742, respectively, the voltage of the first terminal of the sampling capacitor 722 and the voltage of the first terminal of the sampling capacitor 742 rise with time.

A voltage ($V_E$) of a node (hereinafter referred to as "node E"), which is equal in potential to the first terminal of the sampling capacitor 722, is equal to $V_{RES}$ at the time of the beginning of the sample phase. Accordingly, a voltage ($V_{E\_SMP}$) of the node E at the end of the first period can be calculated by using the following equation (12).

$$V_{E\_SMP} = \frac{1}{C_3} \int_0^{T_{DIN}} I_{711} \, dt + V_{RES} \qquad \text{(equation (12))}$$
$$= \frac{I_{711} T_{DIN}}{C_3} + V_{RES}$$

In equation (12), $I_{711}$ indicates a current amount which the constant-current signal supplied by the current source 711 has.

<3-3-3> Operation (Pre-Amplify Reset Phase) of Time Amplifier

In the pre-amplify reset phase, the first switch control control signal (φ1) is at "L" level, the second switch control signal (φ2) is at "L" level, the third switch control signal (φ3) is at "H" level, and the fourth switch control signal (φ4) is at "H" level. The pre-amplify reset phase of the time amplifier 700 is made to temporally coincide with the reset phase of the time-voltage converter 200.

Specifically, in the pre-amplify reset phase, the time amplifier 700 of FIG. 20 resets the voltage of the first terminal of the sampling capacitor 722 by using the reset voltage ($V_{RES}$), and fixes the voltage of the first terminal of the sampling capacitor 742 by using the adjustment voltage ($V_{DAC2}$).

Here, a voltage ($V_{D\_RESA}$) in the pre-amplify reset phase at a node (hereinafter referred to as "node D"), which is equal in potential to the input terminal of the detector 760, can be derived as below.

At the time of the end of the sample phase, each of the sampling capacitor 722 and sampling capacitor 742 stores a charge of $C_3 \cdot (V_{E\_SMP} - V_{CM})$. According to the law of charge conservation, the total charge ($2C_3 \cdot (V_{E\_SMP} - V_{CM})$), which was stored in the sampling capacitor 722 and sampling capacitor 742 in the sample phase, does not change in the pre-amplify reset phase. Therefore, the following equation (13) is established.

$$V_{D\_RESA} = -\frac{I_{711} \cdot T_{DIN}}{C_3} + V_{CM} + \frac{V_{DAC} - V_{RES}}{2} \qquad \text{(equation (13))}$$

<3-3-4> Operation (Amplify Phase) of Time Amplifier

In the amplify phase, the first switch control control signal (φ1) is at "L" level, the second switch control signal (φ2) is at "L" level, the third switch control signal (φ3) is at "H" level, and the fourth switch control signal (φ4) is at "L" level. The amplify phase of the time amplifier 700 is made to temporally coincide with the sample phase of the time-voltage converter 200.

Specifically, in the amplify phase, the time amplifier 700 of FIG. 20 disconnects the first terminal of the sampling capacitor 722 from the voltage source 721. The comparator 762 detects whether the voltage ($V_D$) of the node D is less than the comparative reference voltage ($V_{RC}$), and outputs a time signal ($D_{OUT}$) of "H" level over the first period in which $V_D < V_{RC}$ is established. Incidentally, it is assumed that the above-described reset voltage ($V_{RS}$), voltage ($V_{DAC2}$) and comparative reference voltage ($V_{RC}$) are set such that $V_D < V_{RC}$ is established at the time of the beginning of the amplify phase. The variable current source 771 supplies a variable current signal to the first terminal of the sampling capacitor 722 over the second period. This variable current signal flows through a current path which is formed by the sampling capacitor 722, sampling capacitor 742, switch 744 and voltage source 741.

Since this variable current signal charges the sampling capacitor 722 and sampling capacitor 742, the voltage ($V_D$) of the node D rises with time, and agrees with the comparative reference voltage ($V_{RC}$) at last (at the end of the second period).

As viewed from the variable current source 771, the sampling capacitor 722 and sampling capacitor 742 are connected in series, and a voltage ($V_E$) of the node E at the time of the beginning of the amplify phase is equal to $V_{RES}$. Accordingly, the voltage ($V_{E\_AMP}$) of the node E at the end of the second period can be calculated by using the following equation (14).

$$V_{E\_AMP} = \frac{1}{C_3/2} \int_0^{T_{DOUT}} I_{771} \, dt + V_{RES} \quad \text{(equation (14))}$$
$$= 2 \cdot \frac{I_{771} \cdot T_{DOUT}}{C_3} + V_{RES}$$

In equation (14), $T_{DOUT}$ indicates a time length of the second period, and $I_{771}$ indicates a current amount which the variable current signal supplied by the variable current source 771 has. $I_{771}$ is controlled by the digital control signal ($D_{CNT}$[X:0]).

Then, if consideration is given to the voltage division by the sampling capacitor 722 and sampling capacitor 742, an increase amount of the voltage ($V_D$) of the node D in the second period agrees with half the increase amount of the voltage of the node E in the second period. In addition, the voltage ($V_D$) of the node D at the time of the beginning of the amplify phase is equal to $V_{D\_RESA}$. Accordingly, the voltage ($V_{D\_AMP}$) of the node D at the end of the second period can be calculated by using the following equation (15).

$$V_{D\_AMP} = \frac{I_{771} \cdot T_{DOUT}}{C_3} + V_{D\_RESA} \quad \text{(equation (15))}$$

As described above, at the end of the second period, the voltage ($V_D$) of the node D agrees with the comparative reference voltage ($V_{RC}$). Therefore, the time length ($T_{DOUT}$) of the second period can be derived by using the following equation (16) and equation (17).

$$V_{D\_AMP} = V_{RC} \quad \text{(equation (16))}$$
$$\frac{I_{771} \cdot T_{DOUT}}{C_3} + V_{D\_RESA} = V_{RC}$$

$$T_{DOUT} = \frac{I_{711}}{I_{771}} \cdot T_{DIN} + \frac{C_3}{I_{771}}\left(V_{RC} - V_{CM} - \frac{V_{DAC2} - V_{RES}}{2}\right) \quad \text{(equation (17))}$$

As is understood from equation (17), the time length ($T_{DOUT}$) of the second period is equal to the sum of the time length which is proportional to the length ($T_{DIN}$) of the first period, and a fixed time length.

The factor of proportionality can be set at a desired value by properly designing $I_{711}$ and $I_{771}$. The fixed time length can be set at a desired value by properly designing $C_3$, $I_{711}$, $V_{RC}$, $V_{CM}$, $V_{DAC2}$ and $V_{RES}$.

<3-4> Other Configuration Example of Time Amplifier

In addition, as illustrated in FIG. 22, an M-number (M is an arbitrary integer of 2 or more) of pairs of a signal generator 730-1 and a fifth sampling circuit 740-1, . . . , a signal generator 730-M and a fifth sampling circuit 740-M, which are identical or similar to the signal generator 730 and fifth sampling circuit 740 of FIG. 20, may be provided. Thereby, the factor of proportionality and the fixed time length can be set more finely. Incidentally, adjustment voltages ($V_{DAC2}$), which are generated by voltage sources included in the respective fifth sampling circuit 740-1, . . . , fifth sampling circuit 740-M, may be different.

In the present embodiment, the time-voltage converter 200 converts the amplified time signal to the output voltage. As indicated in the following equation (18), this output voltage ($V_{OUT}$) can be derived by substituting the right side of the above equation (17) for $T_{DIN}$ of the above equation (8), and by substituting the right side of the above equation (6) for $T_{DIN}$ of the right side of the above equation (17).

$$V_{OUT} = \quad \text{(equation (18))}$$
$$-\frac{I_{221}}{C_2}\left\{\begin{array}{l} \frac{I_{711}}{I_{771}} \cdot \frac{C_1}{I_{151}}\left(V_{INAC} + V_{RC} - \frac{V_{RES} + V_{DAC}}{2}\right) \\ + \frac{C_3}{I_{771}}\left(V_{RC} - V_{CM} - \frac{V_{DAC2} - V_{RES}}{2}\right) \end{array}\right\} -$$
$$V_{RES} + 2V_{CM}$$

Further, assuming that $C_1=2C_2=C_3$, and that $I_{151}=I_{211}=I_{771}/2=I_{771}$, equation (18) can be replaced with the following equation (19).

$$V_{OUT}=-4V_{INAC}+2V_{DAC}+4V_{CM}-6V_{RC}+V_{DAC2} \quad \text{(equation (19))}$$

Besides, assuming that $V_{CM}=V_{RC}$, equation (19) can be replaced with the following equation (20).

$$V_{OUT}=-4V_{INAC}+2V_{DAC}-2V_{CM}+V_{DAC2} \quad \text{(equation (20))}$$

As is understood from equation (20), the output voltage ($V_{OUT}$) is equal to a voltage which is obtained by multiplying the AC component ($V_{INAC}$) of the input voltage ($V_{IN}$) by −4, and adding the DC component to the resultant. Further, assuming that $V_{CM}=V_{DAC}=V_{DAC2}$, equation (20) can be replaced with the following equation (21).

$$V_{OUT}=-4V_{INAC}+V_{DAC} \quad \text{(equation (21))}$$

If equation (21) is compared to the above equation (11), the AC component ($V_{INAC}$) of the input voltage ($V_{IN}$) is further amplified twice by the provision of the time amplifier 700.

Figure 23:
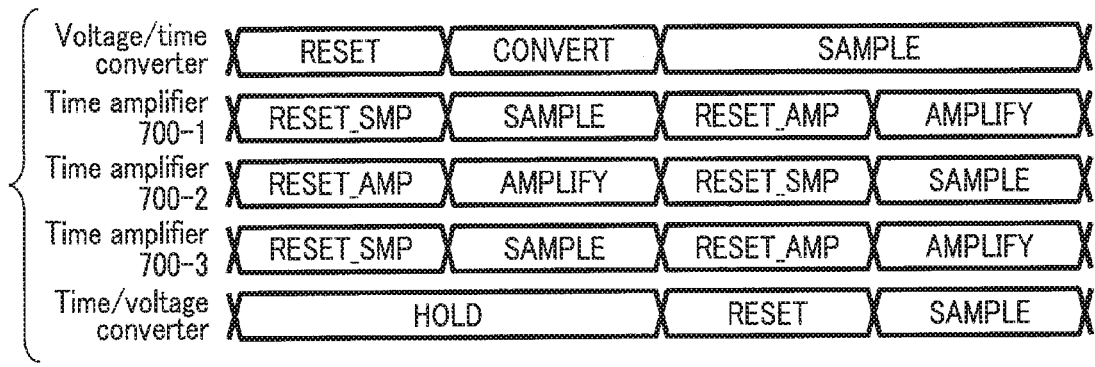
FIG. 23 is an explanatory view of a pipeline process which is executed by the amplifier circuit according to the third embodiment.

Incidentally, as illustrated in FIG. 19, a K-number (K is an arbitrary integer of 2 or more) of time amplifiers 700-1, . . . , 700-K, which are identical or similar to the time amplifier 700 of FIG. 20, may be provided. Thereby, the gain of the amplifier circuit according to the embodiment can be adjusted more finely. The voltage-time converter 100, the K-number of time amplifiers 700-1, . . . , 700-K, and the time-voltage converter 200 execute a pipeline process. Specifically, when K=3, the voltage-time converter 100, the three time amplifiers 700-1, 700-2 and 700-3, and the time-voltage converter 200 operate as illustrated in FIG. 23.

If more generalized, the pre-sample reset phase and sample phase of each time amplifier are made to temporally coincide with the reset phase and convert phase of the immediately preceding voltage-time converter, or with the pre-amplify reset phase and amplify phase of the immediately preceding time amplifier. In addition, the pre-amplify reset phase and amplify phase of each time amplifier are made to temporally coincide with the pre-sample reset phase and sample phase of the immediately subsequent time amplifier, or with the reset phase and sample phase of the immediately subsequent time-voltage converter.

<3-5> Advantageous Effects

As described above, in the amplifier circuit according to the third embodiment, at least one time amplifier is inserted between the voltage-time converter and the time-voltage converter, which were described in the first embodiment. Therefore, according to this amplifier circuit, a desired gain can be achieved by inserting a proper number of time amplifiers.

Fourth Embodiment

Figure 24:
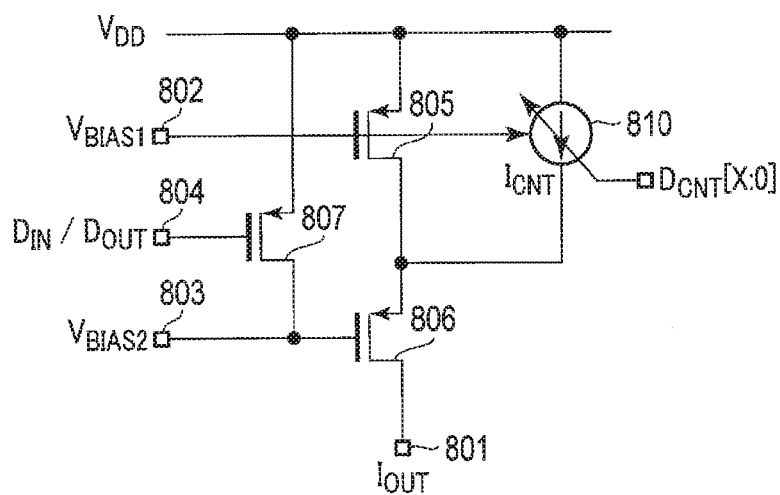
FIG. 24 is a circuit diagram illustrating a current source which is included in an amplifier circuit according to a fourth embodiment.

A current source illustrated in, for example, FIG. 24, can be adopted as each of the above-described variable current source 151, variable current source 211, current source 711 and current source 731.

The current source of FIG. 24 includes a current output terminal 801, a first bias terminal 802, a second bias terminal 803, and a control terminal 804. The current source of FIG. 24 includes a transistor 805, a transistor 806, a transistor 807, and a variable current source 810. Incidentally, in FIG. 24, although the transistors 805, 806 and 807 are depicted as MOS (Metal Oxide Semiconductor) transistors, these may be replaced with other kinds of transistors.

The current source of FIG. 24 outputs a constant-current signal via the current output terminal 801 over a period during which a time signal or an amplified time signal, which is input via the control terminal 804, sets the transistor 807 serving as a switch in the OFF state. For example, this constant-current signal has a current amount ($I_{OUT}$) which is determined by the device size of the transistor 805 and a voltage ($V_{BIAS1}$) of the first bias terminal 802.

The transistor 805 includes a source terminal which is connected to a power supply, a gate terminal which is connected to the first bias terminal 802, and a drain terminal which is connected to a source terminal of the transistor 806. As described above, the device size of the transistor 805 determines the current amount (In) that the constant-current signal, which is output via the current output terminal 801, has.

The transistor 806 includes the source terminal which is connected to the drain terminal of the transistor 805, a gate terminal which is connected to the second bias terminal 803, and a drain terminal which is connected to the current output terminal 801. The transistor 806 is cascode-connected to the transistor 805, and has a function of increasing an output resistance value.

The transistor 807 includes a source terminal which is connected to the power supply, a gate terminal which is connected to the control terminal 804, and a drain terminal which is connected to the second bias terminal 803. The transistor 807 functions as a switch. Specifically, the transistor 807 establishes a short-circuit between the power supply and the gate terminal of the transistor 806 over a period during which the time signal or amplified time signal ($D_{IN}/D_{OUT}$), which is input via the control terminal 804, is at "L" level. As a result, since the transistor 806 enters the OFF state, the current source of FIG. 24 does not output the constant-current signal. On the other hand, the transistor 807 establishes an open-circuit between the power supply and the gate terminal of the transistor 806 over a period during which the time signal or amplified time signal ($D_{IN}/D_{OUT}$), which is input via the control terminal 804, is at "H" level. As a result, since the transistor 806 enters the ON state, the current source of FIG. 24 outputs the constant-current signal.

The variable current source 810 adds or subtracts a small amount of electric current to or from the drain current of the transistor 805, thereby finely adjusting the current amount of the above-described constant-current signal. By providing the variable current source 810, it becomes possible to compensate a variation of the drain current, which may possibly occur due to the effect of device mismatch, etc. The amount of current, which is output by the variable current source 810, is controlled by a digital control signal ($D_{CNT}$[X:0]) of (X+1) bits. X is an integer of 0 or more.

Fifth Embodiment

Figure 25:
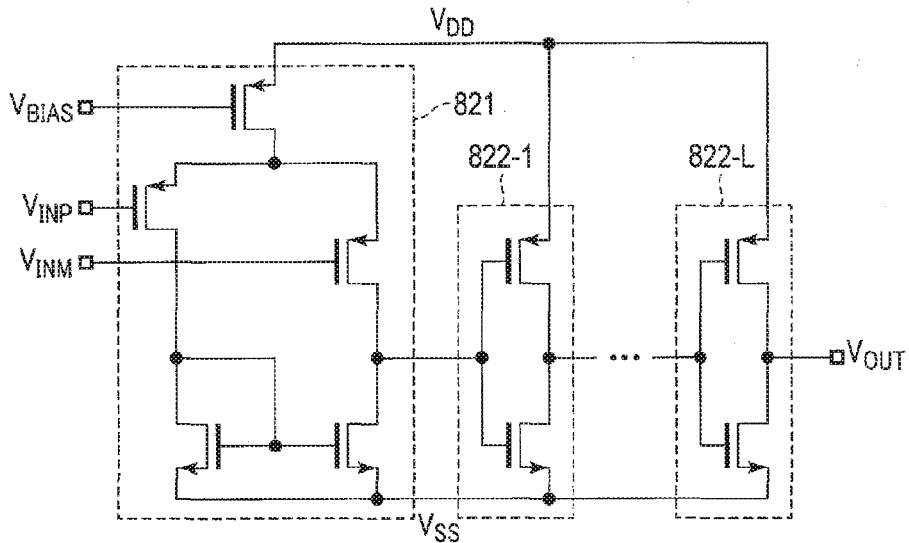
FIG. 25 is a circuit diagram illustrating a comparator which is included in an amplifier circuit according to a fifth embodiment.

A comparator illustrated in, for example, FIG. 25 can be adopted as each of the above-described comparator 141 and comparator 762.

The comparator of FIG. 25 includes a differential single-phase amplifier circuit 821 and an L-number (L is an arbitrary integer of 1 or more) of inverters 822-1 to 822-L.

Incidentally, in FIG. 25, although all transistors are depicted as MOS transistors, these may be replaced with other kinds of transistors. In addition, in FIG. 25, although the L-number of inverters 822-1 to 822-L are depicted as CMOS (Complementary MOS) inverters, these may be replaced with other kinds of inverters.

The differential single-phase amplifier circuit 821 amplifies a differential voltage between a voltage ($V_{INP}$) of a first input terminal and a voltage ($V_{INM}$) of a second input terminal, and outputs a single-phase signal to the inverter 822-1.

The L-number of inverters 822-1 to 822-L are cascade-connected. The inverter 822-1 receives a single-phase signal from the differential single-phase amplifier circuit 821, amplifies and logically inverts this single-phase signal, and outputs the amplified and logically inverted signal to the inverter 822-2. The inverters 822-2, . . . , 822-(L–1) amplify and logically invert an input signal from an immediately preceding inverter, 822-1 to 822-(L–2), and output the amplified and logically inverted signal to an immediately subsequent inverter 822-L. The inverter 822-L amplifies and logically inverts an input signal from the inverter 822-(L–1), and outputs the amplified and logically inverted signal via an output terminal of the comparator.

In the meantime, the L-number of inverters 822-1 to 822-L are provided in order to amplify the single-phase signal, which is output from the differential single-phase amplifier circuit 821, to a power supply voltage level or a ground voltage level. Therefore, when the differential single-phase amplifier circuit 821 has a sufficient gain, the L-number of inverters 822-1 to 822-L may be omitted.

Sixth Embodiment

<6-1> Configuration of Time Amplifier

Figure 26:
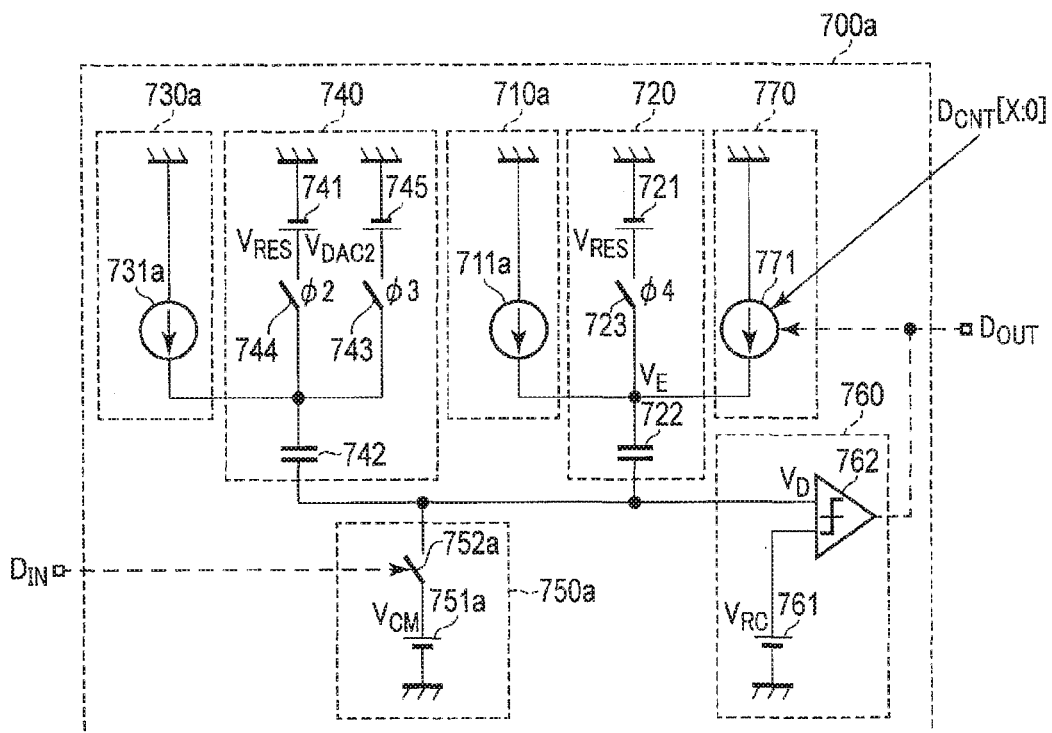
FIG. 26 is a circuit diagram illustrating a time amplifier which is included in an amplifier circuit according to a sixth embodiment.

In each of the above-described embodiments, a time amplifier 700a, which is illustrated in FIG. 26, may be adopted in place of the time amplifier 700 illustrated in FIG. 20.

The time amplifier 700a includes a signal generator 710a, a fourth sampling circuit 720, a signal generator 730a, a fifth sampling circuit 740, a bottom plate sampler 750a, a detector 760, and a signal generator 770. Incidentally, the fourth sampling circuit 720, fifth sampling circuit 740, detector 760 and signal generator 770 may be identical or similar to the fourth sampling circuit 720, fifth sampling circuit 740, detector 760 and signal generator 770 illustrated in FIG. 20.

The signal generator 710a includes an output terminal. The output terminal of the signal generator 710a is connected to a first terminal of the fourth sampling circuit 720. The signal generator 710a generates an electric signal, and supplies the electric signal to the fourth sampling circuit 720.

Specifically, the signal generator 710a of FIG. 26 includes a current source 711a. The current source 711a includes a first terminal and a second terminal. The first terminal of the current source 711a is grounded. The second terminal of the current source 711a is connected to the output terminal of the signal generator 710a. The current source 711a generates a constant-current signal, and supplies the constant-current signal to the fourth sampling circuit 720 via the second terminal.

The signal generator 730a includes an output terminal. The output terminal of the signal generator 730a is connected to a first terminal of the fifth sampling circuit 740. The signal generator 730a generates an electric signal, and supplies the electric signal to the fifth sampling circuit 740. The signal generator 730a may be identical or similar to the signal generator 710a.

Specifically, the signal generator 730a of FIG. 26 includes a current source 731a. The current source 731a includes a first terminal and a second terminal. The first terminal of the current source 731a is grounded. The second terminal of the current source 731a is connected to the output terminal of the signal generator 730a. The current source 731a generates a constant-current signal, and supplies the constant-current signal to the fifth sampling circuit 740 via the second terminal.

The bottom plate sampler 750a includes a first terminal. The first terminal of the bottom plate sampler 750a is commonly connected to the second terminal of the fourth sampling circuit 720, the second terminal of the fifth sampling circuit 740, and the input terminal of the detector 760.

Over the above-described first period of the sample phase, the bottom plate sampler 750a fixes the voltage of the second terminal of the sampling capacitor 722 and the voltage of the second terminal of the sampling capacitor 742 by using the intermediate voltage ($V_{CM}$).

In the pre-sample reset phase, the period of the sample phase excluding the first period, the pre-amplify reset phase and the amplify phase, the bottom plate sampler 750a does not fix the voltage of the second terminal of the sampling capacitor 722 or the voltage of the second terminal of the sampling capacitor 742. Further, ideally, the bottom plate sampler 750a does not provide a current path in the pre-sample reset phase, the period of the sample phase excluding the first period, the pre-amplify reset phase and the amplify phase.

Specifically, the bottom plate sampler 750a of FIG. 26 includes a voltage source 751a and a switch 752a.

The voltage source 751a includes a positive terminal and a negative terminal. The positive terminal of the voltage source 751a is connected to the switch 752a. The negative terminal of the voltage source 751a is grounded. The voltage source 751a generates an intermediate voltage ($V_{CM}$).

The switch 752a is inserted between the first terminal of the bottom plate sampler 750a and the positive terminal of the voltage source 751a. In accordance with the time signal ($D_{IN}$), the switch 752a establishes a short-circuit or an open-circuit between the first terminal of the bottom plate sampler 750a and the positive terminal of the voltage source 751a. Specifically, in the first period of the sample phase, the switch 752a establishes a short-circuit between the first terminal of the bottom plate sampler 750a and the positive terminal of the voltage source 751a. On the other hand, in the pre-sample reset phase, the period of the sample phase excluding the first period, the pre-amplify reset phase and the amplify phase, the switch 752a establishes an open-circuit between the first terminal of the bottom plate sampler 750a and the positive terminal of the voltage source 751a.

<6-2> Advantageous Effects

As has been described above, the time amplifier included in the amplifier circuit according to the sixth embodiment is configured such that the switch included in the bottom plate sampler, in place of the signal generators, is controlled with use of the time amplifier. Therefore, according to this time amplifier, it is possible to reduce the effect of charge injection, while realizing the operation that is identical or similar to the operation of the time amplifier described in the fourth embodiment.

In the meantime, not only the time amplifier, but also the time-voltage converter can similarly be modified. Specifically, as regards the time-voltage converter 200 of FIG. 9, the switch 232 included in the bottom plate sampler 230, in place of the signal generator 210, may be controlled by using the time signal (Dm). According this modification, the effect of charge injection upon the time-voltage converter can be reduced.

Seventh Embodiment

<7-1> Configuration of Time Amplifier

Figure 27:
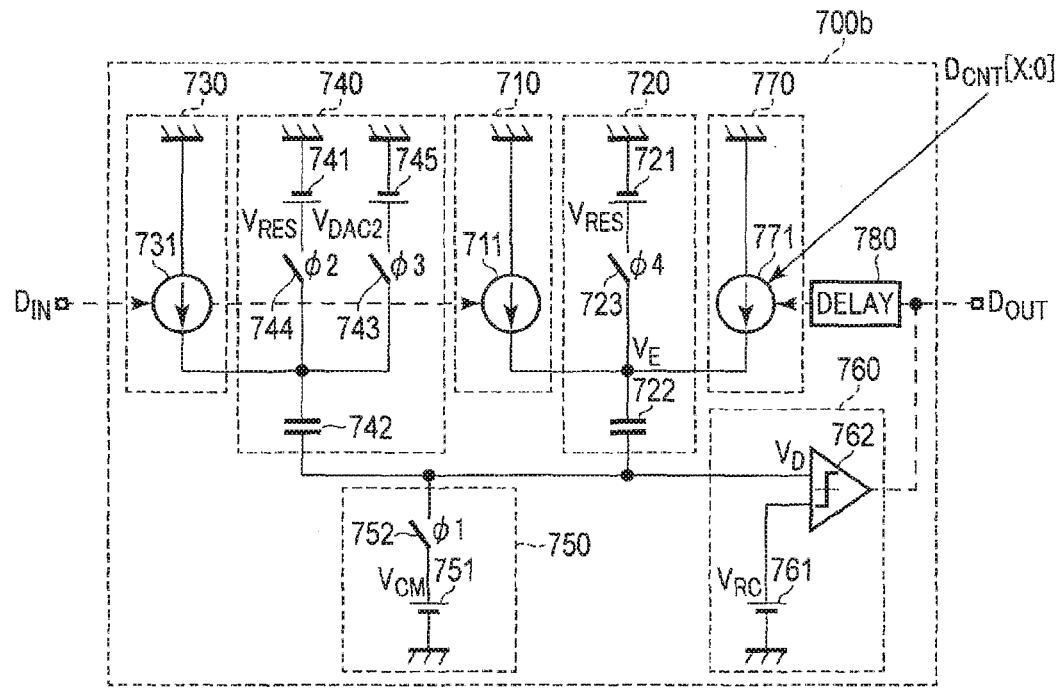
FIG. 27 is a circuit diagram illustrating a time amplifier which is included in an amplifier circuit according to a seventh embodiment.

In each of the above-described embodiments, a time amplifier 700b, which is illustrated in FIG. 27, may be adopted in place of the time amplifier 700 illustrated in FIG. 20 or the time amplifier 700a illustrated in FIG. 26.

In the above-described time amplifier 700 and time amplifier 700a, the amplified time signal of "L" level is input to the signal generator 770 at a timing when the voltage ($V_D$) of the input terminal of the detector 760 has risen to the comparative reference voltage ($V_{RC}$) or more. In practical use, however, the voltage ($V_D$) of the input terminal of the detector 760 or the comparative reference voltage ($V_{RC}$) may vary due to the effect of noise, and the voltage ($V_D$) may, once again, become $V_D < V_{RC}$, and there is concern that an amplified time signal of "H" level may erroneously be output.

The time amplifier 700b includes a signal generator 710, a fourth sampling circuit 720, a signal generator 730, a fifth sampling circuit 740, a bottom plate sampler 750, a detector 760, a signal generator 770 and a delay element 780. Incidentally, the signal generator 710, fourth sampling circuit 720, signal generator 730, fifth sampling circuit 740, bottom plate sampler 750, detector 760 and signal generator 770 may be identical or similar to the signal generator 710, fourth sampling circuit 720, signal generator 730, fifth sampling circuit 740, bottom plate sampler 750, detector 760 and signal generator 770 illustrated in FIG. 20.

The delay element 780 is inserted between the detector 760 and the signal generator 770. The delay element 780 delays the amplified time signal from the detector 760, and obtains a delay time signal. The delay element 780 outputs the delay time signal to the signal generator 770. Then, the signal generator 770 operates in accordance with the delay time signal in place of the amplified time signal. Therefore, the delay time signal of "L" level is input to the signal generator 770, not at the timing when the voltage ($V_D$) of the input terminal of the detector 760 has risen to the comparative reference voltage ($V_{RC}$) or more, but with a delay of a predetermined time from this timing. During this delay time, since the signal generator 770 does not stop the operation, the voltage ($V_D$) of the input terminal of the detector 760 continues to rise.

Specifically, at a time point when the signal generator 770 stops the operation, the voltage ($V_D$) of the input terminal becomes sufficiently higher than the comparative reference voltage ($V_{RC}$). Accordingly, even if the voltage ($V_D$) of the input terminal or the comparative reference voltage ($V_{RC}$) slightly varies due to the effect of noise, the amplified time signal is stable at "L" level.

<7-2> Advantageous Effects

As has been described above, in the time amplifier included in the amplifier circuit according to the seventh embodiment, the delay element is inserted between the detector and the signal generator. Therefore, according to this time amplifier, it is possible to enhance the noise robustness, while realizing the operation that is identical or similar to the operation of the time amplifier described in the fourth embodiment.

In the meantime, not only the time amplifier, but also the voltage-time converter can similarly be modified. Specifically, as regards the voltage-time converter 100 of FIG. 2, the delay element may be inserted between the detector 140 and the signal generator 150. According this modification, the noise robustness of the voltage-time converter can be enhanced.

Eighth Embodiment

The detector described in each of the above embodiments includes the comparator. In addition, for example, the comparator of FIG. 25 includes the differential single-phase amplifier circuit 821. The differential single-phase amplifier circuit 821 constantly consumes a bias current. Taking this into account, an amplifier circuit according to an eighth embodiment is configured to reduce power consumption by modifying the detector. Specifically, the comparator is replaced with an inverter which logically inverts an input voltage with reference to a threshold voltage. However, the threshold voltage of an ordinary inverter does not always have a proper value, since this threshold voltage depends on the characteristics of transistors included in the inverter, the power supply voltage, etc. Accordingly, an inverter having a function of adjusting the threshold should preferably be used.

<8-1> Configuration of Time Amplifier

Figure 28:
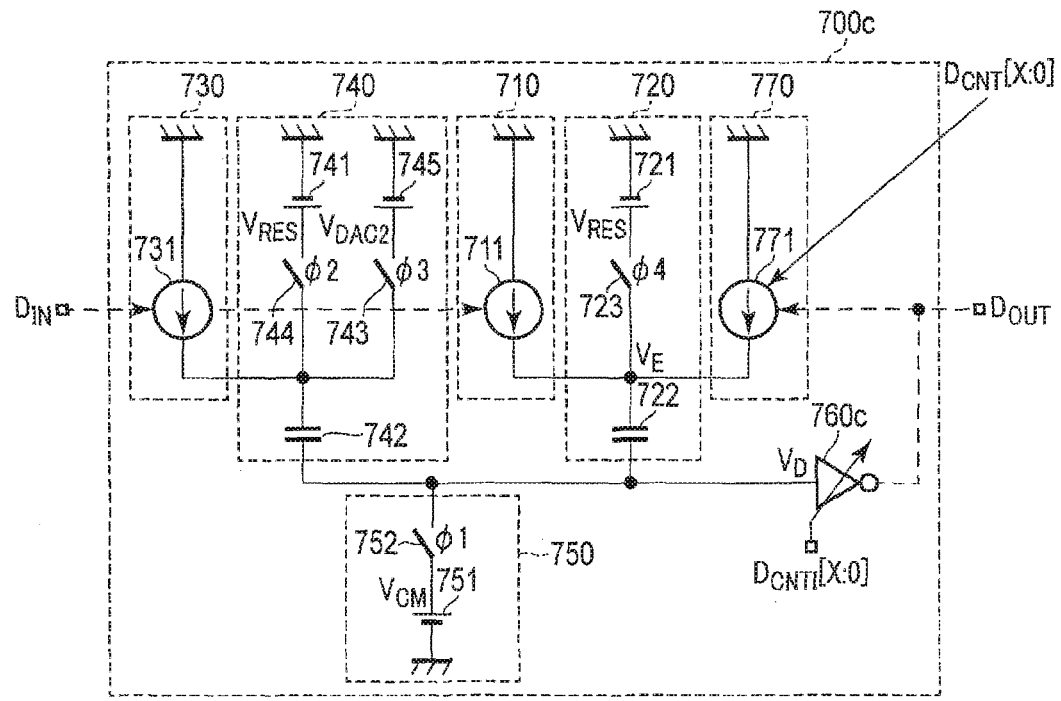
FIG. 28 is a circuit diagram illustrating a time amplifier which is included in an amplifier circuit according to an eighth embodiment.

Specifically, in each of the above-describe embodiments, a time amplifier 700c illustrated in FIG. 28 may be adopted in place of the time amplifier 700 illustrated in FIG. 20, the time amplifier 700a illustrated in FIG. 26, or the time amplifier 700b illustrated in FIG. 27.

The time amplifier 700c includes a signal generator 710, a fourth sampling circuit 720, a signal generator 730, a fifth sampling circuit 740, a bottom plate sampler 750, a detector 760c and a signal generator 770. Incidentally, the signal generator 710, fourth sampling circuit 720, signal generator 730, fifth sampling circuit 740, bottom plate sampler 750 and signal generator 770 may be identical or similar to the signal generator 710, fourth sampling circuit 720, signal generator 730, fifth sampling circuit 740, bottom plate sampler 750 and signal generator 770 illustrated in FIG. 20.

<8-2> Configuration of Detector

FIG. 29 illustrates a concrete example of the detector 760c. The detector 760c of FIG. 29 includes a variable threshold inverter 761c, and an L-number (L is an arbitrary integer of 1 or more) of inverters 822-1 to 822-L. The L-number of inverters 822-1 to 822-L may be identical or similar to the L-number of inverters 822-1 to 822-L illustrated in FIG. 25.

Incidentally, in FIG. 29, although all transistors are depicted as MOS transistors, these may be replaced with other kinds of transistors. In addition, in FIG. 29, although the variable threshold inverter 761c and the L-number of inverters 822-1 to 822-L are depicted as CMOS inverters, these may be replaced with other kinds of inverters.

The threshold voltage of the variable threshold inverter 761c is controlled by a digital control signal ($D_{CNT1}$[X:0]) of (X+1) bits. X is an integer of 0 or more. The variable threshold inverter 761c logically inverts the voltage of an input terminal of the detector 760c with reference to a threshold voltage, and outputs the logically inverted voltage to the inverter 822-1.

Specifically, the variable threshold inverter 761c includes a plurality of NMOS transistors, a plurality of switches 762c, a plurality of PMOS transistors, a plurality of switches 763c, and a switch 764c.

The plural NMOS transistors have source terminals which are commonly connected to each other. Further, the plural NMOS transistors have drain terminals which are commonly connected to each other. The gate terminal of each NMOS transistor is connected to the associated switch 762c.

Each of the plural switches 762c establishes a short-circuit or an open-circuit between the gate terminal of the associated NMOS transistor and the input terminal of the variable threshold inverter 761c. The ON/OFF state of each of the switches 762c is individually controlled by a digital control signal ($D_{CNT1}$[X:0]) of (X+1) bits.

<8-3> Configuration of Plural Switches

FIG. 30 illustrates a concrete example of each of the switches 762c. The switch 762c of FIG. 30 includes an input terminal 771c, an output terminal 772c and a control terminal 773c. The switch 762c also includes a CMOS switch 774c, an inverter 775c and an NMOS transistor 776c. Incidentally, in FIG. 30, although all transistors are depicted as MOS transistors, these may be replaced with other kinds of transistors.

The CMOS switch 774c establishes a short-circuit or an open-circuit between the input terminal 771c and output terminal 772c in accordance with a digital control signal ($D_{CNT1}$) which is input via the control terminal 773c, and an inverted signal of this digital control signal ($D_{CNT1}$), which is input from the inverter 775c. Specifically, if the digital control signal ($D_{CNT1}$) is at "H" level, the CMOS switch 774c establishes a short-circuit between the input terminal 771c and output terminal 772c. On the other hand, if the digital control signal ($D_{CNT1}$) is at "L" level, the CMOS switch 774c establishes an open-circuit between the input terminal 771c and output terminal 772c.

The inverter 775c includes an input terminal and an output terminal. The digital control signal ($D_{CNT1}$) is input to the inverter 775c via the control terminal 773c. The inverter 775 obtains an inverted signal by logically inverting the digital control signal ($D_{CNT1}$). The inverter 775c outputs the inverted signal to the CMOS switch 774c and the gate terminal of the NMOS transistor 776c.

The NMOS transistor 776c includes the gate terminal which is connected to the output terminal of the inverter 775c, a drain terminal which is connected to the output terminal 772c, and a source terminal which is connected to the ground. The inverted signal of the digital control signal ($D_{CNT1}$) is input from the inverter 775c to the NMOS transistor 776c via the gate terminal. If the inverted signal is at "H" level (i.e. if the digital control signal ($D_{CNT1}$) is at "L" level), the NMOS transistor 776c establishes a short-circuit between the output terminal 772c and the ground. On the other hand, if the inverted signal is at "L" level (i.e. if the digital control signal ($D_{CNT1}$) is at "H" level), the NMOS transistor 776c establishes an open-circuit between the output terminal 772c and the ground.

The PMOS transistors have source terminals which are commonly connected to each other. In addition, the PMOS transistors have drain terminals which are commonly connected to each other. The gate terminals of the PMOS transistors are connected to the associated switches 763c.

Each of the plural switches 763c establishes a short-circuit or an open-circuit between the gate terminal of the associated PMOS transistor and the input terminal of the variable threshold inverter 761c. The ON/OFF state of each of the switches 763c is individually controlled by a digital control signal ($D_{CNT1}$[X:0]) of (X+1) bits. Each of the switches 763c may be similar to, for example, each switch 762c illustrated in FIG. 30. However, each of the switches 763c needs to establish a short-circuit between the output terminal and the power supply in place of the ground, if the digital control signal ($D_{CNT1}$) is at "L" level.

The switch 764c establishes a short-circuit or an open circuit between the input and output of the variable threshold inverter 761c. The ON/OFF state of the switch 764c is controlled by a digital control signal ($D_{CNT1}$[X:0]) of (X+1) bits. The switch 764c may be implemented by using a CMOS switch.

If the ON/OFF states of the plural switches 762c and plural switches 763c change, the size ratio between the NMOS transistors and PMOS transistors in the variable threshold inverter 761c functioning as the CMOS inverter will substantially change. Specifically, the threshold voltage of the variable threshold inverter 761c can be controlled by the digital control signal ($D_{CNT1}$[X:0]). Incidentally, the threshold voltage of the variable threshold inverter 761c can be measured by observing the voltage of the input terminal of the variable threshold inverter 761c, after the switch 764c is set in the ON state in the state in which the plural switches 762c and plural switches 763c are kept in desired ON/OFF states.

In the meantime, the threshold voltage of the CMOS inverter can also be adjusted by using a publicly known technique (e.g. auto-zero technique). However, according to the auto-zero technique, it is necessary to connect capacitors in series to the input terminal. On the other hand, according to the variable threshold inverter 761c, since a delay due to a capacitor or a switch can be avoided, a high-speed operation can be realized. However, if use can be made of an inverter having a proper threshold voltage (e.g. a threshold voltage substantially equal to the comparative reference voltage ($V_{RC}$)), the control of the threshold voltage is needless to begin with. In short, the variable threshold inverter 761c may be replaced with an ordinary inverter having a proper threshold.

<8-4> Advantageous Effects

As has been described above, the amplifier circuit according to the eighth embodiment adopts the detector in which the comparator is replaced with the inverter. Thus, according to this amplifier circuit, the power consumption by the detector can be reduced.

In addition, not only the time amplifier, but also the voltage-time converter can similarly be modified. Specifically, as regards the voltage-time converter 100 of FIG. 2, the detector 140 may be replaced with the detector 760c illustrated in FIG. 29. According to this modification, the power consumption in the detector of the voltage-time converter can be reduced.

Ninth Embodiment

<9-1> Configuration of Analog-Digital Converter

As illustrated in FIG. 31, an analog-digital converter according to a ninth embodiment includes a first analog-digital converter 900, a second analog-digital converter 910, a time-voltage converter 200, a correction circuit 300, a back-end analog-digital converter (ADC) 920, and an encoder 930. Incidentally, in the present embodiment, the correction circuit 300, which was described in the first embodiment, is applicable.

In the meantime, although the analog-digital converter of FIG. 31 corresponds to a three-stage pipeline type analog-digital converter, the number of stages can be increased or decreased. When the number of stages is increased, a circuit, which is identical or similar to the second analog-digital converter 910, may be added. When the number of stages is decreased, the second analog-digital converter 910 may be removed. Besides, the present embodiment is not limited to the pipeline type analog-digital converter, and another kind of analog-digital converter, such as ΔΣADC, may be applied.

The first analog-digital converter 900 generates a first digital signal by A/D converting a portion of an input analog signal. The first analog-digital converter 900 outputs the first digital signal to the encoder 930. In addition, the first analog-digital converter 900 obtains a first time signal by substantially voltage-time converting the residual portion of the input analog signal (hereinafter referred to as "first residual signal"). The first analog-digital converter 900 outputs the first time signal to the second analog-digital converter 910.

Specifically, the first analog-digital converter 900 includes a voltage-time converter 100, a sub analog-digital converter 901, and a sub digital-analog converter 902.

The sub analog-digital converter 901 obtains a first digital signal by A/D converting a portion of the input analog signal. The sub analog-digital converter 901 outputs the first digital signal to the sub digital-analog converter 902 and encoder 930.

The sub digital-analog converter 902 receives the first digital signal from the sub analog-digital converter 901. The sub digital-analog converter 902 obtains a first analog signal by D/A converting the first digital signal. The sub digital-analog converter 902 outputs the first analog signal to the voltage-time converter 100.

The voltage-time converter 100 voltage-time converts the input analog signal. A digital control signal ($D_{CNT}$[X:0]) is input to the voltage-time converter 100 from the correction circuit 300. However, the voltage-time converter 100 receives the first analog signal from the sub digital-analog converter 902, and controls the above-described adjustment voltage ($V_{DAC}$) by using this first analog signal. Therefore, the voltage-time converter 100 obtains a first time signal by substantially voltage-time converting a first residual signal which corresponds to a difference between the input analog signal and the first analog signal. The voltage-time converter 100 outputs the first time signal to the second analog-digital converter 910. The voltage-time converter 100 adjusts the time length of the time signal, based on the digital control signal ($D_{CNT}$[X:0]).

The second analog-digital converter 910 receives the first time signal from the first analog-digital converter 900. The second analog-digital converter 910 restores the above-described first residual signal by time-voltage converting the first time signal. Then, the second analog-digital converter 910 obtains a second digital signal by A/D converting a portion of the first residual signal. The second analog-digital converter 910 outputs the second digital signal to the encoder 930. Further, the second analog-digital converter 910 obtains a second time signal by substantially voltage-time converting the residual portion (hereinafter referred to as "second residual signal") of the first residual signal. The second analog-digital converter 910 outputs the second time signal to the time-voltage converter 200.

Specifically, the second analog-digital converter 910 includes a time amplifier 700, a time-voltage converter 911, a sub analog-digital converter 912, and a sub digital-analog converter 913.

The time-voltage converter 911 receives the first time signal from the first analog-digital converter 900. The time-voltage converter 911 receives the digital control signal ($D_{CNT}$[X:0]) from the correction circuit 300. The time-voltage converter 911 restores the first residual signal by time-voltage converting the first time signal. The time-voltage converter 911 outputs the first residual signal to the sub analog-digital converter 912. The time-voltage converter 911 may be identical or similar to the above-described time-voltage converter 200. The time-voltage converter 911 adjusts the output voltage, based on the digital control signal ($D_{CNT}$[X:0]).

The sub analog-digital converter 912 obtains a second digital signal by A/D converting a portion of the first residual signal. The sub analog-digital converter 912 outputs the second digital signal to the sub digital-analog converter 913 and encoder 930.

The sub digital-analog converter 913 receives the second digital signal from the sub analog-digital converter 912. The sub digital-analog converter 913 obtains a second analog signal by D/A converting the second digital signal. The sub digital-analog converter 913 outputs the second analog signal to the time amplifier 700.

The time amplifier 700 receives the first time signal from the first analog-digital converter 900. The time amplifier 700 receives the digital control signal ($D_{CNT}$[X:0]) from the correction circuit 300. The time amplifier 700 amplifies the first time signal. However, the time amplifier 700 receives the second analog signal from the sub digital-analog converter 913, and controls the above-described adjustment voltage ($V_{DAC2}$) by using this second analog signal. Therefore, the time amplifier 700 obtains a second time signal by substantially voltage-time converting a second residual signal which corresponds to a difference between the first residual signal and the second analog signal. The time amplifier 700 outputs the second time signal to the time-voltage converter 200. The time amplifier 700 adjusts the time length of the second time signal, based on the digital control signal ($D_{CNT}$[X:0]).

The time-voltage converter 200 receives the second time signal from the second analog-digital converter 910. The time-voltage converter 200 receives the digital control signal ($D_{CNT}$[X:0]) from the correction circuit 300. The time-voltage converter 200 restores the second residual signal by time-voltage converting the second time signal. The time-voltage converter 200 outputs the second residual signal to the back-end analog-digital converter 920. The time-voltage converter 200 adjusts the output voltage, based on the digital control signal ($D_{CNT}$[X:0]).

The amplified time signal ($D_{OUT}$) is input to the correction circuit 300 from the time amplifier 700. The correction circuit 300 generates the digital control signal ($D_{CNT}$[X:0]), based on the amplified time signal (Do) and the reference signal (PHI_REF) (e.g. clock signal) which is delivered from the outside of the amplifier circuit 1. The correction circuit 300 supplies the digital control signal ($D_{CNT}$[X:0]) to the voltage-time converter 100, time-voltage converter 911, time amplifier 700 and time-voltage converter 200.

The back-end analog-digital converter 920 obtains a third digital signal by A/D converting the second residual signal. The back-end analog-digital converter 920 outputs the third digital signal to the encoder 930.

The encoder 930 receives the first digital signal from the first analog-digital converter 900, receives the second digital signal from the second analog-digital converter 910, and receives the third digital signal from the back-end analog-digital converter 920. The encoder 930 converts the first digital signal, second digital signal and third digital signal, thereby obtaining an output digital signal as binary data.

<9-2> Modification of Analog-Digital Converter

The analog-digital converter of FIG. 31 may be modified, as illustrated in FIG. 32. The analog-digital converter of FIG. 32 includes a first analog-digital converter 900, a second analog-digital converter 1010, a time/digital converter (TDC) 1020, a correction circuit 300, and an encoder 930. The first analog-digital converter 900 and encoder 930 may be identical or similar to the first analog-digital converter 900 and encoder 930 illustrated in FIG. 31.

The second analog-digital converter 1010 receives the first time signal from the first analog-digital converter 900. The second analog-digital converter 1010 obtains the above-described second digital signal by time/digital converting the first time signal. The second analog-digital converter 1010 outputs the second digital signal to the encoder 930. Further, the second analog-digital converter 1010 obtains a second time signal by substantially voltage-time converting the residual portion (hereinafter referred to as "second residual signal") of the first residual signal. The second analog-digital converter 1010 outputs the second time signal to the time-voltage converter 200.

The second analog-digital converter 1010 includes a time amplifier 700, a TDC 1011, and a sub digital-analog converter 1012.

The TDC 1011 receives the first time signal from the first analog-digital converter 900. The TDC 1011 obtains a second digital signal by time/digital converting the first time signal. The TDC 1011 outputs the second digital signal to the sub digital-analog converter 1012 and encoder 930.

The sub digital-analog converter 1012 receives the second digital signal from the TDC 1011. The sub digital-analog converter 1012 obtains a second analog signal by D/A converting the second digital signal. The sub digital-analog converter 1012 outputs the second analog signal to the time amplifier 700.

The time amplifier 700 receives the first time signal from the first analog-digital converter 900. The time amplifier 700 receives the digital control signal ($D_{CNT}$[X:0]) from the correction circuit 300. The time amplifier 700 amplifies the first time signal. However, the time amplifier 700 receives the second analog signal from the sub digital-analog converter 1012, and controls the above-described adjustment voltage ($V_{DAC2}$) by using this second analog signal. Therefore, the time amplifier 700 obtains a second time signal by substantially voltage-time converting a second residual signal which corresponds to a difference between the first residual signal and the second analog signal. The time amplifier 700 outputs the second time signal to the TDC 1020. The time amplifier 700 adjusts the second time signal, based on the digital control signal ($D_{CNT}$[X:0]).

The TDC 1020 receives the second time signal from the second analog-digital converter 910. The TDC 1020 obtains the above-described third digital signal by time/digital converting the second time signal. The TDC 1020 outputs the third digital signal to the encoder 930.

The analog-digital converter of FIG. 32 is lower in power consumption than the analog-digital converter of FIG. 31.

<9-3> Advantageous Effects

As has been described above, the analog-digital converter according to the ninth embodiment includes the voltage-time converter described in the first embodiment and the time amplifier described in the third embodiment. Therefore, according to this analog-digital converter, the operation with low power consumption and high precision can be realized.

Tenth Embodiment

<10-1> Configuration of Voltage-Time Converter

A voltage-time converter according to a tenth embodiment converts a portion of an input analog signal to a digital signal. Accordingly, this voltage-time converter can also be called "analog-digital converter". In addition, this voltage-time converter obtains a time signal by voltage-time converting the residual portion of the input analog signal.

FIG. 33 illustrates a concrete example of the voltage-time converter according to the present embodiment. A voltage-time converter 1100 of FIG. 33 includes a first sampling circuit 110, an N-number of second sampling circuits 120-1, . . . , 120-N, a bottom plate sampler 130, a detector 140, a signal generator 150, a detector 1160, and a SAR (Successive Approximation Register) logic 1170. The first sampling circuit 110, N-number of second sampling circuits 120-1, . . . , 120-N, bottom plate sampler 130, detector 140 and signal generator 150 may be identical or similar to the first sampling circuit 110, N-number of second sampling circuits 120-1, . . . , 120-N, bottom plate sampler 130, detector 140 and signal generator 150 of FIG. 8.

The detector 1160 includes an input terminal and an output terminal. The input terminal of the detector 1160 is commonly connected to the second terminal of the first sampling circuit 110, the second terminals of the N-number of second sampling circuits 120-1, . . . , 120-N, the first terminal of the bottom plate sampler 130 and the input terminal of the detector 140. The output terminal of the detector 1160 is connected to an input terminal of the SAR logic 1170.

In the reset phase of the voltage-time converter 1100 of FIG. 33, the detector 1160 cyclically compares the voltage of the input terminal thereof with a comparative reference voltage. The detector 1160 cyclically outputs a digital signal indicative of the comparison result to the SAR logic 1170. In the sample phase and convert phase of the voltage-time converter 1100, the detector 1160 stops the operation.

<10-2> Concrete Example of Voltage-Time Converter

To be more specific, as illustrated in FIG. 34, the detector 1160 includes a voltage source 1161 and a comparator 1162.

The voltage source 1161 includes a positive terminal and a negative terminal. The positive terminal of the voltage source 1161 is connected to a second input terminal of the comparator 1162. The negative terminal of the voltage source 1161 is grounded. The voltage source 1161 generates a comparative reference voltage ($V_{RC2}$). The comparative reference voltage ($V_{RC2}$) may be identical to the intermediate voltage ($V_{CM}$).

The comparator 1162 includes a first input terminal, the second input terminal, and an output terminal. The first input terminal of the comparator 1162 is connected to the input terminal of the detector 1160. The second input terminal of the comparator 1162 is connected to the positive terminal of the voltage source 1161. The output terminal of the comparator 1162 is connected to the output terminal of the detector 1160.

The comparator 1162 operates in synchronism with a clock signal (CLK). Upon detecting a rising edge (or a falling edge) of the clock signal (CLK), the comparator 1162 compares the voltage of the first input terminal with the voltage of the second input terminal. Incidentally, as illustrated in FIG. 35, the clock signal may be a pulse signal of a predetermined cycle, which is supplied to the comparator 1162 during the reset phase of the voltage-time converter 1100. In the meantime, the comparator 1162 stops the operation in the sample phase and convert phase of the voltage-time converter 1100.

Specifically, if the voltage of the first input terminal is lower than the voltage of the second input terminal, the comparator 1162 outputs a digital signal of "H" level (power supply voltage). On the other hand, if the voltage of the first input terminal is equal to or higher than the voltage of the second input terminal, the comparator 1162 outputs a digital signal of "L" level (ground voltage).

The SAR logic 1170 includes an input terminal, a digital output terminal, and a control output terminal. The input terminal of the SAR logic 1170 is connected to the output terminal of the detector 1160. The control output terminal of the SAR logic 1170 is connected to the N-number of second sampling circuits 120-1, . . . , 120-N.

In the meantime, according to the example of FIG. 34, the control output terminal of the SAR logic 1170 is connected to, for instance, a switch 124-1, etc. included in the N-number of second sampling circuits 120-1, . . . , 120-N. However, the control output terminal of the SAR logic 1170 may be connected to other elements (e.g. voltage source 123-1 etc.) for controlling the adjustment voltage in the N-number of second sampling circuits 120-1, . . . , 120-N.

In the reset phase of the voltage-time converter 1100 of FIG. 33, the SAR logic 1170 cyclically receives the digital signal indicative of the comparison result. In accordance with this digital signal, the SAR logic 1170 cyclically generates control signals for controlling the adjustment voltage in the N-number of second sampling circuits 120-1, . . . , 120-N, and outputs the control signals via the control output terminal. Further, by accumulating the digital signal which was input during the reset phase of the voltage-time converter 1100, the SAR logic 1170 obtains an output digital signal ($ADC_{OUT}$) at the time of the end of the reset phase. The SAR logic 1170 outputs the output digital signal ($ADC_{OUT}$) via the digital output terminal.

<10-3> Advantageous Effects

As has been described above, the voltage-time converter according to the tenth embodiment converts a portion of the input analog signal to the digital signal, and obtains the time signal by voltage-time converting the residual portion of the input analog signal, like the first embodiment. Accordingly, by assembling this voltage-time converter in, for example, the first stage of the pipeline type analog-digital converter, the power consumption can be reduced, and the precision can be enhanced.

Eleventh Embodiment

<11-1> Configuration of Voltage-Time Converter

A voltage-time converter according to an eleventh embodiment converts a portion of an input analog signal to a digital signal. Accordingly, this voltage-time converter can also be called "analog-digital converter". In addition, this voltage-time converter obtains a time signal by voltage-time converting the residual portion of the input analog signal.

FIG. 36 illustrates a concrete example of the voltage-time converter according to the present embodiment. A voltage-time converter 1200 of FIG. 36 includes a first sampling circuit 110, an N-number of second sampling circuits 120-1, . . . , 120-N, a bottom plate sampler 130, a detector 1240, a signal generator 150, and a SAR logic 1170. The first sampling circuit 110, N-number of second sampling circuits 120-1, . . . , 120-N, bottom plate sampler 130, signal generator 150 and SAR logic 1170 may be identical or similar to the first sampling circuit 110, N-number of second sampling circuits 120-1, . . . , 120-N, bottom plate sampler 130, signal generator 150 and SAR logic 1170 of FIG. 33.

The detector 1240 includes an input terminal and an output terminal. The input terminal of the detector 1240 is commonly connected to the second terminal of the first sampling circuit 110, the second terminals of the N-number of second sampling circuits 120-1, . . . , 120-N, and the first terminal of the bottom plate sampler 130. The output terminal of the detector 1240 is connected to the control terminal of the signal generator 150, the input terminal of the SAR logic 1170, and the input terminal of the time-voltage converter 200.

In the convert phase of the voltage-time converter of FIG. 36, the detector 1240 operates like the above-described detector 140. In the reset phase of the voltage-time converter of FIG. 36, the detector 1240 operates like the above-described detector 1160.

In the convert phase, the detector 1240 detects whether the voltage of the input terminal thereof satisfies the first condition. Then, the detector 1240 generates a time signal indicative of the time length of the first period in which the voltage of its input terminal satisfies the first condition.

In the reset phase, the detector 1240 cyclically compares the voltage of the input terminal thereof with a comparative reference voltage. The detector 1240 cyclically outputs a digital signal indicative of the comparison result to the SAR logic 1170. Incidentally, in the sample phase, the detector 1240 stops the operation.

The detector 1240 includes a comparator 1241 and a voltage source 1242.

The comparator 1241 includes a first input terminal, a second input terminal, and an output terminal. The first input terminal of the comparator 1241 is connected to the input terminal of the detector 1240. The second input terminal of the comparator 1241 is connected to the positive terminal of the voltage source 1242. The output terminal of the comparator 1241 is connected to the output terminal of the detector 1240.

In the convert phase, the comparator 1241 compares the voltage of the first input terminal with the voltage of the second input terminal. Specifically, if the voltage of the first input terminal is lower than the voltage of the second input terminal, the comparator 1241 outputs a time signal ($D_{OUT}$) of "H" level (power supply voltage). On the other hand, if the voltage of the first input terminal is equal to or higher than the voltage of the second input terminal, the comparator 1241 outputs a time signal ($D_{OUT}$) of "L" level (ground voltage).

In the reset phase, the comparator 1241 operates in synchronism with a clock signal (CLK). Upon detecting a rising edge (or a falling edge) of the clock signal (CLK), the comparator 1241 compares the voltage of the first input terminal with the voltage of the second input terminal. Specifically, if the voltage of the first input terminal is lower than the voltage of the second input terminal, the comparator 1241 outputs a digital signal of "H" level (power supply voltage). On the other hand, if the voltage of the first input terminal is equal to or higher than the voltage of the second input terminal, the comparator 1241 outputs a digital signal of "L" level (ground voltage). Incidentally, the comparator 1241 stops the operation in the sample phase.

The voltage source 1242 includes a positive terminal and a negative terminal. The positive terminal of the voltage source 1242 is connected to the second input terminal of the comparator 1241. The negative terminal of the voltage source 1242 is grounded. The voltage source 1242 generates a comparative reference voltage ($V_{RC}$).

<11-2> Advantageous Effects

As has been described above, in the voltage-time converter according to the eleventh embodiment, the two detectors included in the voltage-time converter according to the tenth embodiment are integrated. Therefore, according to this voltage-time converter, the circuit area and power consumption can be reduced, compared to the voltage-time converter according to the tenth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifier circuit comprising:
   a first converter generating a time signal by voltage-time converting an input signal;
   a second converter generating an output signal by time-voltage converting the time signal; and
   a correction circuit outputting a control signal by comparing the time signal and a reference signal,
   wherein the first converter generates the time signal, based on the control signal.

2. The amplifier circuit according to claim 1, wherein the correction circuit generates the control signal which, when a first period indicated by the time signal is greater than a second period indicated by the reference signal, decreases the first period.

3. The amplifier circuit according to claim 2, wherein the correction circuit generates the control signal which increases the first period when the first period is less than the second period.

4. The amplifier circuit according to claim 2, wherein the correction circuit generates, if the first period is greater than the second period, the control signal which decreases the first period, and sets a third period during which an operation of generating the control signal which increases the first period is prohibited.

5. The amplifier circuit according to claim 4, wherein, after the third period has passed, the correction circuit generates, if the first period is less than the second period, the control signal which increases the first period, and prohibits, during the third period, the operation of generating the control signal which increases the first period.

6. The amplifier circuit according to claim 1, wherein the second converter generates the output signal, based on the control signal.

7. The amplifier circuit according to claim 1, wherein the correction circuit includes:
   a comparator generating a first signal by comparing the time signal and the reference signal; and
   a counter counting up or counting down the control signal, based on the first signal.

8. The amplifier circuit according to claim 7, wherein the comparator sets, if the time signal is at a first level at a time point when the reference signal has fallen or risen, a potential of the first signal at the first level, the comparator sets, if the time signal is at a second level at a time point when the reference signal has fallen or risen, the potential of the first signal at the second level, the counter counts down the control signal if the potential of the first signal is at the first level, and the counter counts up the control signal if the potential of the first signal is at the second level.

9. The amplifier circuit according to claim 8, wherein the first converter generates the time signal which decreases the first period, if the control signal is counted up, and the first converter generates the time signal which increases the first period, if the control signal is counted down.

10. The amplifier circuit according to claim 8, wherein the control signal is a digital signal.

11. The amplifier circuit according to claim 1, wherein the correction circuit includes:

a comparator generating a first signal by comparing the time signal and the reference signal;

a control circuit generating a second signal, based on the first signal; and a counter counting up the control signal, based on the second signal.

12. The amplifier circuit according to claim 11, wherein the comparator sets, if the time signal is at a first level at a time point when the reference signal has fallen or risen, a potential of the first signal at the first level, the comparator sets, if the time signal is at a second level at a time point when the reference signal has fallen or risen, the potential of the first signal at the second level, the control circuit outputs a third signal and starts a monitoring operation, if the potential of the first signal is at the second level the control circuit starts the monitoring operation, if the control circuit outputs a fourth signal, the control circuit stops, upon starting the monitoring operation, a counting operation of the counter until a monitoring period completes, and monitors an output of the comparator, the control circuit outputs the fourth signal after the monitoring period has passed, if the potential of the first signal does not change to the second level, the counter executes count-up, if the counter receives the third signal, and the counter executes count-down, if the counter receives the fourth signal.

13. The amplifier circuit according to claim 12, wherein the first converter generates the time signal which decreases the first period, if the control signal is counted up, and the first converter generates the time signal which increases the first period, if the control signal is counted down.

14. The amplifier circuit according to claim 11, wherein the control signal is a digital signal.

15. A pipeline type analog-digital converter comprising:
a plurality of pipeline stages; and
a logic circuit generating a second signal, based on a first signal of the plurality of pipeline stages, wherein each of the pipeline stages includes:

a analog-digital converter circuit generating the first signal, based on an input signal; and a first circuit generating a third signal, based on the first signal, subtracting the third signal from the input signal, and amplifying the subtracted signal, the first circuit includes:

a first converter generating a time signal by voltage-time converting the input signal;

a second converter generating an output signal by time-voltage converting the time signal; and a correction circuit outputting a control signal by comparing the time signal and a reference signal, and the first converter generates the time signal, based on the control signal.

16. The pipeline type analog-digital converter according to claim 15, wherein the correction circuit includes:

a comparator generating a first signal by comparing the time signal and the reference signal;

a control circuit generating a second signal, based on the first signal; and a counter counting up the control signal, based on the second signal.

17. The pipeline type analog-digital converter according to claim 16, wherein the comparator sets, if the time signal is at a first level at a time point when the reference signal has fallen or risen, a potential of the first signal at the first level, the comparator sets, if the time signal is at a second level at a time point when the reference signal has fallen or risen, the potential of the first signal at the second level, the control circuit outputs a fourth signal and starts a monitoring operation, if the potential of the first signal is at the second level the control circuit starts the monitoring operation, if the control circuit outputs a fifth signal, the control circuit stops, upon starting the monitoring operation, a counting operation of the counter until a monitoring period completes, and monitors an output of the comparator, the control circuit outputs the fifth signal after the monitoring period has passed, if the potential of the first signal does not change to the second level, the counter executes count-up, if the counter receives the fourth signal, and the counter executes count-down, if the counter receives the fifth signal.

18. The pipeline type analog-digital converter according to claim 17, wherein the first converter generates the time signal which decreases the first period, if the control signal is counted up, and the first converter generates the time signal which increases the first period, if the control signal is counted down.

19. The pipeline type analog-digital converter according to claim 15, wherein the control signal is a digital signal.

* * * * *